US006393334B1

(12) United States Patent
Lewis et al.

(10) Patent No.: US 6,393,334 B1
(45) Date of Patent: May 21, 2002

(54) METHOD AND APPARATUS FOR PROCESSING TOOL INTERFACE IN A MANUFACTURING ENVIRONMENT

(75) Inventors: Paul E. Lewis, San Jose; Adel George Tannous, Santa Clara; Karl A. Davlin, Hayward, all of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/397,996

(22) Filed: Sep. 17, 1999

Related U.S. Application Data

(63) Continuation of application No. 09/249,752, filed on Feb. 12, 1999.

(51) Int. Cl.[7] ............................................... G06F 19/00
(52) U.S. Cl. ...................................... 700/117; 700/121
(58) Field of Search ............................... 700/117, 118, 700/121, 213, 228; 414/217

(56) References Cited

U.S. PATENT DOCUMENTS

| | | | |
|---|---|---|---|
| 4,356,623 A | 11/1982 | Hunter .......................... 29/571 |
| 4,668,484 A | 5/1987 | Elliot ........................... 422/113 |
| 4,674,936 A | 6/1987 | Bonora ......................... 414/217 |
| 4,676,709 A | 6/1987 | Bonora et al. ................. 414/217 |
| 4,705,444 A | 11/1987 | Tullis et al. .................. 414/226 |
| 4,724,874 A | 2/1988 | Parikh et al. .................. 141/98 |
| 4,739,882 A | 4/1988 | Parikh et al. ................. 206/454 |
| 4,746,256 A | 5/1988 | Boyle et al. .................. 414/217 |
| 4,802,809 A | 2/1989 | Bonora et al. ................. 414/217 |
| 4,815,912 A | 3/1989 | Maney et al. ................. 414/217 |
| 4,859,137 A | 8/1989 | Bonora et al. ................. 414/648 |
| 4,974,166 A | 11/1990 | Maney et al. ................. 364/478 |
| 4,995,430 A | 2/1991 | Bonora et al. .................. 141/98 |
| 5,097,421 A | 3/1992 | Maney et al. ................. 364/478 |
| 5,166,884 A | 11/1992 | Maney et al. ................. 364/468 |
| 5,169,272 A | 12/1992 | Bonora et al. ................. 414/217 |
| 5,370,491 A | 12/1994 | Bonora et al. ................. 414/217 |
| 5,469,963 A | 11/1995 | Bonora et al. ................. 206/709 |
| 5,547,328 A | 8/1996 | Bonora et al. ................. 414/217 |
| 5,586,585 A | 12/1996 | Bonora et al. .................. 141/93 |
| 5,601,484 A | 2/1997 | Adler et al. ................... 454/187 |

(List continued on next page.)

FOREIGN PATENT DOCUMENTS

WO  WO 9811598  3/1998

*Primary Examiner*—Paul P. Gordon
(74) *Attorney, Agent, or Firm*—Rutan & Tucker, LLP; Sandra P. Thompson; Robert D. Fish

(57) ABSTRACT

A method and apparatus for automated interfacing with a processing tool in a manufacturing environment having a tilt mechanism and a rotation mechanism. In one embodiment, semiconductor wafers in a cassette are presented to a processing tool by tilting the cassette during movement towards the tool. The tilt mechanism provides a means for seating the wafers in the cassette. The rotation mechanism allows the cassette to be adjusted to meet a robotic arm which extracts wafers from the cassette. Where the cassette is part of a Standard Mechanical InterFace (SMIF) system, the pod is placed onto the interface apparatus, where the pod cover is removed to allow processing of the wafers. A bellows is provided to cover the exposed cassette, thus creating an extended mini-environment including the interface apparatus, tool, and pod cover. In one embodiment, the interface apparatus includes robotic arms and a lift mechanism. Operation of the lift mechanism to open a container effects the positioning of the robotic arms to transfer the container to the tool. In one embodiment, semiconductor wafers in a cassette are ionized as the robotic arms position to grip the cassette. A gripping mechanism is adapted to grip a variety of containers in a variety of positions. A base receiver accepts containers in a first and a second orientation. A main controller provides control to a plurality of motors and functional blocks within the interface apparatus.

94 Claims, 38 Drawing Sheets

U.S. PATENT DOCUMENTS

| | | | |
|---|---|---|---|
| 5,611,452 A | 3/1997 | Bonora et al. | 220/378 |
| 5,642,978 A | 7/1997 | Lahne et al. | 414/331 |
| 5,653,565 A | 8/1997 | Bonora et al. | 414/411 |
| 5,655,869 A | 8/1997 | Scheler et al. | 414/222 |
| 5,674,039 A | 10/1997 | Walker et al. | 414/222 |
| 5,788,458 A | 8/1998 | Bonora et al. | 414/786 |
| 5,807,062 A | 9/1998 | Schultz et al. | 414/744.2 |
| 5,810,062 A | 9/1998 | Bonora et al. | 141/351 |
| 6,079,927 A * | 6/2000 | Muka | 414/217 |
| 6,143,126 A * | 11/2000 | Stevens | 156/345 |
| 6,235,656 B1 * | 5/2001 | Clarke | 438/800 |
| 6,267,123 B1 * | 7/2001 | Yoshikawa et al. | 134/62 |

* cited by examiner

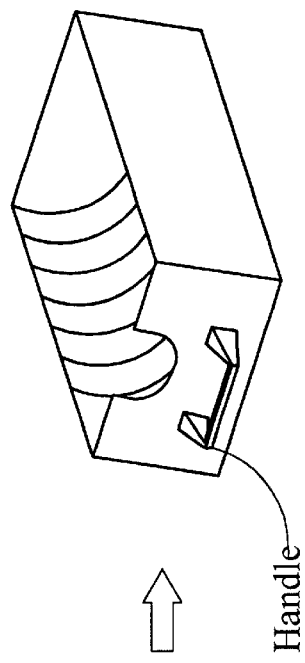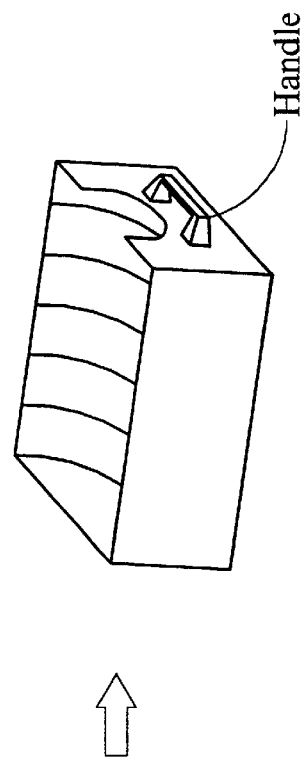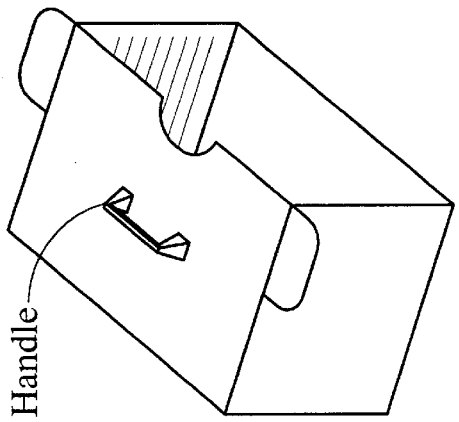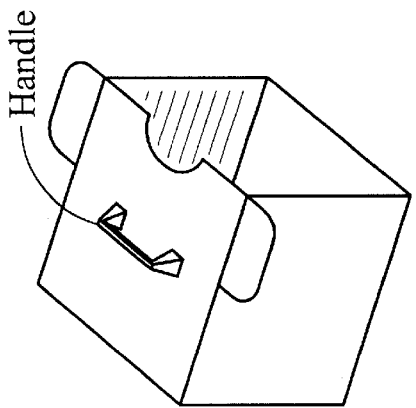
FIG. 26A
FIG. 26B

METHOD AND APPARATUS FOR PROCESSING TOOL INTERFACE IN A MANUFACTURING ENVIRONMENT

This application is a continuation of U.S. patent application Ser. No. 09/249,752 filed on Feb. 12, 1999 pending.

FIELD OF THE IN INVENTION

The present invention relates to systems for transferring articles in a manufacturing environment, and specifically to transferring semiconductor wafers, liquid crystal or flat panel displays and similar articles in a mini-environment.

BACKGROUND OF THE INVENTION

Typical manufacturing environments include a variety of processing tools for each of the various stages of manufacture. Often a variety of products are produced in one manufacturing environment, where each product is manufactured according to a specific recipe. Where products are transported throughout the manufacturing environment in containers, it is ideal that such containers have a common interface with each of the processing tools. As manufacturing environments automate, it is desirable to coordinate each of the processing tools for efficient production. Typically, products are moved from one tool to the next by a human attendant or by a robot, according to a central plan. In some automated environments, a central controller is used to coordinate production. In each of these systems it is desirable to have a common interface and an effective means of communication within the manufacturing environment.

Particular type products often introduce specific requirements into the process. For example, integrated circuits, liquid crystal displays (LCDs) and other such articles require an extremely clean environment to prevent contaminants from rendering the articles unusable or unreliable. Integrated circuits specifically include miniature size features, where even a microscopic particle or contaminant can interfere with the proper operation of the integrated circuit and thereby directly impact the cost and yield of the integrated circuits. In such a manufacturing environment, cleanliness of the manufacturing environment is a key concern in fabricating integrated circuits.

Some of the specific production requirements of integrated circuit fabrication are addressed by the creation of a clean room to house the manufacturing environment. A traditional semiconductor clean room is created by enclosing processing tools in a controlled environment or enclosure. Prior to entry, personnel don special clothing to reduce the chance of contaminating the wafers. While clean rooms provide a clean manufacturing environment, they are expensive to construct, difficult to maintain, and inconvenient to operate. Additionally, as feature sizes reduce below one micron, clean rooms are no longer effective at preventing contamination.

As a step beyond the traditional clean room, the Standard Mechanical Interface (SMIF) systems enclose the processing tool in a controlled "mini-environment." The mini-environment is to provide a particulate-free air space around the tool. A second controlled mini-environment is created within a wafer carrier, called a pod. The pod is a type of container used for transporting wafers from one processing tool to the next. In effect, a discontinuous clean room is created by the combination of tool mini-environments and the pod mini-environment. During processing, the pod is coupled to the tool mini-environment so as to prevent the introduction of contaminants to the wafers.

While SMIF type systems offer advantages over the conventional clean room, there is a further need to automate the manufacturing process and increase the flexibility of the interface between containers and processing tools. Additionally, there exists a general need for an automated transfer mechanism within a manufacturing environment, which provides a smooth method of interfacing the product containers with the processing tool, and which allows for improved communication between the transfer mechanism, the tool, the container and a main controller.

For interface with a variety of tools, it is often desirable that the container be presented in a variety of orientations, specific to the tool and container requirements. An apparatus and method are needed for smooth and efficient interface with processing tools in a manufacturing environment, having automated control and adaptation.

BRIEF DESCRIPTION OF THE DRAWING

The present invention may be more fully understood by a description of certain preferred embodiments in conjunction with the attached drawings in which:

FIG. 26 illustrates the movement of a wafer cassette for various processing tool configurations according to one embodiment of the present invention;

DETAILED DESCRIPTION OF THE PREFERRED EMBODIMENTS

Figure 1A:
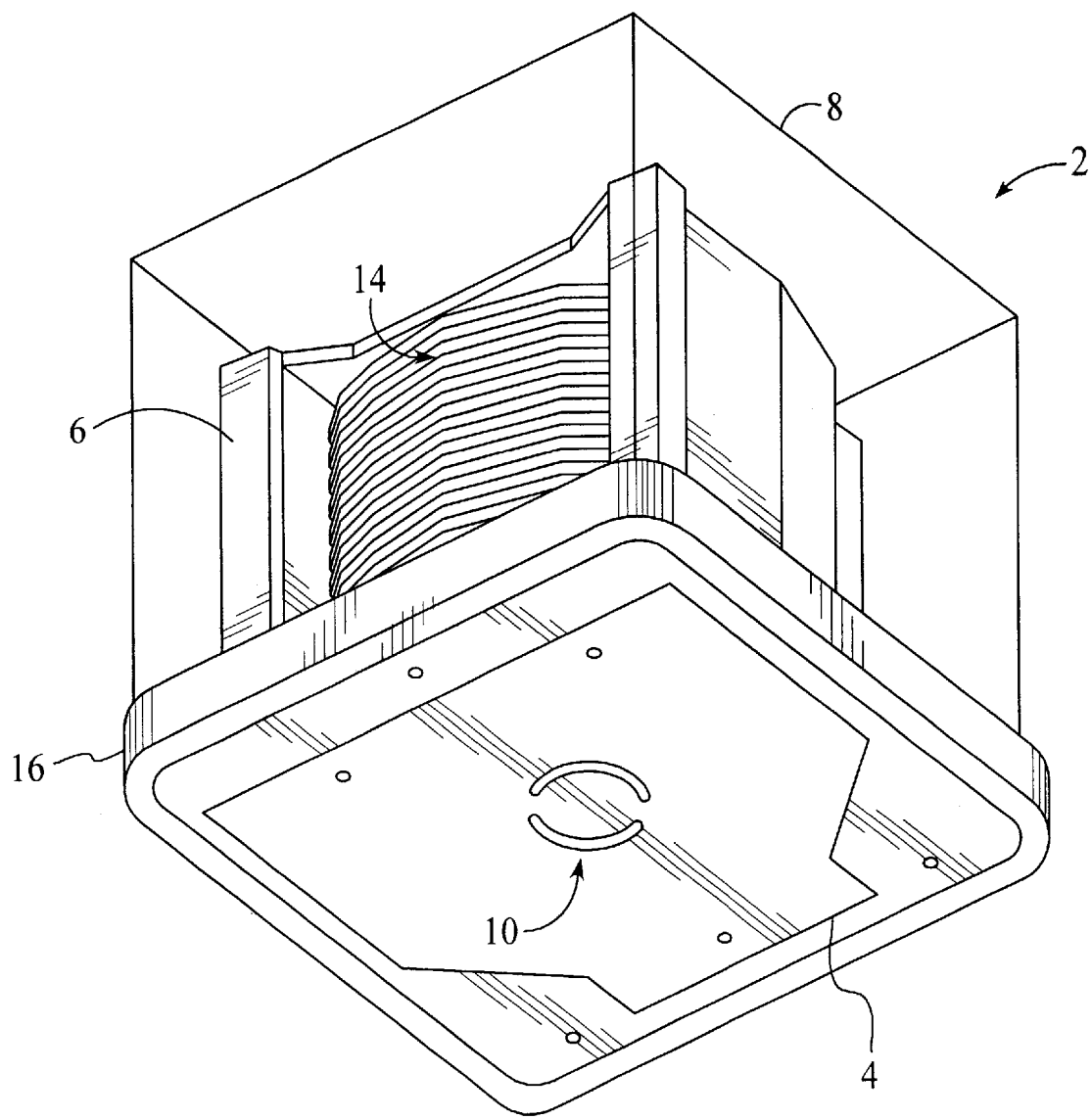
FIG. 1A illustrates a three-dimensional view of a conventional pod in accordance with the present invention, with the pod base illustrated in a closed position.

The present invention provides an automated transfer mechanism for use in a manufacturing environment, wherein the automated transfer mechanism provides a smooth method of interfacing product containers with processing tools, and which allows for improved communication between the transfer mechanism, the tool, the container and a main controller. In one embodiment, the present invention provides a method of automating the fabrication of semiconductor wafers, liquid crystal or flat panel displays and similar articles and increasing the flexibility of the interface between SMIF pods and processing tools.

According to one aspect of the present invention, an interface apparatus includes a platform and a tilt mechanism. The platform includes an engagement piece adapted to secure a container, where the container is for transporting a plurality of articles, and a plate supporting the engagement piece, where the plate has a centerline pivot point. The tilt mechanism is coupled to the platform and is adapted to tilt the plate from a first to a second position, wherein the tilt movement is offset from the centerline pivot point.

According to one aspect of the present invention, a method for processing wafers in a semiconductor fabrication environment, includes the steps of placing a container into an interface apparatus coupled to a processing tool, the container supporting at least one wafer, receiving a signal from the processing tool; in response to receiving the signal, tilting the container to a first angular position via a tilting mechanism, the tilting mechanism coupled to the interface apparatus, moving the container towards the processing tool, tilting the container to a second angular position for processing via the tilting mechanism; and processing the at least one wafer.

According to one aspect of the present invention, a method for manufacturing integrated circuits, includes the steps of providing an interface apparatus coupled to a processing tool, the interface apparatus having a robotic arm and a lifting mechanism, placing a container onto the interface apparatus, the container having a cover and containing a cassette having at least one semiconductor substrate therein, removing the cover from the container using the lift mechanism, positioning the robotic arm proximate to the cassette, wherein movement of the lift mechanism is used to position the robotic arm proximate to the cassette, gripping the cassette with the robotic arm, removing the cassette from the container with the robotic arm; wherein movement of the lift mechanism is used to remove the cassette from the container, placing the cassette within the processing tool and processing the at least one semiconductor substrate.

In one embodiment of the present invention, a method for seating wafers in a container, comprising the steps of placing the container on a plate, the plate having a tilt controller, the tilt controller controlling the tilt of the plate from a first to a second position, wherein tilt movement is offset from a centerline pivot point of the plate and the tilt controller returning the plate to the first position.

According to another embodiment of the present invention, an interface apparatus for use with a processing tool includes a platform adapted to receive a container placed thereon, a lift mechanism adapted to remove a cover from the container; and a robotic arm adapted to remove a cassette that contains a semiconductor substrate from the container, wherein the robotic arm is coupled to the lift mechanism such that movement of the lift mechanism is used to position the robotic arm proximate to the cassette so that the cassette can be removed from the container and placed within the processing tool.

According to one aspect of the present invention, a robotic arm includes a gripping mechanism, an ionization means coupled to the gripping mechanism and a first elongated member having a first end and a second end, wherein the first end of the first elongated member is pivotally attached to one end of the gripping mechanism.

While the present invention is applicable to a variety of manufacturing environments, one embodiment applicable to a SMIF system used for processing semiconductor wafers is provided as an exemplar. The present invention is applicable to manufacture of articles requiring a controlled manufacturing environment, in particular those requiring a clean environment, such as production of integrated circuits, computer hard disks, liquid crystal display (LCD), flat panel displays, imaging devices (e.g. charge coupled devices (CCD), thermal imaging devices), infra red sensors or other types of sensors, aerospace components, subassemblies, and systems, optical implements and devices (e.g. defraction gratings, lenses), and other photolithography-produced articles. As described elsewhere herein, various refinements and substitutions of the various embodiments are possible based on the principles and teachings herein.

SMIF Pod

Figure 1B:
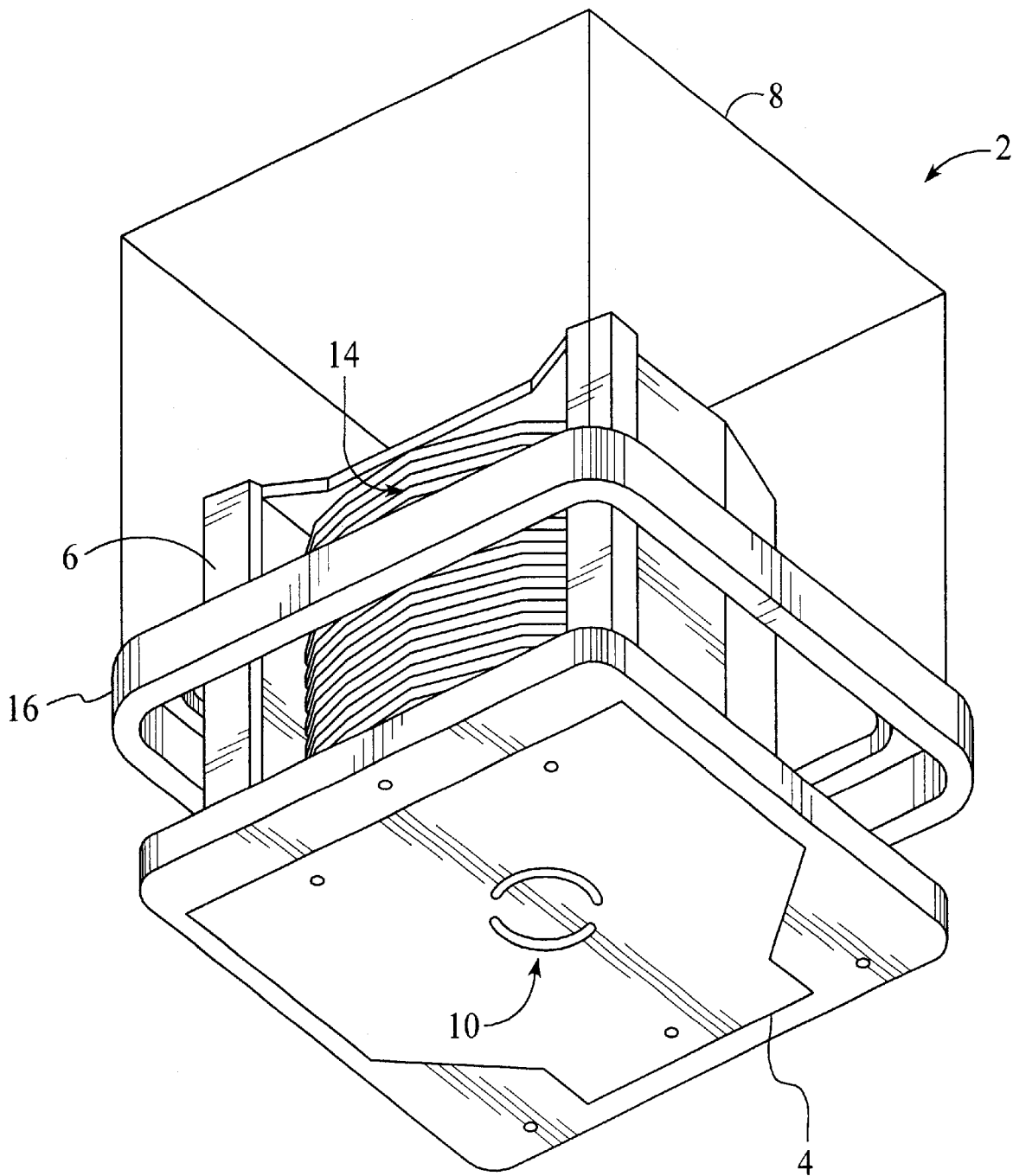
FIG. 1B illustrates a three-dimensional view of a conventional pod in accordance with the present invention, with the pod base illustrated in an open position.

As discussed briefly herein above, one manufacturing system for fabricating semiconductor wafers is a Standard Mechanical InterFace (SMIF) system. A conventional SMIF pod 2 is illustrated in FIGS. 1A and 1B consisting generally of pod base 4, cassette 6, and pod cover 8. In this configuration, pod base 4 is located on the bottom of pod 2 to allow the pod cover 8 to be raised exposing the wafers. One feature of this configuration is to use the pod cover 8 to continue to protect the wafers after they are lowered and separated from the pod cover 8.

The pod base 4 is illustrated in the closed position in FIG. 1A and in the open position in FIG. 1B. It should be noted that although FIGS. 1A and 1B illustrate a typical SMIF pod, other designs and configurations of a container may be utilized in accordance with the present invention and that the present invention is not limited to the design of SMIF pod 2 of FIGS. 1A and 1B.

As illustrated in FIGS. 1A and 1B, the pod base 4 includes at least two latching slots 10, which are actuated by a SEMI-standard mechanism to latch and unlatch pod base 4 to pod cover 8, where pod base 4 rests on a base or platform for further interface with the processing tool. The placement in the base, as well as the base itself will be discussed in further detail hereinbelow. Cassette 6 is adapted for holding semiconductor wafers and sits on the pod base 4. Pod base 4 includes alignment pins for accepting cassette 6. The alignment pin placement and dimensions are specified by SEMI. Pod cover 8 may be made of a transparent material, such as polycarbonate, to allow sensing of wafers within cassette 6. Conversely, pod cover 8 may be made of an opaque material to prevent light from entering the pod 2.

As shown in FIG. 1A, pod cover 8 further includes bottom edge 16, which contacts with pod base 4 when the pod cover 8 is closed, providing an air tight fit. When the pod cover 8 is open, as illustrated in FIG. 1B, the pod base 4 is separated from the pod cover 8 to allow access to the wafers 14. The use of a SMIF pod places restrictions on the pod-tool interface design, as the SEMI standard includes specifications relating to structural dimensions, coupling configuration and latching mechanism, as well as the placement of the pod for interface with the tool. The interface apparatus 20, illustrated in FIG. 3, and the interface apparatus 210, illustrated in FIG. 19, may be implemented to satisfy the specifics of the SEMI standard.

Figure 2A:
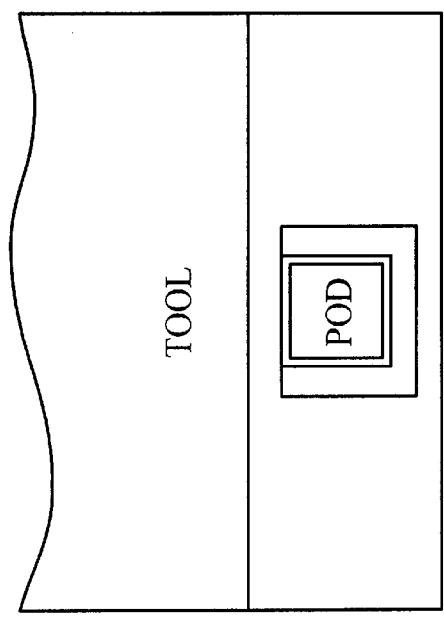
FIGS. 2A, 2B, and 2C illustrate an article interface apparatus positioned for use with a processing tool according to one embodiment of the present invention.
Figure 2B:
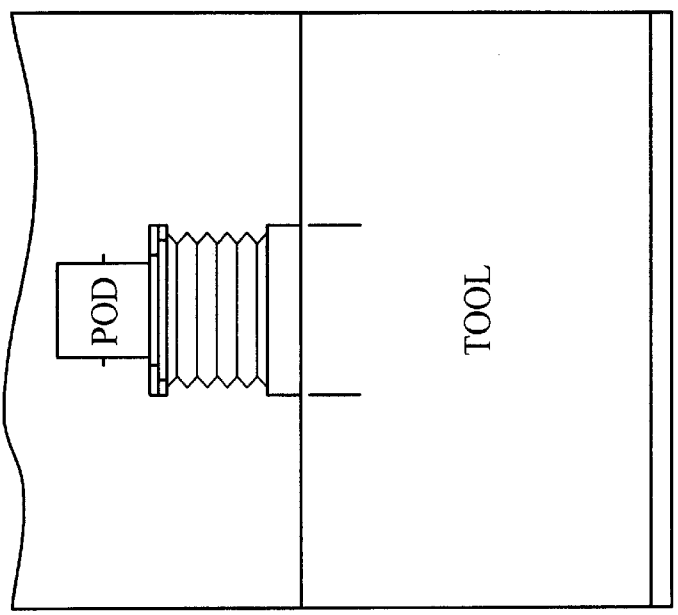
Figure 2C:
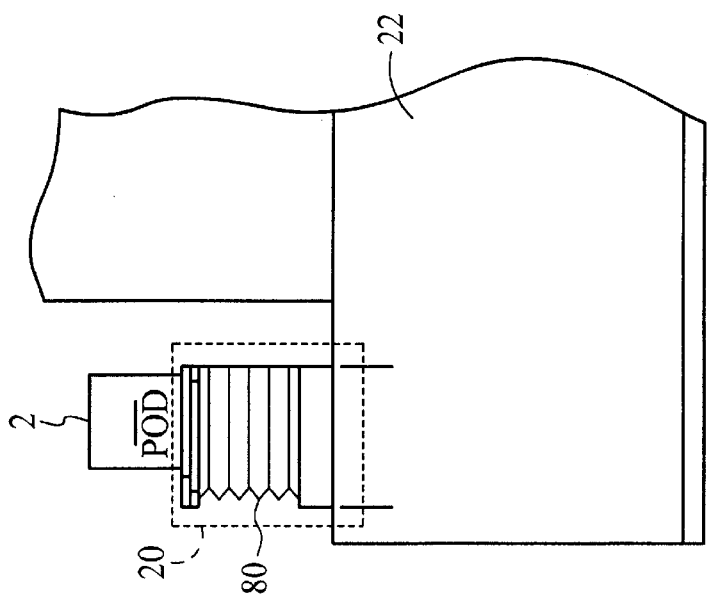

FIG. 2A illustrates an interface apparatus 20 positioned with processing tool 2 for interface with tool 22. Interface apparatus 20 is adapted for handling SMIF pods, such as pod 2 of FIGS. 1A and 1B, in a semiconductor manufacturing environment. Tool 22 generally consists of a wafer handling arm, such as a robotic device, (not shown) for transferring wafers from a SMIF pod via interface apparatus 20 to a processing device (not shown) within tool 22. Note that according to this embodiment, interface apparatus 20 in FIG. 2A is placed outside the enclosure or canopy enclosing tool 22, and the SMIF pod is placed onto the interface apparatus 20. In a top view, FIG. 2B illustrates the placement of the interface apparatus 20 with respect to the processing tool 22. A second view of FIG. 2C illustrates the vertical position of the interface apparatus 20 with respect to the tool 22. As illustrated in FIGS. 2A and 2B, when the pod 2 is open, a bellows 80 preferably covers the open cassette of wafers. Alternate embodiments involving different type manufacturing systems, containers, and tools, may require alternate configurations. As an additional refinement within the scope of the present invention, bellows (such as those described in connection with FIG. 2, above) desirably may be constructed (in whole or part) of a material that is known as PTFE (polytetrafluoroethylene), which desirably may be used to construct a bellows that is flexible, non-shedding, porous, etc. (other suitable materials that are flexible, non-shedding and porous also may be utilized in alternative embodiments in the construction of such a bellows).

Interface Apparatus

As illustrated in FIG. 2A, an interface apparatus 20 is used to interface between the SMIF pod 2 and the processing tool 22. In a manufacturing environment incorporating mini-environments and SMIF pods, the interface apparatus must be operative with respect to the SMIF pod and the processing tool, without violating a clean mini-environment for processing the wafers. Typically, processing tool 22 will be one of multiple tools used in the manufacture of articles, such as semiconductor wafers.

Figure 3:
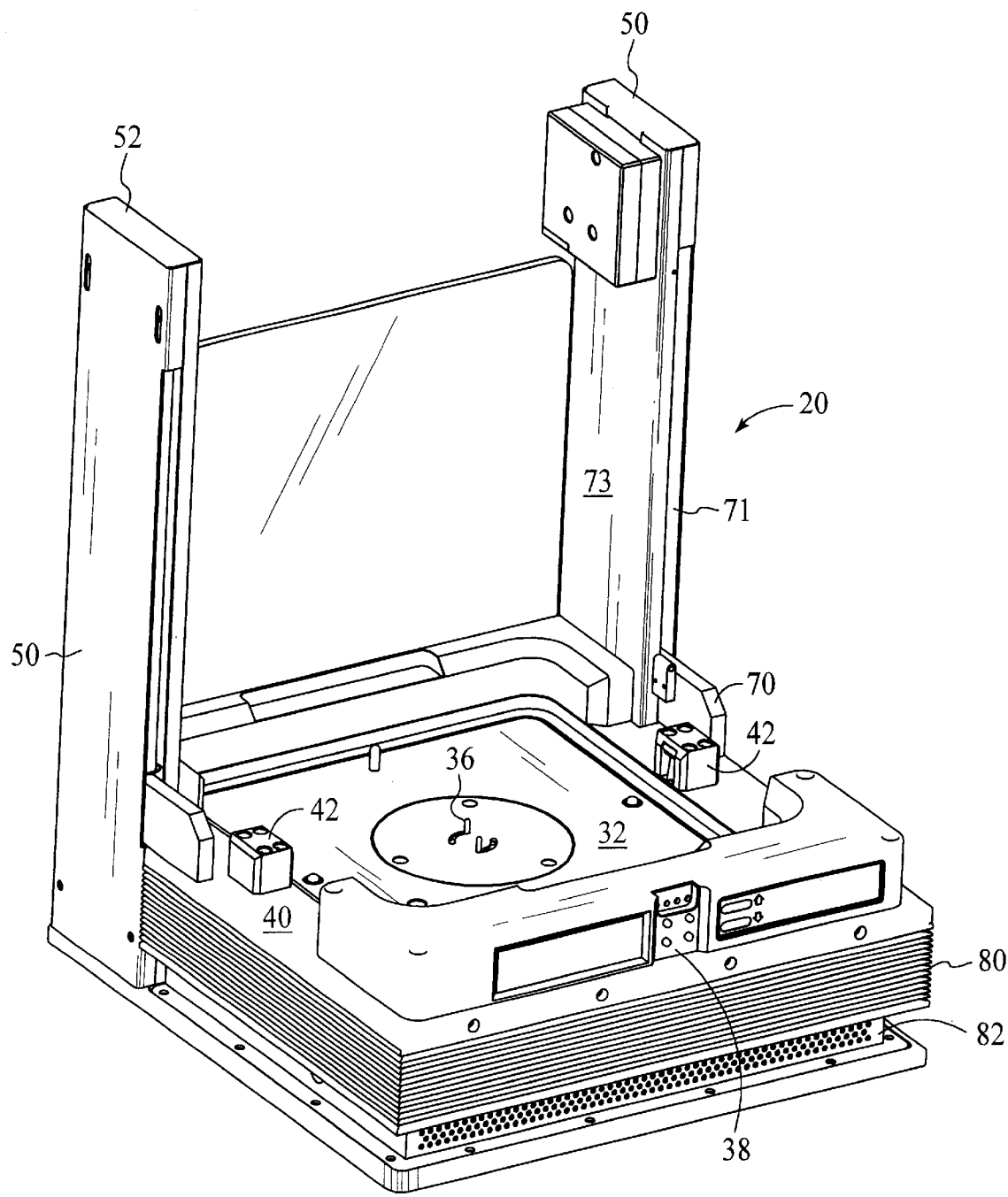
FIG. 3 illustrates a three-dimensional view of a SMIF pod handling system in accordance with one embodiment of the present invention.

FIG. 3 illustrates interface apparatus 20 for interfacing a SMIF pod 2 with a processing tool 22 according to one embodiment of the present invention. Interface apparatus 20 includes two support towers 50, securely coupled to a support base 82. A moveable plate 40 is coupled to the support towers 50, wherein the moveable plate 40 travels within the support towers 50, and is used to open and close the pod 2. A pod base receiver 34 is coupled to the support base 82, and is used to present the cassette 6 to the processing tool 22, where the pod base receiver 34 secures the pod base 4 during interface with the processing tool 22.

According to this embodiment, the interface apparatus 20 receives the pod 2, positions the pod base 4 on pod base receiver 34, unlatches the pod base 4 from the pod cover 8 via the pod base receiver 34, opens the pod 2 by raising the pod cover 8, and performs automated adjustment of the pod base receiver 34 to present in a desired and more efficiently variable manner the cassette 6 to the tool 22 for processing of wafers 14. After processing, the interface apparatus 20 returns the pod base receiver 34 to a predetermined position for closing the pod 2. The interface apparatus 20 then lowers the pod cover 8 and latches the pod base 4 to the cover via the pod base receiver 34. The pod is open when the pod base 4 is unlatched from the pod cover 8. Conversely, the pod is closed when the pod base 4 is latched to the pod cover 8. The latching mechanism couples and uncouples the pod cover 8 with the pod base 4.

During interfacing with tool 22, interface apparatus 20 prevents contamination of the wafers 14 by maintaining a consistent mini-environment for processing. The use of a bellows 80 acts to extend the mini-environment of the tool 22 to the mini-environment of the pod 2. The bellows are extended over the cassette, as the movable plate 40 raises the pod cover 8. The movable plate 40 is directed along the two support towers 50. The two support towers 50 and a support base 82, effectively define the size of the interface apparatus 20. According to one embodiment of the present invention, the dimensions of the support towers 50 and the support base 82 are determined by the dimensions of tool 22, as well as the range of motion of the robotic arm used to extract wafers from a cassette. In general, the SMIF type systems are designed to optimize the ergonomic use of the manufacturing environment. This is a particular consideration where a human attendant is placing the pods into the interface apparatus 20. The interface apparatus 20 accepts the closed pod 2 at a predetermined height and the cover 8 is raised above that height. In this way, the human attendant may place the pod 2 at a comfortable position. As the manufacturing environment continues to automate, these considerations will be replaced with integration considerations, such as the mobility of the robotics, the configuration of ceiling automation tracks, and/or the weight of the containers or pods.

As the interface apparatus 20 includes many mechanisms for automated interface with the tool 22, the individual parts of the interface apparatus will be specifically discussed with reference to the figures.

Movable Plate

Figure 5A:
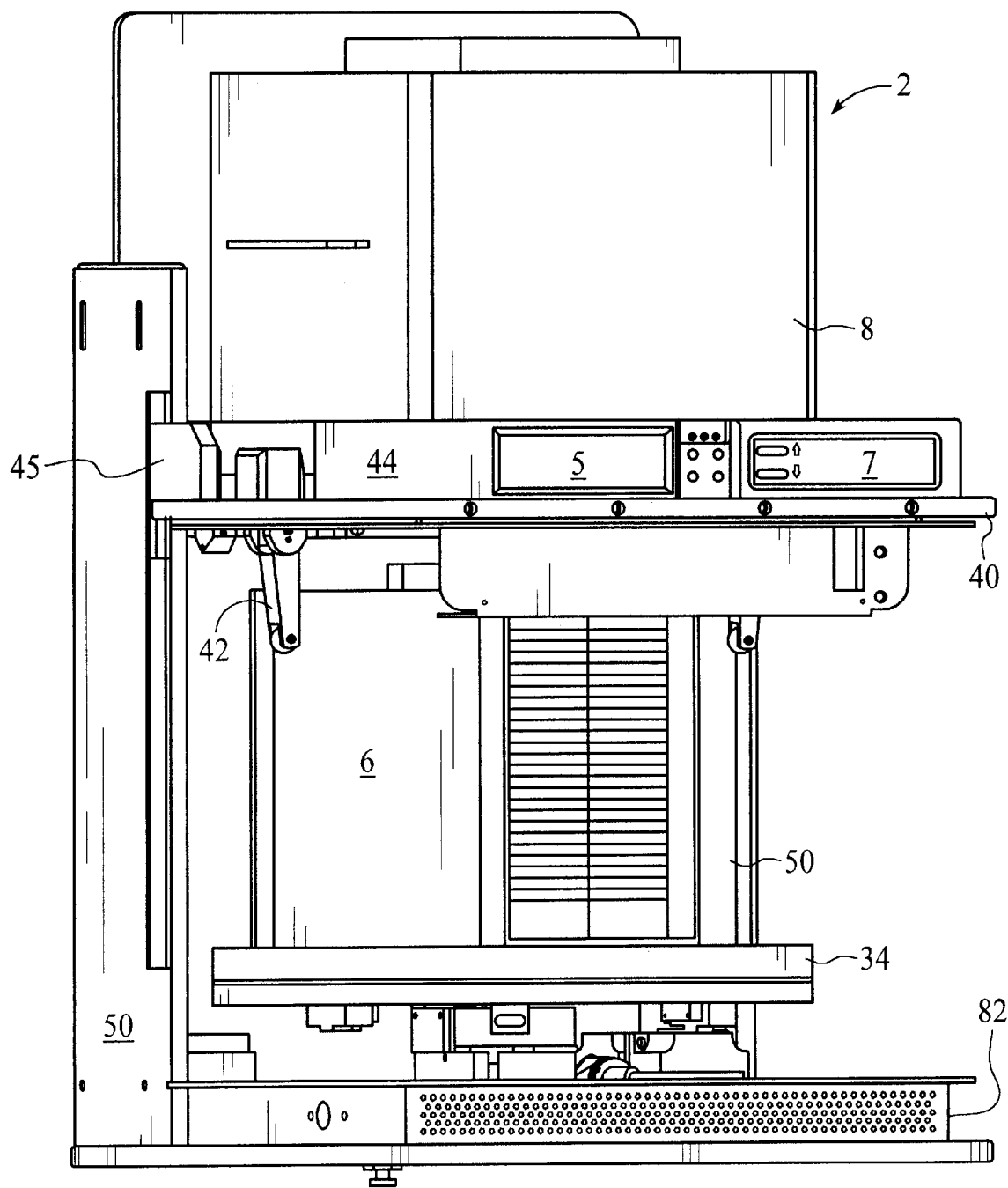
FIG. 5A illustrates a corner view of a SMIF pod handling system in accordance with one embodiment of the present invention.

In operation, the interface apparatus 20 accepts the pod 2 with the movable plate 40 in a first position. This initial position is illustrated in FIG. 3, where the bellows 80 are not extended. For processing, the movable plate 40 is moved to a second position to expose the cassette 6, as illustrated in FIG. 5A where bellows 80 (not shown) are extended from support base 82 to base plate 40. According to one embodiment of the present invention, the pod base 4 is located on the bottom of pod 2 and the movable plate 40 moves in a vertical direction raising the pod cover 8 away from the pod base 4. Alternate embodiments and systems may incorporate angular or horizontal movement as well consistent with the present invention. Similarly, alternate embodiments may move the pod base 4 away from the pod cover 8, or may include a combined motion of both pieces to open the pod 2.

Figure 6:
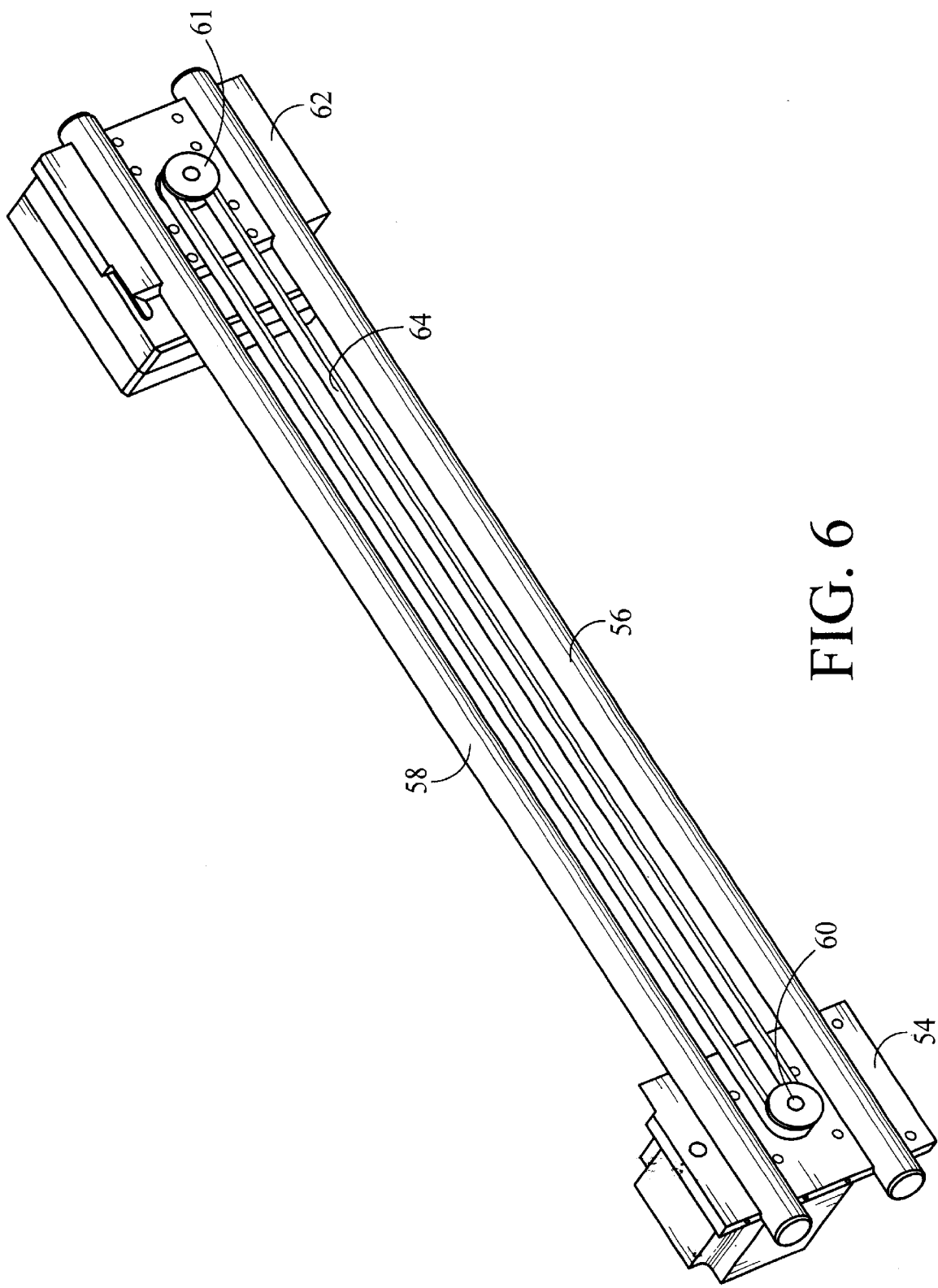
FIGS. 6–7 illustrate perspective views of a support tower in accordance with one embodiment of the present invention.

Continuing with FIG. 3, the support towers 50 are part of the mechanism for opening and closing pod 2, i.e. separating pod cover 8 from the pod base 4. The movable plate 40 is coupled to the tower supports 50 on each side by two shafts 56, 58, which are as illustrated in FIG. 6. The shafts 56, 58 support the movable plate 40 and guide its movement. The movable plate is further detailed in FIG. 4, where a portion of the shafts 56, 58 are shown to indicate position.

To open pod 2, the movable plate 40 is moved in a first direction along the length of the support towers 50. The pod cover 8 is separated from the pod base 4, the moveable plate is separated from the support base 82 as the movable plate 40 moves in this direction and the bellows 80 extend to cover the cassette 6. The movable plate 40 is moved in the opposite direction along the length of support towers 50 to close the pod 2, which reunites the pod cover 8 to the pod base 4.

Further, as illustrated in FIG. 3, the bellows 80 is coupled to the movable plate 40 and to the support base 82. The bellows 80 and its connection to the movable plate 40 and the pod base receiver 34 will be discussed hereinbelow.

Figure 4:
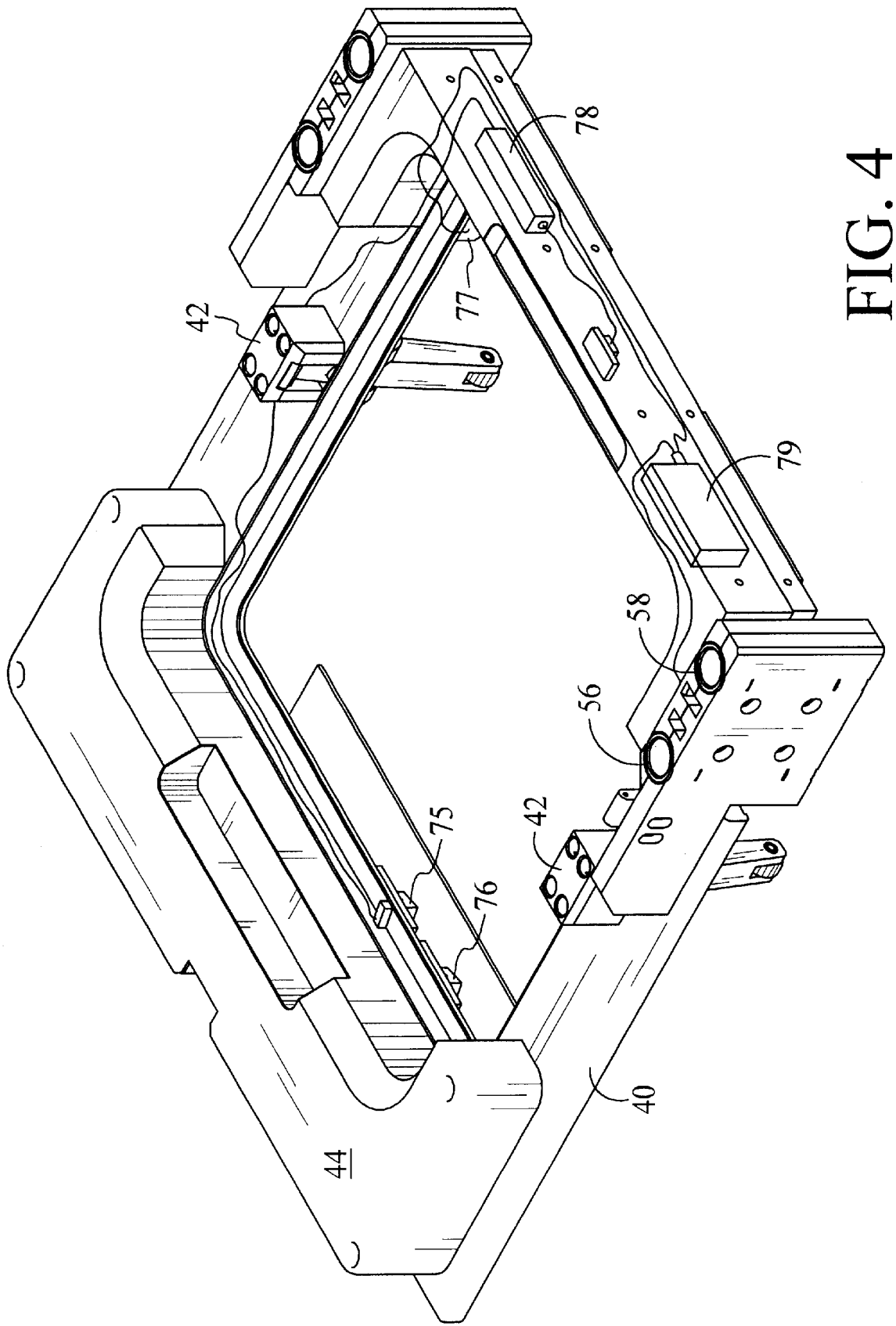
FIG. 4 illustrates a three-dimensional view of a movable plate for opening and closing a SMIF pod cover in accordance with one embodiment of the present invention.

As illustrated in FIG. 4, the movable plate 40 has a rectangular shape with rounded corners and a hollowed center. The shape of the plate 40 is adapted to the pod cover 8, where bottom edge 16 sits on top of plate 40. The opening in the center of plate 40 allows the pod base 4 to meet the pod base receiver 34. The pod base 4 is secured onto the pod base receiver 34, allowing the upward movement of the plate 40 to raise the pod cover 8 away from the pod base 4. The cassette 6 remains on the pod base 4, allowing access to the wafers 14. The plate 40 includes a front guide 44 and a back guide 45. The front guide 44 and the back guide 45 are shaped having beveled edges to facilitate smooth receipt of the pod 2. When a pod 2 is placed into interface apparatus 20, the guides 44, 45 of plate 40 meet the bottom edge 16 of the pod 2 and allow separation of the pod cover 8 from the pod base 4 to open the pod 2.

The movable plate 40 may include a gasket for receiving the pod cover 8. A gasket ensures an air tight seal to protect the extended mini-environment while the pod 2 is open. As illustrated in FIG. 4, a gasket will follow the squared shape of the moveable plate 40. Also, within moveable plate 40, various sensors are positioned for purposes such as wafer mapping, and wafer orientation. The location of each sensor is determined by a variety of factors. For example, some sensors are used to determine the position of wafers within a cassette. The sensors may need to avoid the cassette for proper operation. Similarly, as many sensors are combined within the limited area of the moveable plate 40, the placement and operation of one sensor avoids interfering with the operation of other sensors. One sensor may receive a variety of information, where the position of the one sensor is determined by the combinational nature of the sense operation. Further, by placing the sensors and receivers within the moveable plate, they are protected from accidental displacement. According to one embodiment of the present invention, sensors are placed to perform multiple operations, and the user may select the operation desired, wherein the selected operation is enabled by software control within interface apparatus 20.

The sensors illustrated in FIG. 4 are discussed hereinbelow, including source 77, receivers 75 and 76, and amplifiers 78 and 79. The source provides the light beam or other signal to be received by the receivers. The amplifiers then amplify the sensed result for further processing. Further illustrated in FIG. 4 are connectors 42 for securing the pod cover 8 to moveable plate 40, and front guide 44.

FIG. 5A offers an angled front view of the interface apparatus 20 with the movable plate 40 positioned with the pod cover 8 removed from the pod base 4. The cassette 6 rests on the pod base receiver 34 in preparation to be placed for processing. The front guide 44 is shown having a liquid crystal display (LCD) screen 5. The display 5 is contained within the front guide 44 and provides a convenient interface between the human attendant and the equipment. The display provides status information during operation of the interface apparatus 20. According to one embodiment, the display provides processing status information. The front guide 44 also includes a control panel 7, where instructions may be displayed and the human attendant may input control information by way of push pads. The software and controls are detailed hereinbelow.

Figure 7:
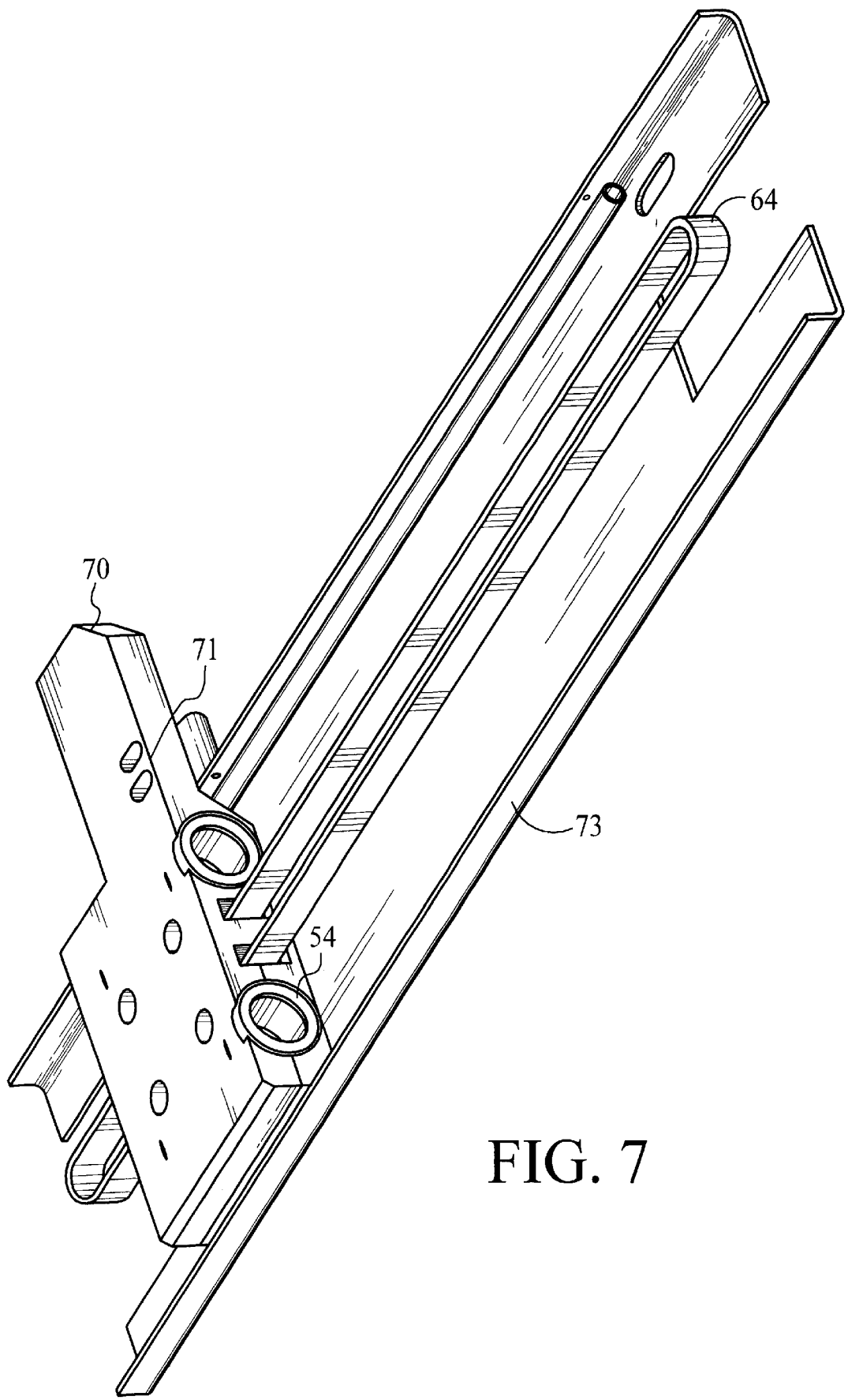
Figure 8:
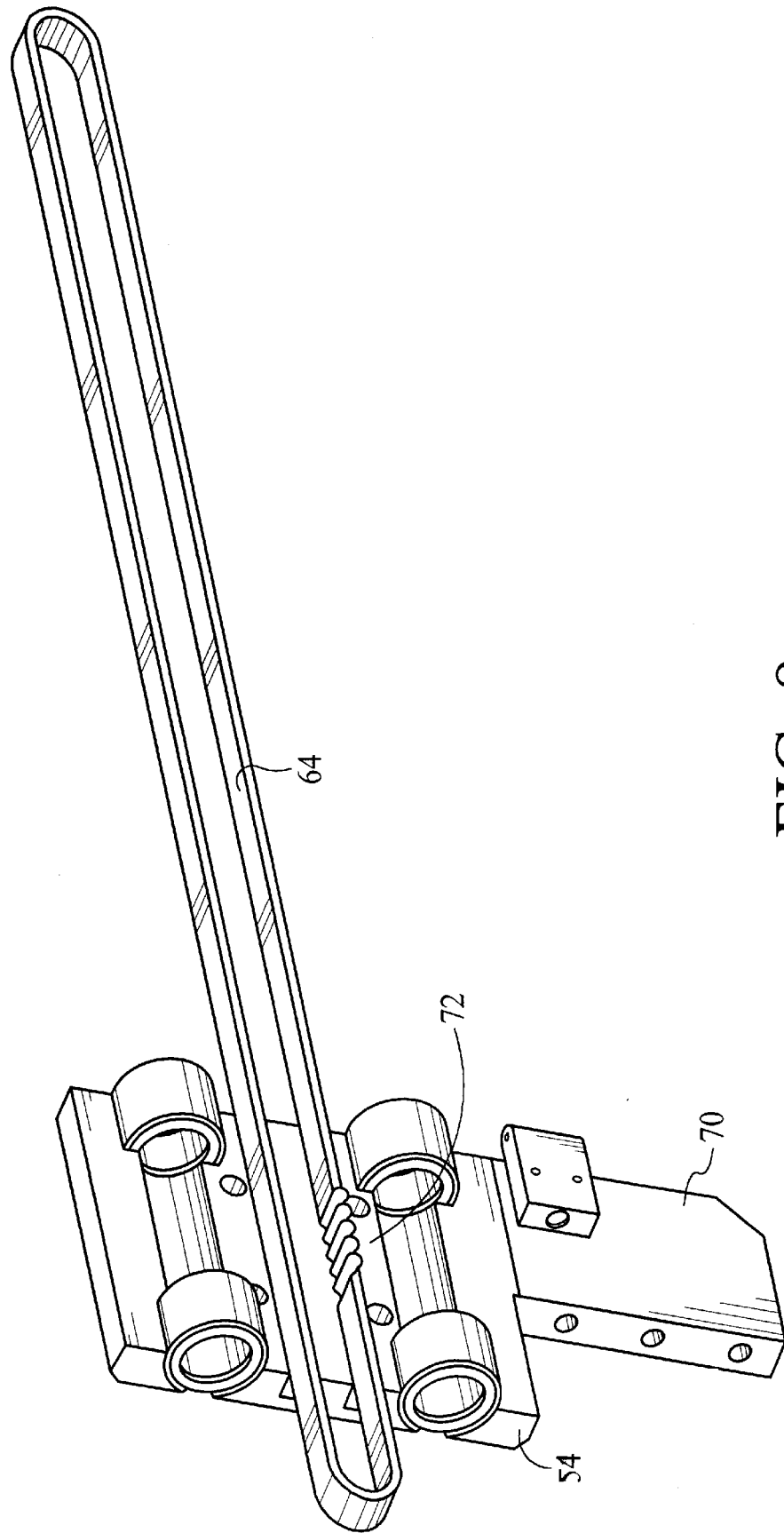
FIG. 8 illustrates an enlarged view of a mechanism containing pins for engaging the teeth of a timing belt in accordance with one embodiment of the present invention.

FIGS. 6, 7, and 8 provide a detailed view of the support towers 50. Within each support tower is a pair of shafts 56, 58 for guiding movement of the movable plate 40. Clamshell pulleys 54 and 62 are located at opposite ends of each support tower. A timing belt 64 is coupled to clamshell pulleys 54 and 62 and is located between shafts 56 and 58. Note that the timing belt 64 is lined with small teeth (not illustrated) for engaging a carriage 70, illustrated in FIG. 8. Each clamshell pulley 62 is located at an upper end of the support towers 50, and is stationary with respect to the movement of the plate 40. The clamshell pulley 54 is located at the lower end of the support towers 50, and is coupled to a carriage piece for carrying the plate 40. Referring to FIG. 8, the carriage 70 includes dowel pins 72. The teeth on the timing belt 64 engage with dowel pins 72 and thereby move carriage 70 up and down the support towers 50. In turn, the carriage 70 carries the plate 40 with this movement.

While the support towers 50 are described in FIG. 6 as including clamshell pulleys 54 and 62, note that FIG. 6 shows only half of clamshell pulleys 54 and 62. A complementary half (not illustrated) forms a clamshell housing over shafts 56 and 58 and over timing belt 64. The clamshell feature allows for easy adjustment to accommodate alternate size timing belts. Adjustment screws on the clamshell pulleys 54 and 62 provide an easy, efficient means of adjusting the pulleys to accommodate the belt size. By loosening the adjustment screws on the clamshell pulleys 54 and 62, it is possible to position each one with respect to shafts 56 and 58.

Bottom clamshell pulley 54 is coupled to movable plate 40 during operation of the interface apparatus 20. As illustrated in FIG. 6, clamshell pulley 54 secures two vertical guide shafts 56 and 58 in each of tower. Clamshell pulley 54 covers the timing belt drive pulley 60 and supports the drive motor on each tower. As illustrated in FIG. 6, on top of the clamshell pulley 62, a timing belt idler pulley 61 grips the top ends of the vertical shafts 56, 58. This type of configuration allows the user to adjust the tension of the timing belt 64 and also allows the user to use a timing belt 64 of different lengths and strengths.

The clamshell pulley 62 covers a pulley attached to the brake shaft, serving as a mount for the brake assembly, and clamps the shafts 56, 58 at the top of the tower. This housing also serves as a timing belt tensioner accommodating a variety of different length timing belts to be used. The timing belts 64 include an internal core of a material, such as nylon, kevlar, stainless steel braid, etc, that will resist stretching.

One embodiment of the present invention includes a mechanism for slowing the downward motion of movable plate 40 during idle and power failure. This mechanism protects the wafers from breakage and damage due to sudden spurious movement of the interface apparatus 20. In one embodiment, the protection mechanism includes a ratchet and pawl assembly. The pawl is engaged on power failure. The mechanism is disengaged by a solenoid attached to the pawl. A ratchet assembly attached to a brake shaft is coupled to a pulley in the support towers 50. The ratchet assembly slows the movable plate, stopping further movement. A two piece housing contains the ratchet and pawl mechanism and mounts to the support towers 50. A small cover allows access to the solenoid body.

As illustrated in FIGS. 7 and 8, clamshell pulley 54 is shaped to accept shafts 56 and 58. Clamshell pulley 62 has a similar shape. Each of support towers 50 includes one movable carriage 70, mounted on each of shafts 56 and 58 between the clamshell pulley 62 and the clamshell pulley 54. Movable carriage 70 can be designed to allow timing belt 64 to travel through movable carriage 70. Covers 71 and 73 enclose each tower with an opening allowing the movable carriage 70 to protrude through to engage the movable plate 40, as illustrated in FIG. 8. Covers 71 and 73 may be made of metallic material such as stainless steel or the like.

Figure 5B:
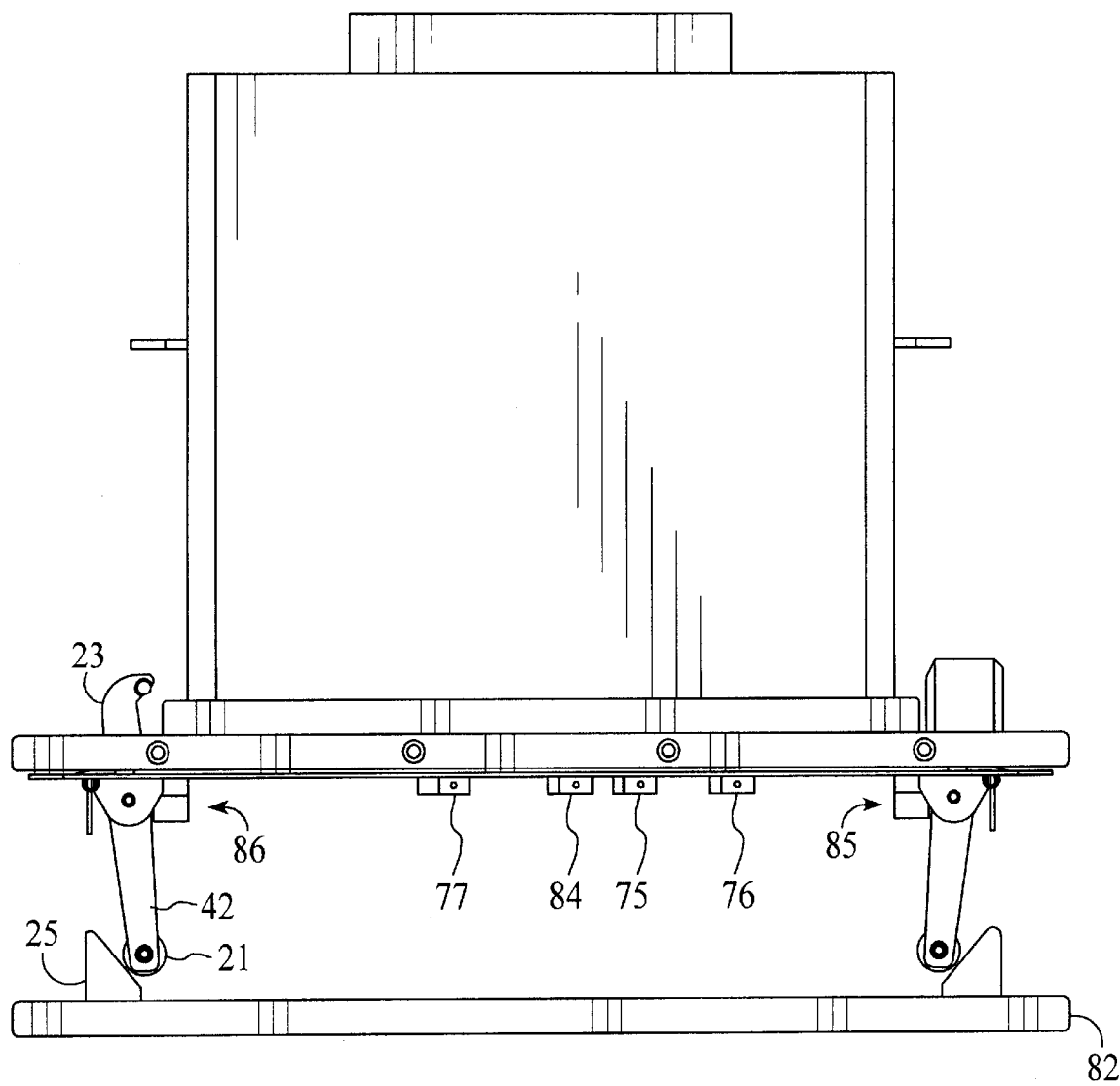
FIG. 5B illustrates a detailed view of a SMIF pod handling system in accordance with one embodiment of the present invention.

Returning to FIG. 3, the movable plate 40 preferably includes connectors 42 to secure the pod cover 8. The connectors 42 are spring loaded and snap onto the pod cover 8 as it is separated from the pod base 4. The connectors have a bottom roller 21, and a top latch 23 for engaging the pod cover 8, as illustrated in FIG. 5B. The bottom roller 21 is connected to the top latch 23, such that a motion in one direction by the roller 21 forces top latch 23 to move in the opposite direction. As illustrated in FIGS. 4, 5A, and 5B, when the pod cover 8 is raised away from the pod base 4, the rollers 21 spring outward away from the pod cover 8 forcing latches 23 inward to secure the cover 8. When the movable plate is positioned to receive the pod 27 as illustrated in FIG. 3, the connectors 42 are forced inward by cam ramps 25, situated in the support base 82. Rollers 21 slide smoothly down the cam ramps 25, forcing the top latches 23 outward and unlatching the pod cover 8. As the movable plate 40 is moved away from the support base 82, the rollers 21 are no longer constrained by the cam ramps 25 and spring outwards. In one embodiment illustrated in FIG. 5B, connectors 42 are placed on two sides of the movable plate 40. Alternate embodiments, may include additional connectors and cam ramps, similar to connectors 42 and cam ramps 25, or may incorporate some other mechanism for securing the pod cover 8 to the movable plate 34. By providing a movement triggered mechanism, the step of latching the pod cover 8 to the moveable plate 40 is eliminated. This mechanisms adds a smooth step to the process of separating the pod cover 8 from the pod base 4. Note also, the mechanical mechanism is used in place of a servomotor or electronically controlled clamp.

Returning to FIG. 4, front guide 44 preferably houses the electronic controls for operation of the interface apparatus 20, and includes a front panel display for providing information regarding operation of the interface apparatus 20 and/or processing procedure of tool 22. Information may be input through an entry screen also contained in front guide 44. An attendant may enter information from a data entry pad, or may select from choices to determine the operation of the interface apparatus 20. In one embodiment, a receiver is provided that reads a signal sent from within the manufacturing environment, such as a radio frequency (RF) signal from a central controller. Sensors are also placed within the front guide 44, and may be used for any of various misalignment checks or other verifications. For example, the sensors may check alignment of the pod base 4 with the pod base receiver 34. The controls and display are detailed hereinbelow.

On the under side of plate 40 is a locking mechanism (not shown) for connecting to a bellows 80. The locking mechanism preferably clips a top end of the bellows securely in place for operation of the interface apparatus 20. The bellows 80 protects the pod during processing and interface. Under the plate 40 is a support base 82, which is typically fixed securely to the processing tool. The support base 82 is also of a rectangular shape, and is coupled to the support towers 50, as illustrated in FIG. 3. A top edge of the support base 82 preferably includes a slide mechanism for coupling the bottom of the bellows 80. The slide mechanism allows easy placement of the bellows. The use of a slide mechanism on the bottom and a clip type mechanism for the top of the bellows 80, provides easy assembly while keeping the bellows 80 securely in place once assembled. Additionally, as the bottom of the bellows 80 is more difficult to view during placement due to the size and shape of the bellows 80 as positioned on the interface apparatus 20, the slide mechanism placed on the bottom of the bellows 80 allows an attendant to easily place the bellows 80 without the need of a clear view of the bottom of the bellows 80 and support base 82.

Pod Base Receiver

Figure 9A:
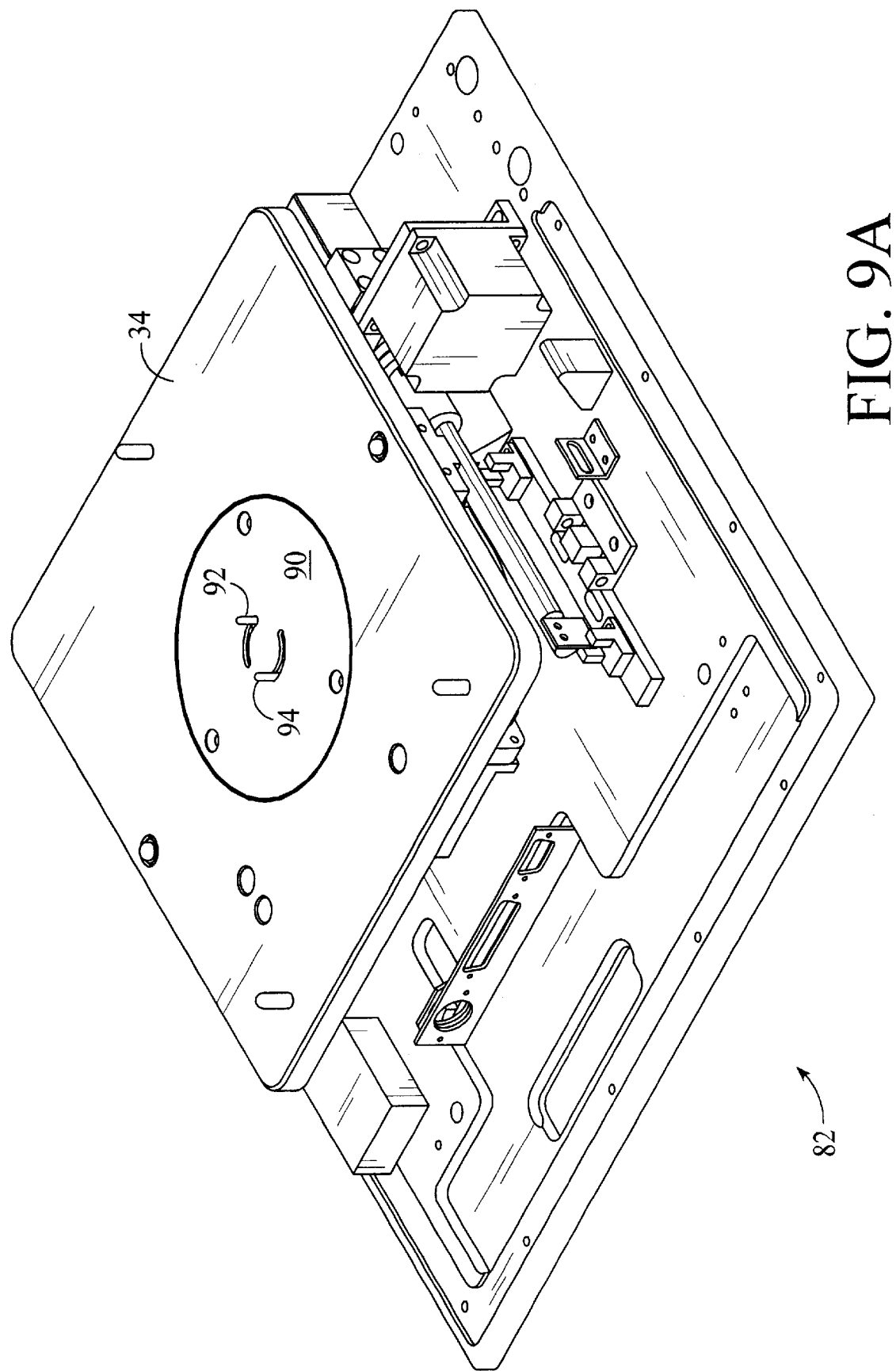
FIGS. 9A and 9B illustrate perspective views of amechanisms for accepting a SMIF pod in accordance with one embodiment of the present invention.

As illustrated in FIG. 9A, the support base 82 is also coupled to the pod base receiver 34 having multiple pins 36 to engage and support the pod base 4. The position of the multiple pins 36 corresponds to slots 10 of FIGS. 1A and 1B, where the pins 36 interact with the latching slots 10 to latch the pod base 4 to the pod cover 8 via the pod base receiver 34. Note that as specified in the SEMI standard, protrusions on the pod base receiver 34 are used to position the pod 2.

Note also, the pod base receiver 34 is not stationary with respect to the support base 82. A horizontal lever 90 rotates about its vertical centerline with two pins 92 and 94 projecting upwards to engage the latching slots 10 of pod 2. It should be noted that in other embodiments of the present invention, there may be more or less than one latching holes and/or pins. Additionally, the horizontal and vertical positions are relative and may be configured in any position, where the lever 90 lies in one plane, and rotation is about a right angle axis to that plane. A sensing device may be used to detect the locking and unlocking of the motor/lever assembly.

Figure 9B:
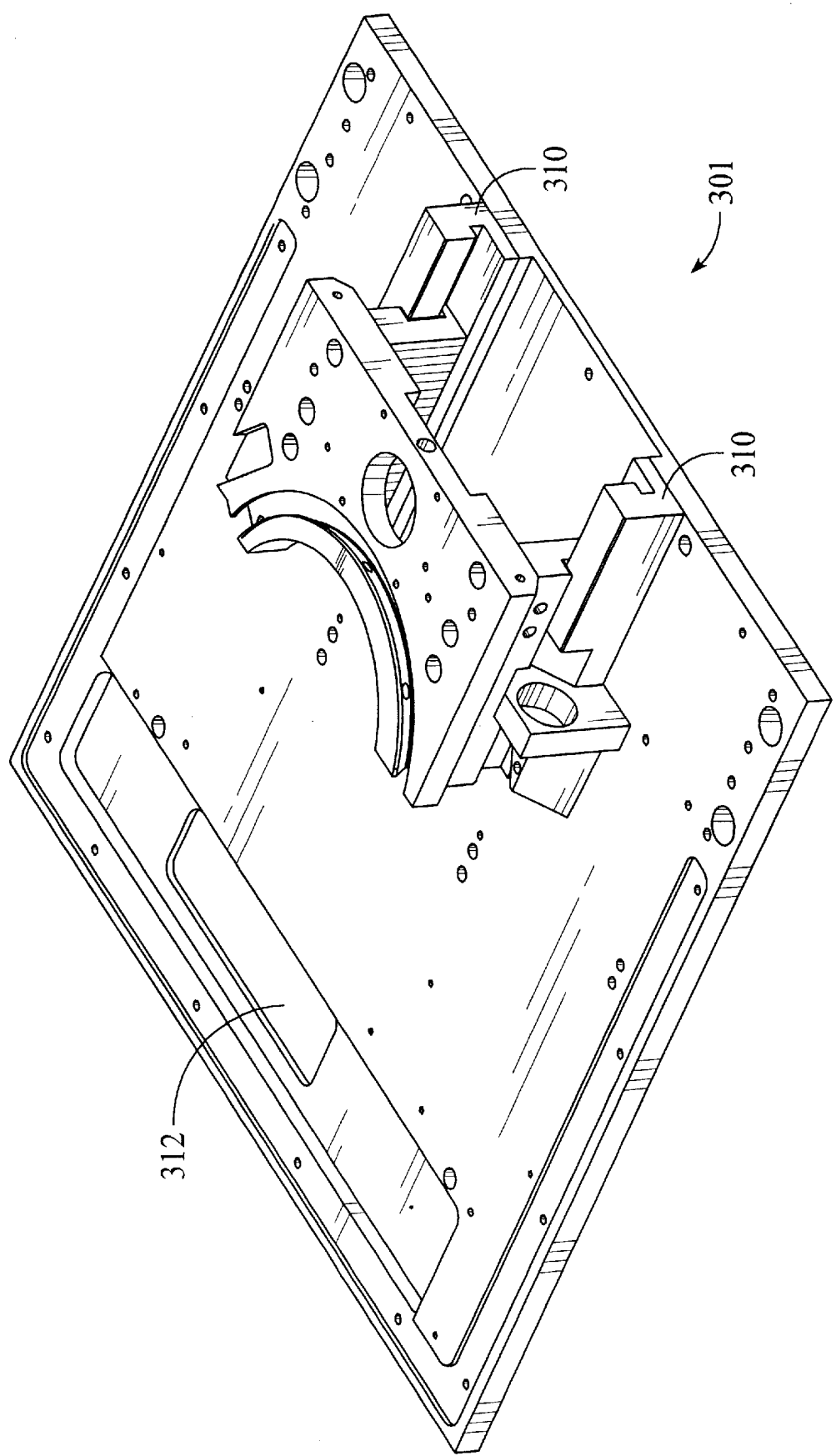

In accordance with preferred embodiments of the present invention, the pod base receiver 34 is adapted with several mechanisms to control movement of the pod base embodiments of the present invention to be more desirably utilized with a greater number and variety of processing tools, thereby enabling new manufacturing methods for a variety of articles and processing tools. These mechanisms preferably, are placed under the pod base receiver 34 to ensure the cleanliness of the mini-environments. A tilt mechanism 304, illustrated in FIG. 15, is provided for tilting the pod base receiver 34 toward the vertical axis, and a rotation mechanism 303, illustrated in FIG. 114A, is provided for rotating the pod base receiver 34 in the horizontal plane. A latching mechanism 302, illustrated in FIG. 14B, to latch and unlatch the pod base 4 to the pod cover 8 via the pod base receiver 34 is provided in the center of pod base receiver 34. A slide mechanism 301, illustrated in FIG. 9B, presents the cassette to the tool. Providing such a variety of mechanisms enables the present invention to have greater degrees of freedom as compared to certain conventional devices, while being of a unique configuration so as to remain within physical constraints imposed by the pods, SEMI and SMIF standards, etc.

A slide mechanism 301 for presenting the cassette 6 towards the wafer handling robot, and retracting when finished is provided under the base plate. As illustrated in FIG. 9B, the slide mechanism includes a pair of rails 310 attached to the support base 82 guide the pod base receiver 34 toward the processing tool 22. A positioning mechanism consists of a lead screw assembly mounted to one of the guides and its corresponding rail 310. The rail as illustrated in the foreground of FIG. 9B has an attached shape to accommodate the lead screw assembly. The nut portion of the lead screw assembly is attached to the guide such that it is retained yet can be rotated about its axis by a motor assembly. The non-rotating screw is fastened by its forward end to the rail. This allows the rotating nut to drive the non-rotating screw forward and back. This pushes and pulls the combined assemblies as a unit. The free end of the screw is used to hold a sensor flag for position verification. According to the present embodiment, the motor to drive the assembly sits to one side, outside rails 310.

Figure 14A:
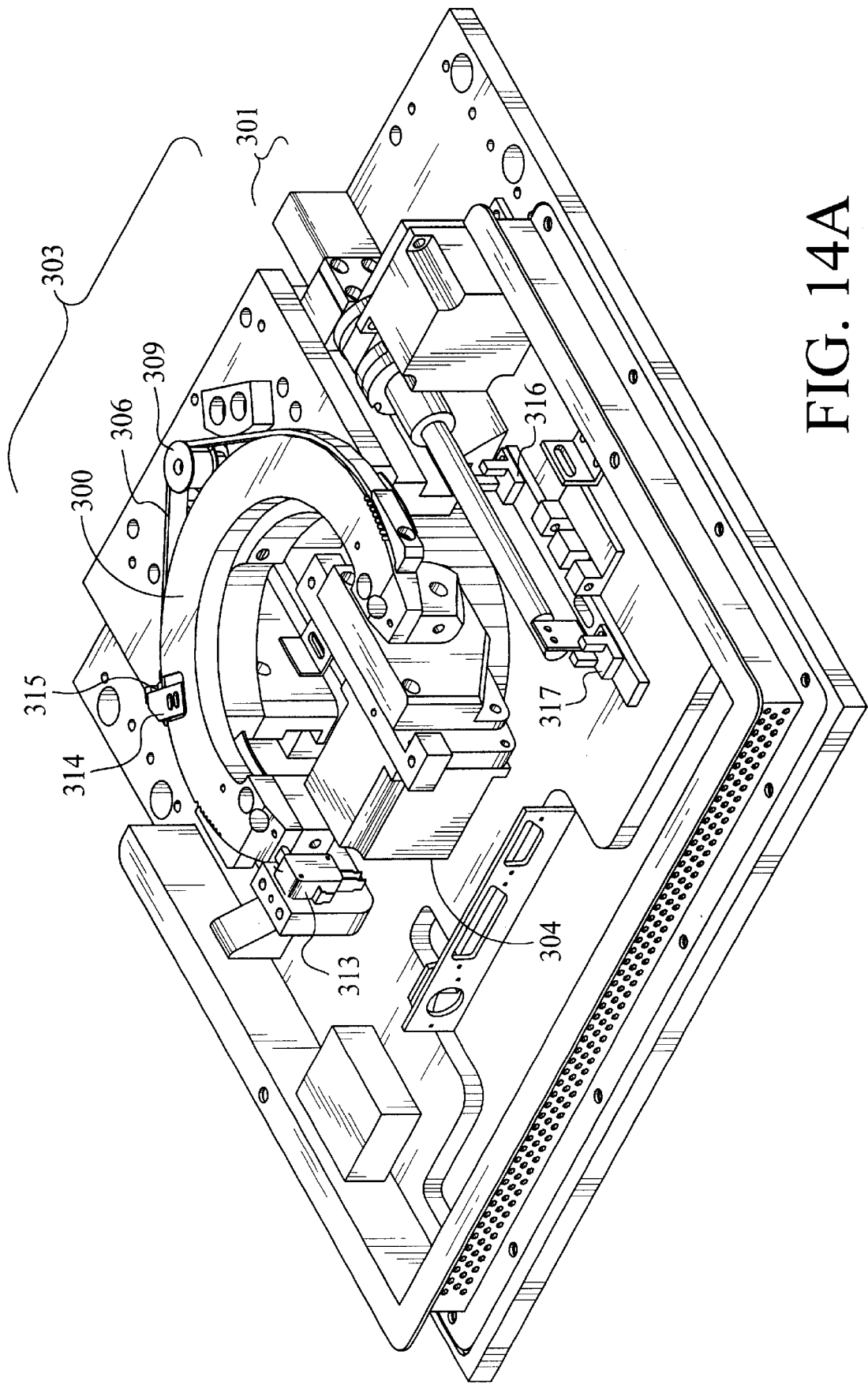
FIGS. 14A, 14B, and 15 illustrate a pod base receiver according to one embodiment of the present invention.

As illustrated in FIG. 14A a home position sensor 317 is provided for forward presentation to the tool, indicating that the base pod receiver 34 is in a home position with respect to presentation to the tool. Sensor 317 is a slot type sensor, where an infra red light source provides a beam across the slot, and a receiver on the opposite side of the slot receives the light beam. In the home presentation position, a flag attached to the sliding mechanism is positioned within the sensor 317 slot interrupting the beam. A similar flag is positioned at another position on the sliding mechanism for travel through a slot in forward presentation sensor 316. Sensor 316 indicates when the base pod receiver 34 is fully presented to the tool. The use of infra red sensors having the slot configuration reduces the risk of sensor interference, and provides a compact arrangement. The support base 82 supports the entire slide mechanism assembly and allows mounting to a device containing a wafer-handling robot. One locating and retaining pin, at least one leveling jack screw and at least one mounting screw preferably are attached to the support base 82. According to one embodiment, four (4) jack screws and four (4) mount screws are incorporated. The additional screws add to the stability of the interface apparatus. The slide mechanism 301 further includes an opening 312 for the power, communication, and emergency off (EMO) cables, a connector bracket for the power, communication, and EMO cables, a vented bracket mounted to the base plate serves as the lower retainer for expanding three sided cover bellows, a mount for the main circuit breaker, and air passage, and an adjustable sensor and bracket assembly for forward and back positioning, all mounted to the base plate. As the size of the interface apparatus 20 is kept to a minimum, the provision of such cables presents a difficult design problem. The present invention places the cables and connectors in a unique combination, using available unused spaces in a highly desirable manner as opposed to other conventional systems.

The pod base receiver 34 is coupled to the cassette 6, and therefore any motion of the pod base receiver 34 effects the cassette 6. The automated adjustment of the pod base receiver 34 toward the tool 22 is to place the wafers within cassette 6 for presentation to the tool 22. This is necessary for processing of the wafers. It is an advantage of the present invention, that the adjustment is automated with the controls for tilt, rotate, and slide configured beneath the pod base receiver 34. This serves to prevent contaminants from entering the container and thus degrading the clean mini-environment, and thus provides a substantial improvement over systems in which contaminants from top-mounted motors or the like may more readily be transported down into the mini-environment.

The following sections detail each of the mechanisms which are implemented via the pod base receiver 34. This includes operations from acceptance of the pod 2 through processing of the wafers in processing tool 22, and finally with release of the pod 2 from the interface apparatus 20. In a preferred embodiment, each of these mechanisms is attached to the bottom of pod base receiver 34. The configuration of these mechanisms is based on a unique design that attempts to maximize the limited space available within the interface apparatus 20.

Figure 14B:
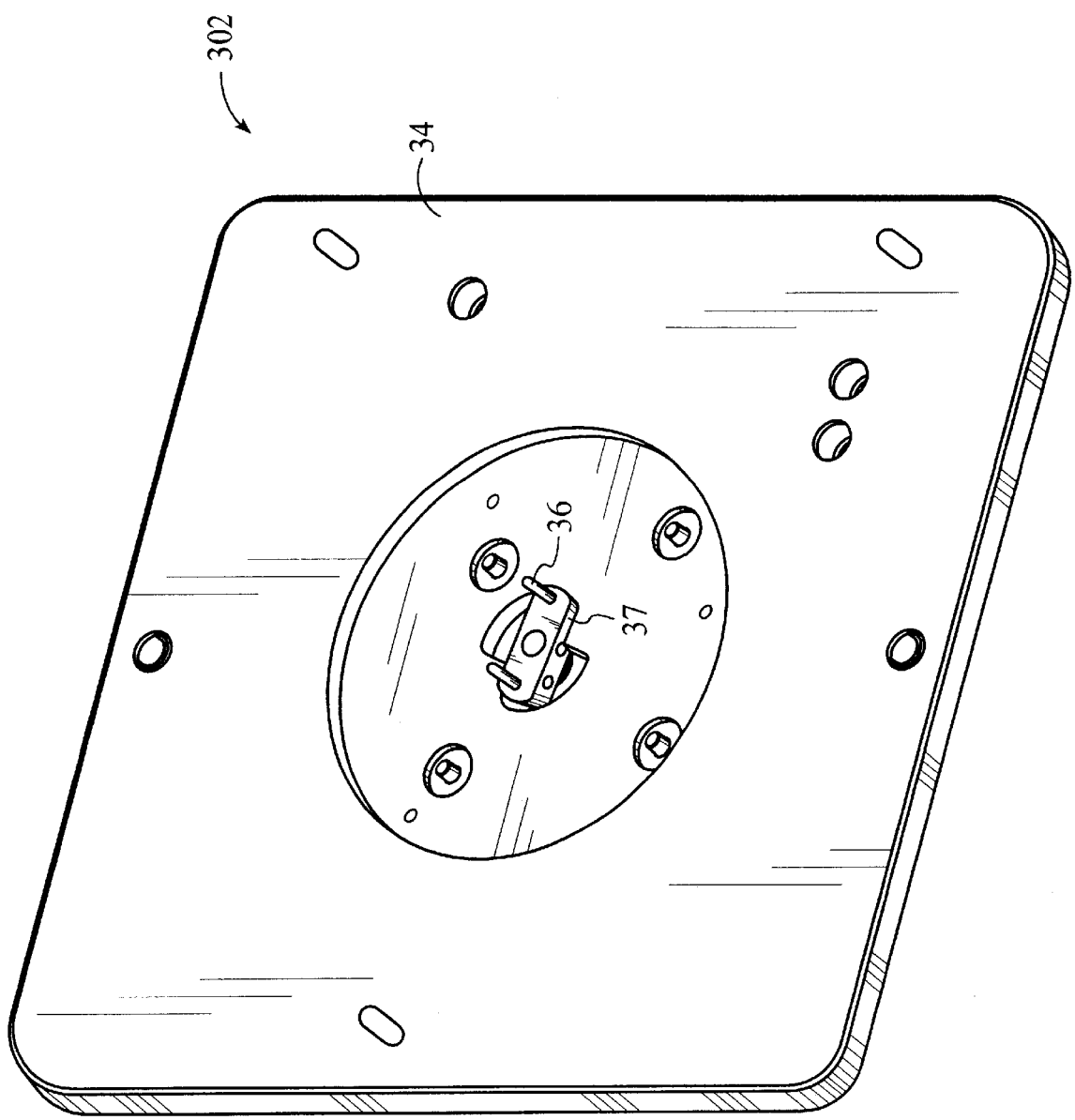
Figure 15:
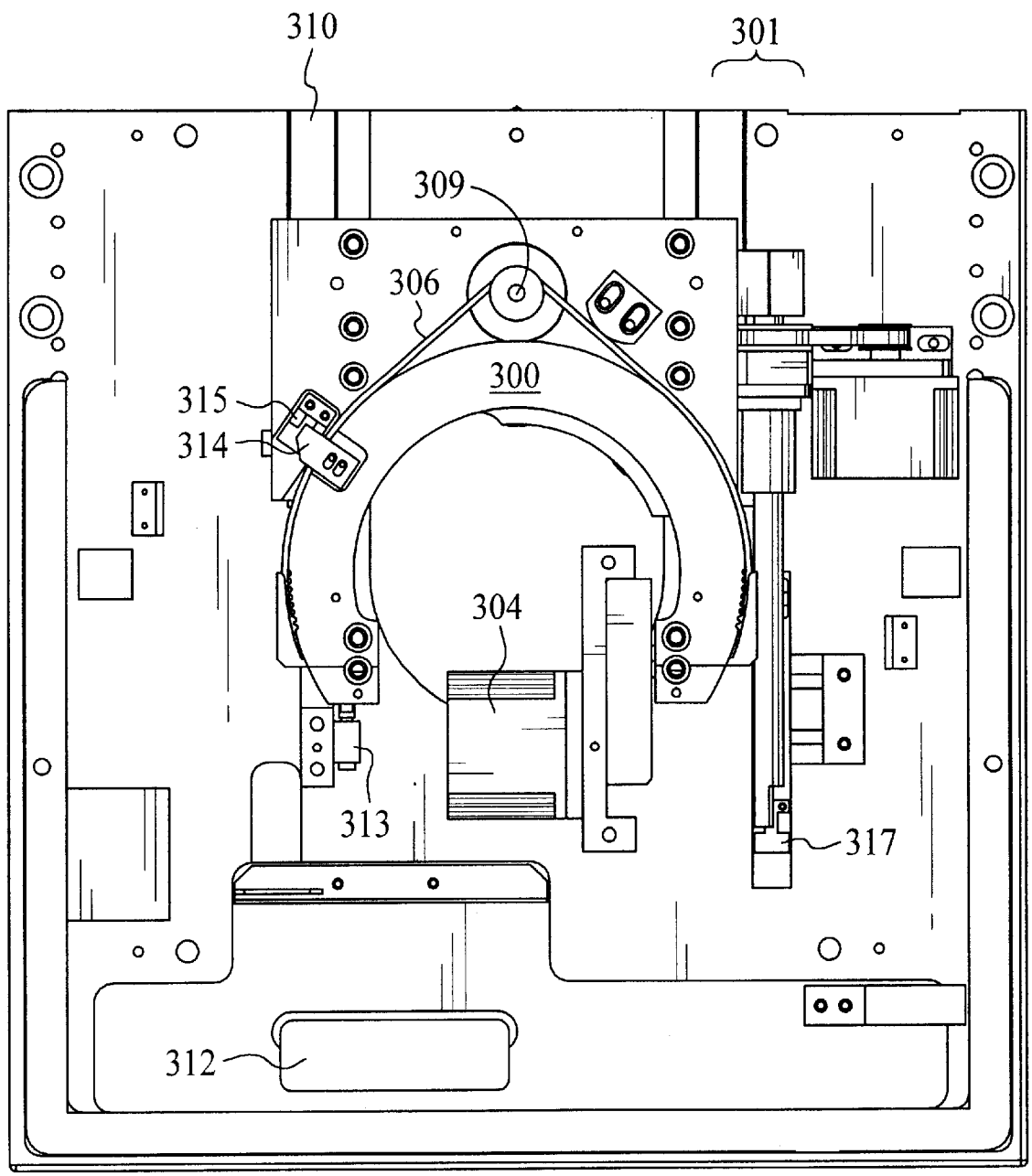

In discussing these adjustment mechanisms, reference is made to FIGS. 14A, 14B, and 15. FIGS. 14A and 14B illustrate the configuration of these mechanisms according to one embodiment of the present invention, and FIG. 15 illustrates the placement of these mechanisms on the pod base receiver 34. The configuration of these mechanisms includes a horseshoe shaped dovetail brace surrounding two motors and a gearbox. This particular configuration allows adjustments to be automated, while staying within the dimensions of the SEMI standard.

Latching Mechanism

After receipt of the pod 2 into the interface apparatus 20, the pod 2 is unlatched and the pod base 4 rests on the pod base receiver 34. The position of the latching mechanism 302 is determined by the SEMI specifications regarding SMIF containers. The latching mechanism is illustrated in FIG. 14B, where the two latching pins 36 are configured on a rotating piece 37. Accordingly, the latching mechanism 302 engages the latching slots 10 located in the center of pod base 4. The location of the locking mechanism 302 corresponds to the center of the container, when the container is placed on the base plate. Where the container is a SMIF pod, the lock mechanism is according to the SEMI standard, and is placed in the center of the pod. The lock mechanism for the SMIF pod includes two locking pins, such as multiple pins 36, which are rotated in a first direction to lock the pod, and in a second opposite direction to release it. In one embodiment, the latching mechanism 302 includes a motor for engaging the latching slots by rotating the multiple pins 36.

As illustrated in FIG. 14B, the latching mechanism 302 includes a motor for turning the plurality of pins 36, which extend through the pod base receiver 34. The pins 36 connect to the latching slots 10, are held by a latching piece which rotates the pins to latch the pod.

Tilt Mechanism

Configured next to the latching mechanism 302 is the tilt mechanism 304, which preferably includes a gearbox and a stepper motor, as illustrated in FIG. 14A. The tilt mechanism 304 is used to tilt the pod base receiver 34 for placement and safe movement of the wafers. The tilt mechanism 304 tilts the pod base receiver 34 so that the side of the cassette 6 facing away from the tool is lower than the side of cassette 6 facing the tool. The tilt has been determined to be particularly helpful during movement of the pod base receiver 34, as it tends to secure the wafers in their seating while the cassette 6 is presented to the tool for processing. The tilt of the pod base receiver 34 also tends to seat each wafer in a proper position for further processing. This is important, as each wafer is to remain inside the perimeter of the container until the robot extracts it. If a wafer protrudes from the container it may be damaged during movement of the pod or by the movement of the robot in extracting or returning another wafer. Thus, the ability to provide a tilt mechanism in accordance with preferred embodiments of the present invention provides substantial advantages over systems not including such a tilt mechanism.

To seat all of the wafers simultaneously, the tilt mechanism tilts the pod base receiver 34 to an angle sufficient to force each wafer back against the enclosed side of the container. Once seated, the tilt mechanism can then return the base plate, and the container, to a position suitable for processing. The tilt seating method alleviates the need for further misalignment sensing, as well as the error handling associated with such checks. Once processing is completed, the pod base receiver 34 is tilted to a position for movement away from the tool. Here again, the tilt movement ensures that wafers are properly seated in the cassette 6.

Figure 10:
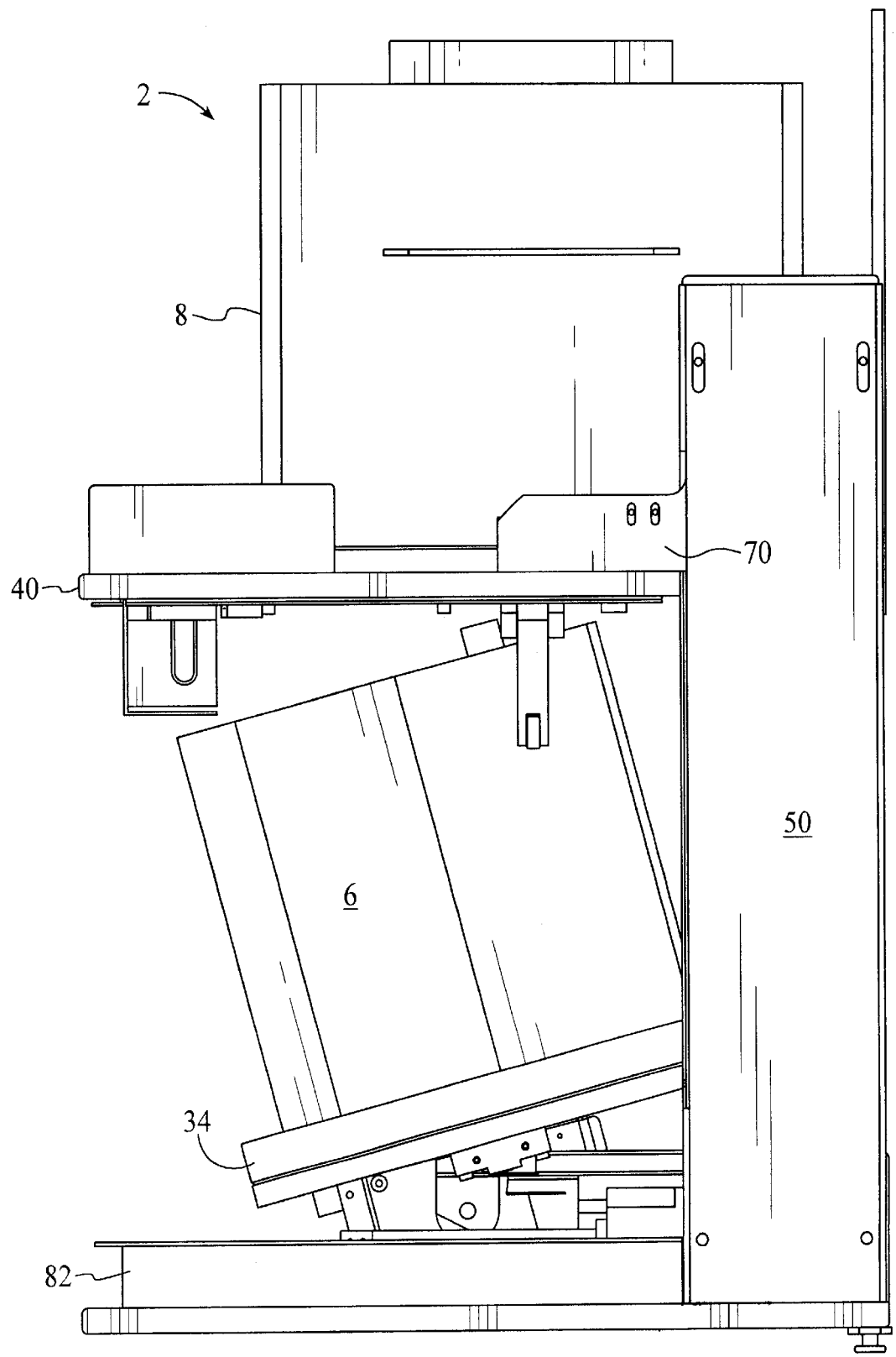
FIG. 10 illustrates an interface apparatus with a SMIF pod in a tilted position in accordance with one embodiment of the present invention.

Referring to FIG. 10, the tilt mechanism 304 tilts the pod base receiver 34 which enables the attached cassette 6 to accelerate and decelerate in the horizontal plane at a faster rate without the wafers 14 in cassette 6 being disturbed from their seating. As illustrated in FIG. 10, the support base 82 and the support towers 50 are adjacent to the processing tool. The cassette 6 rests on the pod base receiver 34, while the movable plate supports the pod cover 8. The bellows 80, not shown for clarity, cover the cassette 6. The pod base receiver 34 is tilted away from the processing tool 22, and then moved forward to meet tool 22.

The ability to tilt pod base receiver 34 also provides a means for seating the wafers in the container. Wafer seating involves returning wafers displaced from proper position back to their proper position. For example, where wafers are stored in slots of the pod or cassette, transportation may cause the wafers to move forward in the cassette. The tilting mechanism allows cassette 6 to be properly aligned with the processing tool 22, and a robotic arm as it is being moved in the horizontal plane.

According to one embodiment 6f the present invention, a controller is used to automate the tilt angle of pod base receiver 34. The controller is programmed according to the parameters of the pod and mini-environment, and considers the size and position of the wafer in the pod and processing tool. The controller adjusts the tilt, so as to maintain the center of gravity of each wafer within a predetermined parameter. The controller automatically tilts pod base receiver 34 to seat each wafer within the pod. The controller then returns pod base receiver 34 to a horizontal position, or other position, for further processing or transfer of the wafers.

Automated tilt is enhanced by the use of sensors for determining relative positions of the pod base receiver 34. As illustrated in FIG. 14A, a tilt home sensor switch 313 is contacted as the pod base receiver 34 is tilted to a home position. As the pod base receiver 34 is tilted away from home position, the switch 313 is released. In this way, switch 313 indicates when the pod base receiver 34 is in the home position. The sensor information is then provided to a main controller which then terminates the tilt motion. Similarly, when the controller initiates tilt motion the switch is released and provides a signal to the controller. If the controller initiates a tilt and the the switch is not released then the controller is alerted that there is a problem with the tilt mechanism. At this point the controller may notify a human attendant by way of the display in the front guide 44. The controller may be preprogrammed for wafers of a particular size and weight. Similarly, an operator may input data and other processing information related to the wafers and the processing tool, wherein the input data is used to determine an optimum tilt condition for placing the wafers in the pod. In alternate embodiments, the tilt controller may consider additional dimensions and characteristics of the article to be seated. For example, in placing articles which are not asymmetrical, the tilt movement may involve two and/or three-dimensional.

Because the present invention includes the tilt mechanism 304, an important aspect of the present invention is the position of the center of gravity with respect to pod base receiver 34. As the attached pod 2 is tilted, for optimum operation it is desirable that the center of gravity be closer to the raised end of pod base receiver 34 rather than the lowered end. Further, the tilting motor mechanism placed underneath base plate must be positioned in a manner as to not offset the desired center of gravity. A centerline pivot point is offset, such that the center of gravity of the cassette minimally crosses the pivot point vertical plane during maximum rearward tilt. By doing so, it ensures the greatest possible balance and stability of the tilting mechanism with the maximum load applied. A motor/gearbox assembly positioned behind the pivot point to counter balance the cantilevered plate supporting the SMIF pod base and wafer cassette. In preferred embodiments, the center of gravity of the cassette travels within an angular range of about 20 degrees from the pivot point vertical plane, or more preferably within an angular range of about 15 degrees from the pivot point vertical plane, and preferably within an angular range of about 10 degrees from the pivot point vertical plane (with the pivot point determining the point from which the angular ranges are measured, etc.).

Figure 29A:
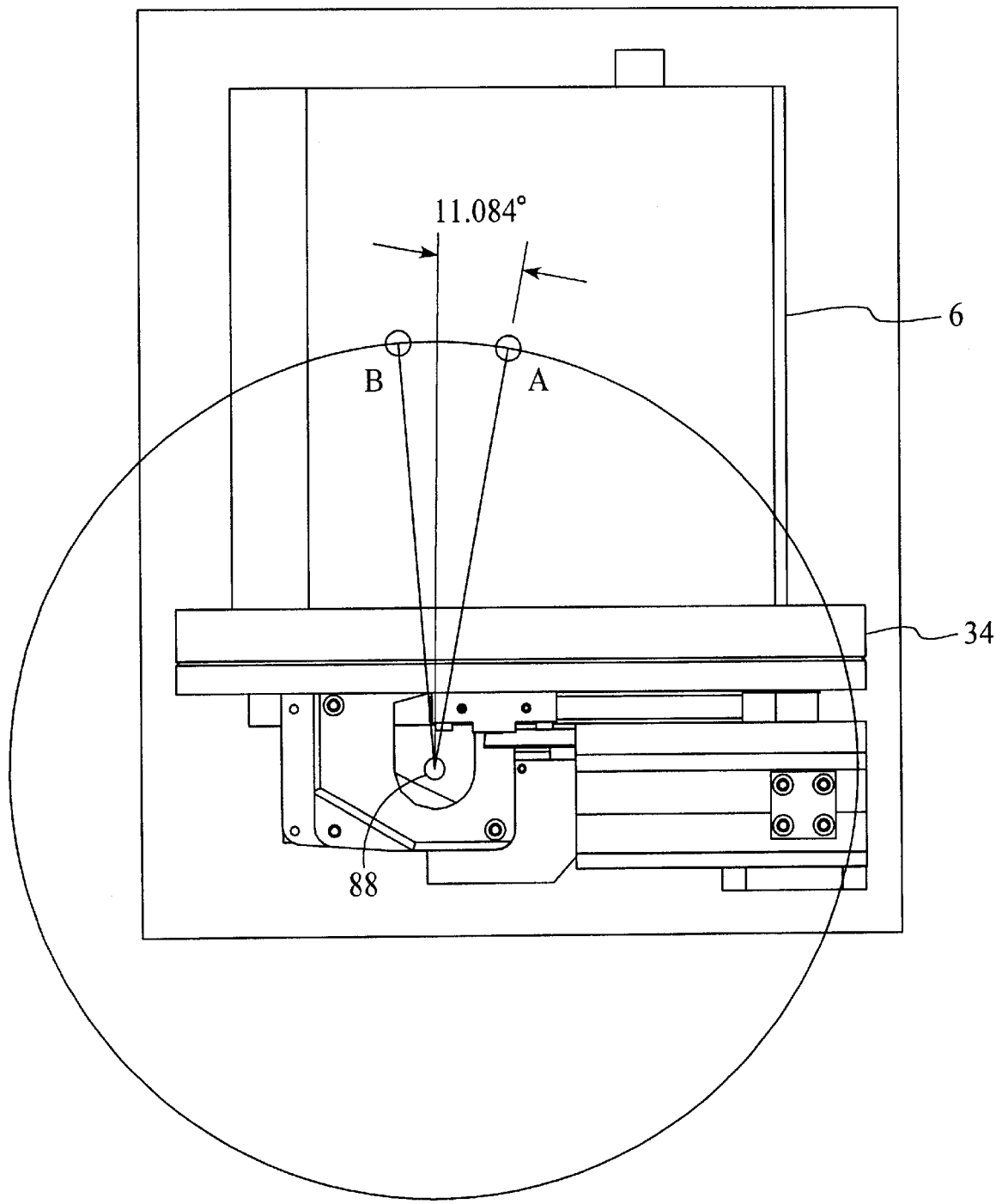
FIGS. 29A and 29B illustrate the center of gravity of an article container in two tilt positions of the interface apparatus according to one embodiment of the present invention.
Figure 29B:
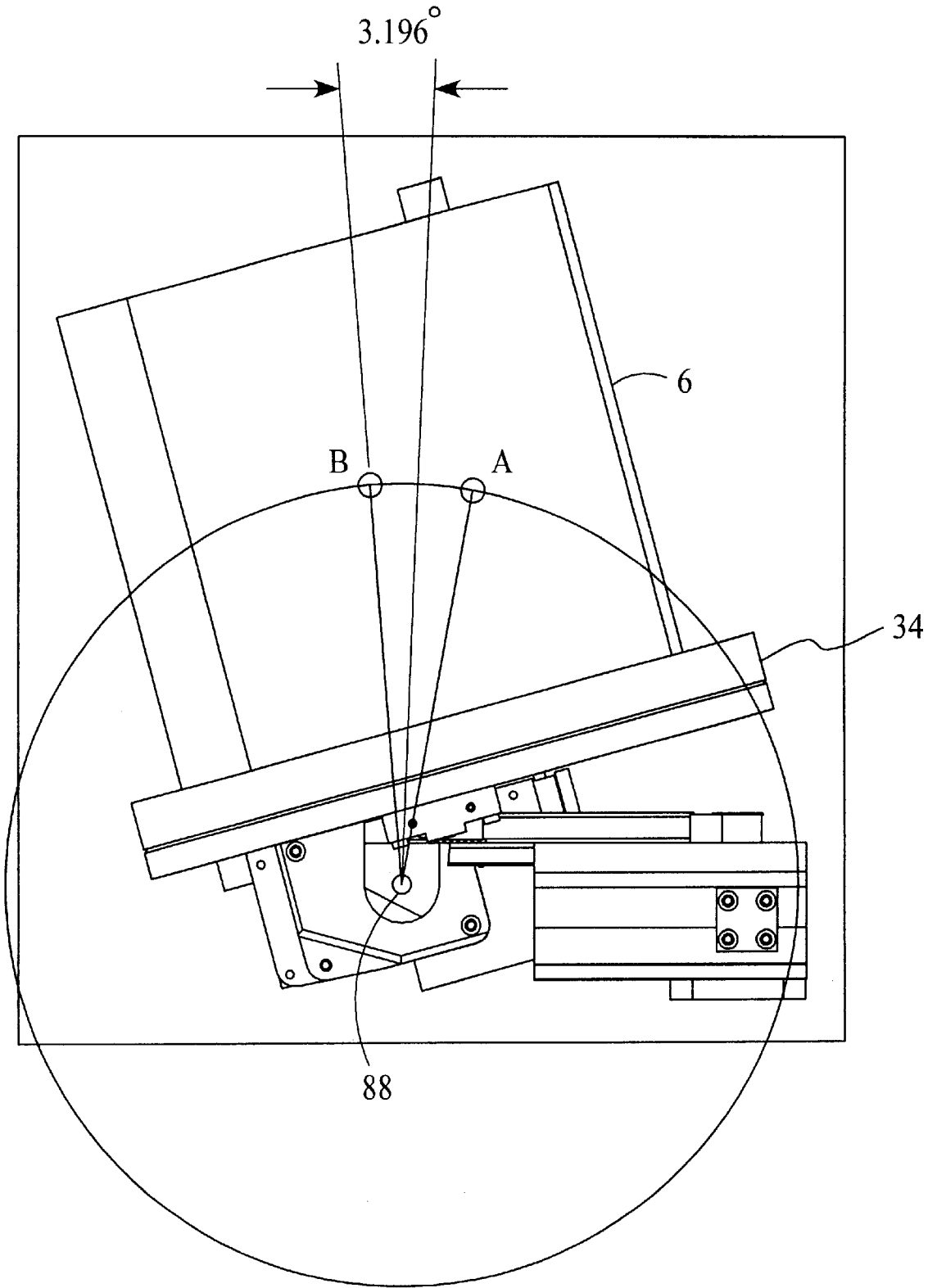

As illustrated in FIGS. 29A and 29B, in a preferred embodiment the interface apparatus maintains the center of gravity of the container within a predetermined range. In FIG. 29A a cassette 6 is seated on a base plate 34, where base plate 34 and cassette 6 are both in an initial tilt position. A pivot point 88 is situated below the base plate 34, and is placed so as to constrain the center of gravity of the cassette 6 during movement. As illustrated in FIG. 29A, the center of gravity of the cassette 6 is located at point A. Note that as the base plate tilts, the center of gravity of the cassette 6 moves in an angular motion centered at the pivot point 88. While the base plate 34 and the cassette 6 are in this initial tilt position, the center of gravity is displaced a first angular amount from a vertical axis drawn through the pivot 88. In this initial position the horizontal plane of the base plate 34 and the cassette 6 is perpendicular to the vertical axis.

FIG. 29B illustrates the base plate 34 and cassette 6 after the tilt movement to a second tilt position. In this tilt position, the center of gravity of the cassette 6 is indicated at point B. Note that the center of gravity moved in an angular motion as the base plate 34 and the cassette 6 moved to the second tilt position. In this second tilt position, the center of gravity of the cassette 6 is displaced a second angular amount from the vertical axis through the pivot point, wherein the second angular amount is within a predetermined range of the first angular amount. It is desirable to constrain the center of gravity to within a predetermined range to keep the cassette from tipping over during movement. For example, where the center of gravity is sufficiently displaced, during forward movement and presentation to the tool, the cassette could fall backwards. Such an accident not only interrupts production, but may potentially damage the wafers.

In a preferred embodiment, the first angular amount is or about 11° and the second angular amount is approximately 3°, where the range of the second angular amount is within or about 0° to 5° from the vertical axis drawn through the pivot point as illustrated in FIGS. 29A and 29B. Note also that as the center of gravity changes it forces the wafers into the cassette, seating the wafers.

Rotation Mechanism

As illustrated in FIG. 14A, the rotation mechanism preferably includes a horseshoe dovetail 300 surrounding the latching mechanism 302 and the tilt mechanism 304. It has been determined that such a horseshoe shape more readily allows for the various mechanisms to be placed under the pod base receiver 34 and to function together. The horseshoe shape provides an opening for placement of the other mechanisms. Along the perimeter of the horseshoe dovetail 300 is placed a timing belt 306, which directs the rotational movement of pod base receiver 34. These mechanisms again are preferably placed underneath the base plate and thereby avoid introduction of contaminants into the clean environment.

A pulley 309 is placed outside the horseshoe dovetail 300 to control the timing belt 306. The pulley 309 is positioned on a plate 308 which is secured to the base support 82. A motor is coupled to the pulley 309 to turn the pulley 309, thus creating the rotational force on pod base receiver 34 through tension on the timing belt 306. The timing belt 306 is coupled to the horseshoe dovetail 300 and as the timing belt moves, the horseshoe dovetail 300 is also rotated. In this way, the base plate is rotated.

Figure 11:
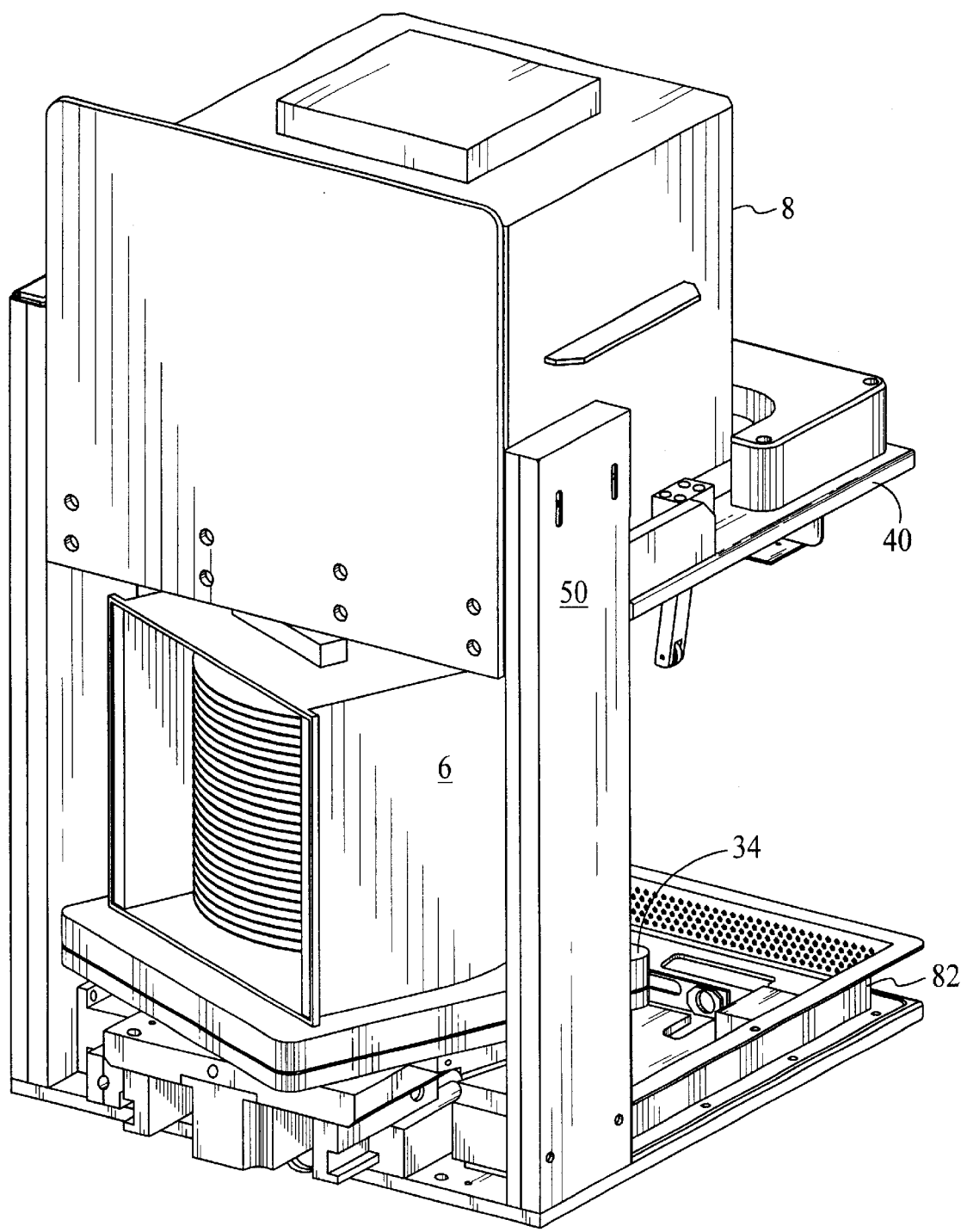
FIG. 11 illustrates an interface apparatus with a pod in a rotated position within a horizontalal plane in accordance with one embodiment of the present invention.

As seen in FIG. 11, the rotating mechanism 303 allows the rotation of the cassette to meet the tool 22. As seen in this view of the interface apparatus 20, the dimensions of the support towers 50 limit rotation of pod base receiver 34. One embodiment preferably provides a first degree of angular rotation in each direction in the horizontal plane (preferably around 20° or 23°), and a second degree of angular rotation in each direction (preferably around 30°) when the base plate is at full tilt. Rotation of pod base receiver 34 provides a flexible interface to tool 22, by allowing an automated positioning of the cassette 6. As in FIG. 10, the cassette cover 8 is open, supported by the movable plate 40. The bellows are not shown in these drawings.

In accordance with the present invention, the shape and placement of the rotation mechanism allow clearance for the tilt and latch mechanisms. The horseshoe dovetail forms a circular guard on the support base 82. A pivot mount is provided at each of the two ends of the horseshoe dovetail, where the combined latching, tilt, and slide mechanisms are attached. A motor rotates the horseshoe dovetail 300 via a timing belt 306, where the two ends of the belt 306 are fastened near the two ends of the horseshoe dovetail 300 and driven by a pulley 109 on the motor shaft. According to the view of FIG. 14A, the motor is positioned below plate 308. In accordance with other preferred embodiments, a gear drive may be used to rotate the horseshoe dovetail 300. According to one embodiment, the motor is mounted vertically on a centerline with, and in front of the horseshoe dovetail, and attached to the base support 82 such that the pulley 309 or gear aligns with the horseshoe dovetail 300.

Figure 12:
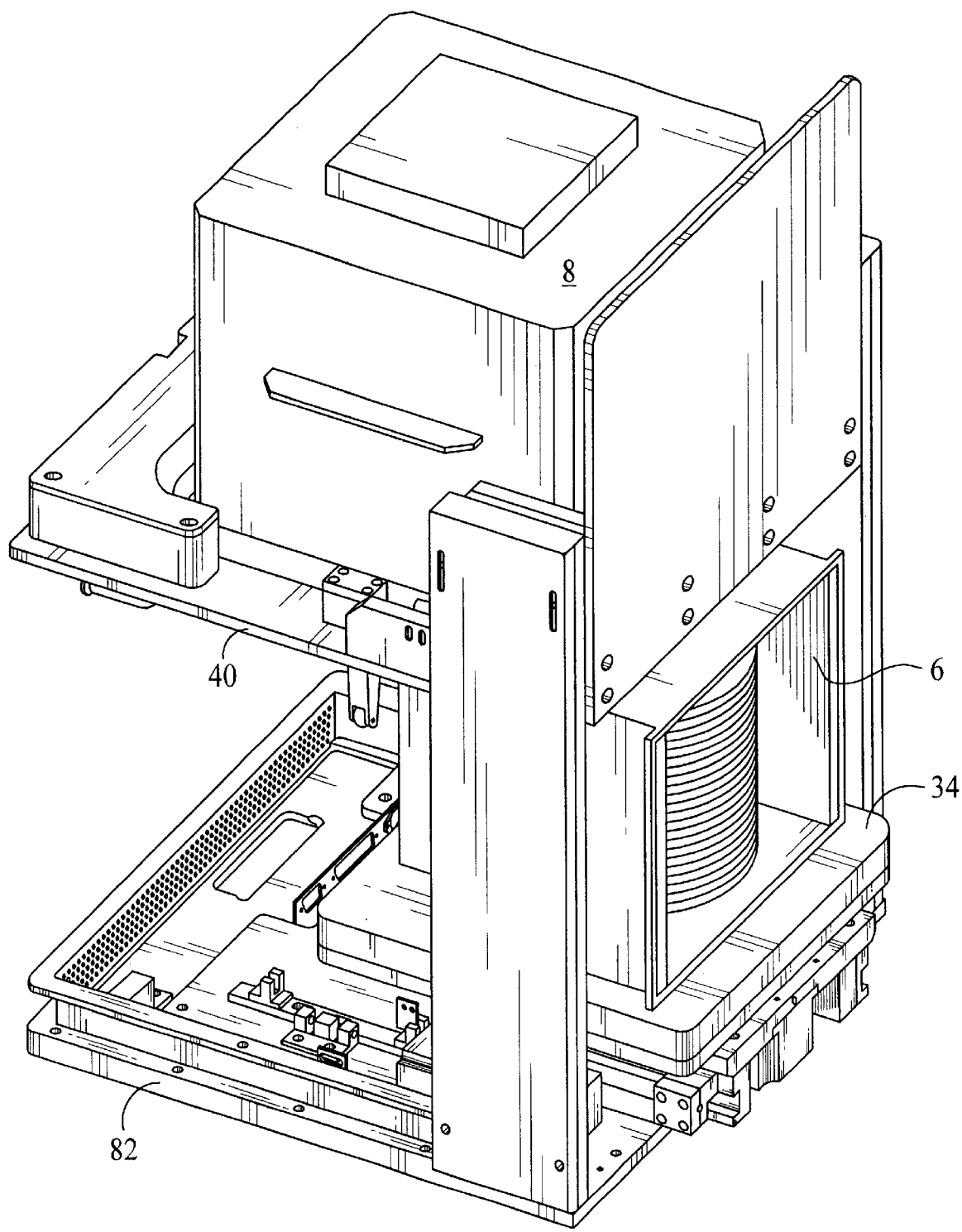
FIG. 12 illustrates an interface apparatus with a pod positioned towards a wafer-handling robot in accordance with one embodiment of the present invention.

FIG. 12 illustrates the position of the pod base receiver 34 and cassette 6 as they present the wafers to the tool 22. The movable plate 40 still supports the pod cover 8 in an open position. The pod base receiver 34 is in a position where the tool 22 can extract wafers from cassette 6. Note that since the mechanisms which control movement of the pod base receiver 14 are attached to the pod base receiver 34, these mechanisms move with the pod base receiver 34 towards the tool 22.

As illustrated in FIG. 14A, a rotation home sensor 315 is positioned along horseshoe dovetail 300 to determine the relative home position of horseshoe dovetail 300. Note that according to one embodiment rotation home sensor 315 is an optical slot type sensor, where a slot is provided to allow a flag to move therein. The beam is directed from one side of the slot to a receiver on the opposite side of the slot. As the flag moves through the slot, the beam is interrupted. Located on dovetail 300 is flag 314 which travels with dovetail 300. Flag 314 includes an angled bracket which travels through the slot of sensor 315. As the flag travels through the slot, it breaks the optical beam indicating rotation beyond sensor 315. When the beam of sensor 315 is interrupted, the dovetail 300 is in the home position with respect to rotation. When the beam is received, dovetail 300 is in a rotated position. As with the tilt sensors, indication of the position of dovetail 300 is provided to a controller, which then makes appropriate decisions as to a next operation. Alternate embodiments may include multiple rotation sensors, each indicating a specific location. Control of the various mechanisms described hereinabove preferably is accomplished by a central controller. The controller preferably is located within the front guide 44, illustrated in FIG. 4. The controller is a multi-dimensional controller, which is operated by way of a computer software program. The controller provides both independent and dependent control, and is programmed by the user to implement the combination of functions available within the controller.

The controller preferably controls at least five stepper motors for manipulating the interface apparatus for presentation of the wafers to the processing tool. In preferred embodiments, an H-bridge driver facilitates control of a DC motor driver, and the five stepper motors. In one embodiment, the stepper motors are two phase motors. The controller preferably controls each motor independently. The processors may be microcontrollers, having other functions incorporated into the control of the interface apparatus.

The control interface is part of the front guide 44, and includes an on-the-fly current controller, which controls the current provided to each motor. This allows the user to program and reprogram the controller according to the requirements of the motor used. When, for example, a motor fails and is replaced with a motor having a different current draw, the new current requirements are programmed into the controller, and the controller adjusts the current accordingly. This, flexibility facilitates better maintenance of the interface handler, ensuring consistent operation of the apparatus.

The controller provides simultaneous control of at least two motors, and independent control of at least one motor. In this way, it is possible to tie control of two dependent motors to one instruction. Additionally, for those motors which function independently of the other motors, the controller provides such specific control, Firmware in the main controller provides automated control of the motors. It is possible to optimize operation and minimize power consumption of the interface apparatus by the use of such automated control. The main controller also receives information from the various positional sensors within the interface apparatus, such as the home sensors 313, 315, and 317 of FIG. 14A, and/or the sensors of FIG. 5B, such as 75, 76, and 84. Each sensor identifies the presence or absence of a light beam, and has specific significance depending on the condition. This significant information is passed to the main controller for further decisions and operation of the interface apparatus.

Feedback is provided by the way of sensors and measurement devices. Analog-to-digital converters are provided with the controller. This allows for plug-and-play type introduction of specific sensors. For example, temperature and humidity are critical considerations in a semiconductor (or other device) fabrication process. By placing such sensors into the interface apparatus, the A/D converters provide the resultant measurement to the controller in the form of digital data. The firmware is then programmed to control the interface apparatus according to predetermined sets of conditions and responses. Typical measurements include pressure within the pod, pressure within the tool, temperature of the wafer environment, humidity within the mini-environment, etc.

The present invention provides within one controller control of various types of motors, sensor feedback receivers, digital control signals to react to environment conditions, alternating signal generation for control of AC components, light emitting diode (LED) control to provide status information on the operation of the motors, volatile and nonvolatile memory, as well as a fan output to keep the control mechanism cool. Accordingly, the main controller controls both stepper motors, and DC motors. An analog input is provided for the feedback environmental control loops. A digital input/output (I/O) is provided to send and receive digital control signals. A standard parallel interface is provided for asynchronous control of multiple portions of the interface apparatus. A push button controller allows the user to interface with the main controller directly. An I²C bus provides uniform, easy programming and communication within the main controller.

Additionally, surface mount resistors provide thermal resistance to the main controller. Efficient FETs are used to prevent the heat sink effects of MOSFETs. In this way, the design of the controller itself provides heat resistance.

Interface Method

Figure 13A:
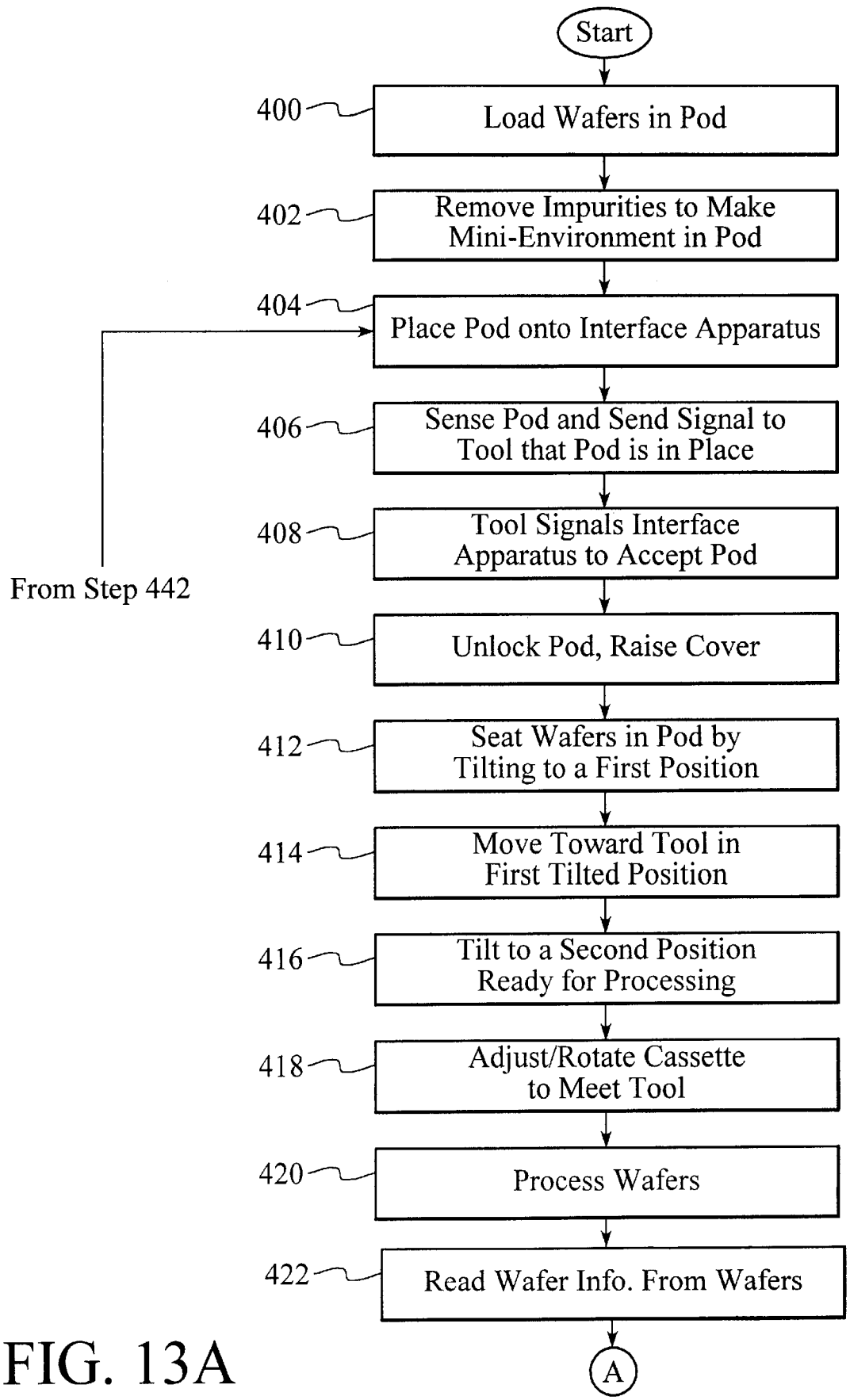
FIGS. 13A and 13B illustrate, in flow diagram form, a manufacturing process according to one embodiment of the present invention.
Figure 13B:
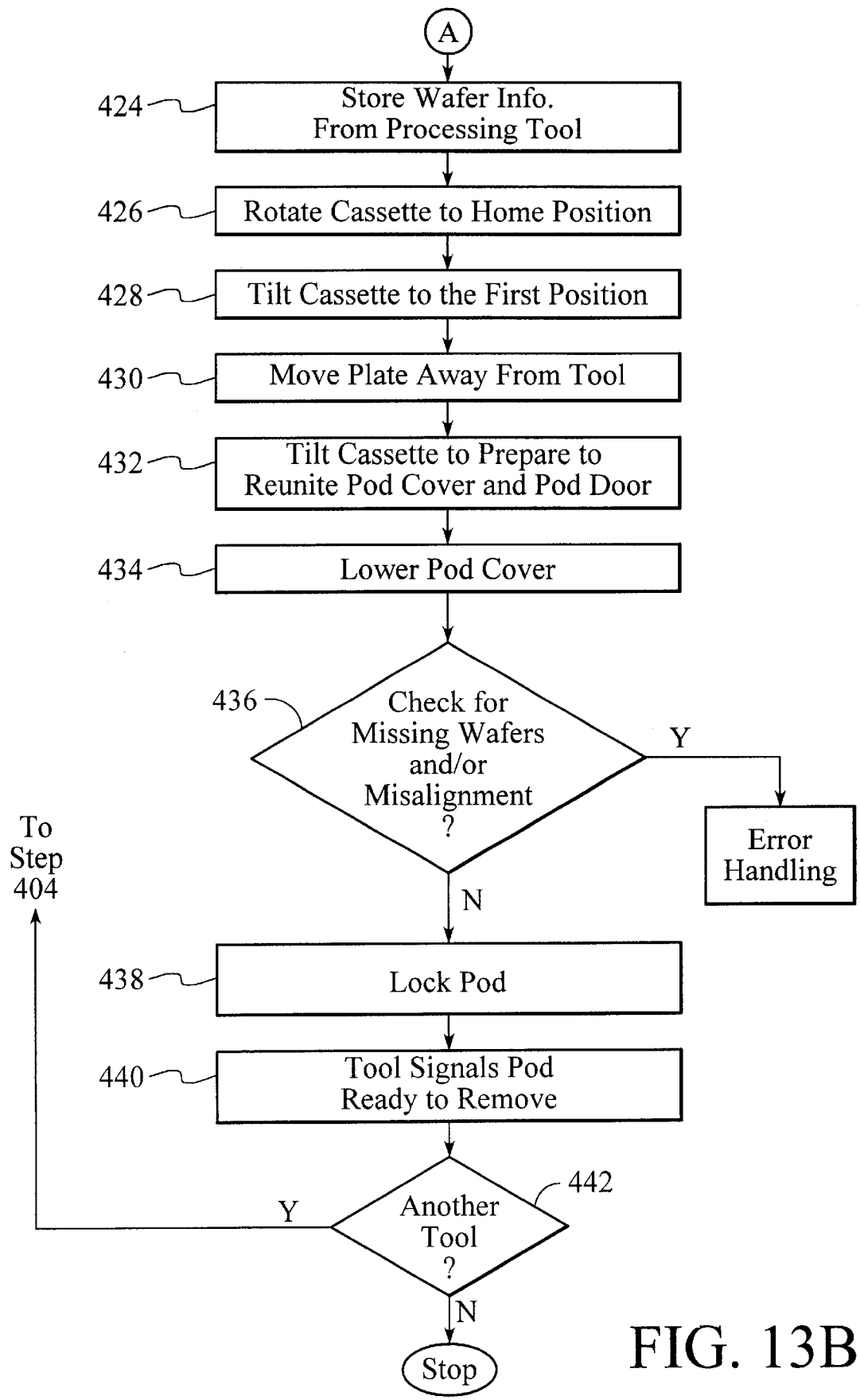

The flow diagram of FIGS. 13A and 13B illustrates a method of interfacing a SMIF pod with a processing tool via an interface apparatus according to one embodiment of the present invention. Processing starts in a manufacturing environment, such as illustrated in FIG. 2, where at least one processing tool 22 is contained within a mini-environment. The wafers are contained in a cassette 6 within a SMIF pod 2. The method begins by loading wafers in the pod 2 at step 400. At step 402, impurities are removed from the pod 2 to create a clean mini-environment within the pod 2. The pod 2 is placed onto the interface apparatus 20 at step 404. Sensors placed within interface apparatus 20 sense the placement of the pod into and send a signal to the processing tool 22 at step 406.

In response, processing tool 22 prepares to receive the wafers, and signals the interface apparatus 20 to accept the pod 2 at step 408. The interface apparatus 20 then unlocks the pod 2, by unlatching the pod base 4 from the pod cover 8 via the pod base receiver 34, and raises the pod cover 8. This opens the pod and allowing removal of the wafers. The tilt mechanism then tilts the pod base receiver 34 to prepare for movement toward the tool 22. The tilting of the pod base receiver 34 seats the wafers in cassette 6 at step 412. When the pod base receiver 34 is tilted to a first position, the pod base receiver 34 is moved toward the tool 22 in the first tilted position at step 414. The pod base receiver 34 is then tilted to a second position to prepare for processing at step 416.

As there may be multiple interface apparatus 20 coupled to one processing tool 22 with one robotic arm, it may be desirable to rotate the pod base receiver 34 to meet the tool 22. In this case, the base plate is rotated at step 418 so that the cassette 6 meets the tool 22. The cassette 6 is now in position to allow extraction of each wafer for processing in tool 22. At step 420 the wafers are processed. Information is read from the wafers at step 422. Information may include wafer identification, lot numbers, as well as any other information that may assist in the manufacturing process. The wafer information is then stored into a memory storage unit in the guide 44 at step 424 The pod base receiver 34 and cassette 6 are then rotated back to a home position at step. 426. The pod base receiver 34 is tilted back to the first position for movement away from the processing tool 22 at steps 428 and 430. At step 432, the pod base receiver 34 is tilted to prepare the cassette to prepare to reunite the pod cover 8 and the pod base 4. The pod cover 8 is then lowered to close the pod 2 at step 434.

Continuing with FIGS. 13A and 13B, at decision diamond 436 a check is made for missing wafers and any misaligned wafers. If an error is detected, an error handling procedure is initiated. In one embodiment, error handling may involve attendant action. In an alternate embodiment, a software routine may be initiated to realign the wafers.

At step 438 the pod 2 is closed by latching the pod base 4 to the pod cover 8. The tool 22 then signals to the interface apparatus 20 that the pod 2 is ready to be removed at step 440. If there is a next tool at decision diamond 442, the method returns to step 404 where the pod is placed into the interface apparatus 20 of the next tool. As will be appreciated, the general flow outlined above may be repeated (as illustrated or with alterations) in order to further or complete the manufacture of the semiconductor, liquid crystal or other display devices or other articles, etc.

Communication

In an alternate embodiment, the controller communicates with the manufacturing system, providing information as to correct placement of articles within a carrier, completion of seating procedure, as well as other information. The manufacturing system uses this information to continue further processing of the articles, and also to initiate corrective measures when a problem is detected.

In one type of manufacturing system, containers are transported by way of a track arrangement placed above the processing tools. This type of system carries the containers from one tool to the next and places the pods onto the interface apparatus. In such a system, communication between each tool and a central controller is necessary to maintain smooth operation.

Alternate Size Wafers

In one embodiment of the present invention, pod base receiver 34 includes an adjustment unit for accommodating smaller size wafers. The adjustment unit is placed within the base plate and allows placement of the smaller wafers on the base plate. In a SMIF type system, the center of the cassette must line up with the latching slots of the pod. Smaller wafers are then processed using the same manufacturing system.

Indexing

According to one embodiment of the present invention, a mechanism for indexing the wafers is provided within the interface apparatus. Indexing by the interface apparatus allows the robotic arm, or other wafer extraction mechanism, provided within the processing tool to be held at a constant position with respect to the interface apparatus. The interface apparatus moves the wafers to position them for extraction. In such a system, as the robotic arm moves to accept the wafer, the cassette is moved to position the wafer on the robotic arm.

Indexing may be done by use of a stepper motor to incrementally raise or lower the cassette. A sensor detects wafers within the cassette, and signals the interface apparatus and process tool accordingly. By configuring the sensing and indexing within the interface apparatus, the motion of the tool is greatly reduced.

Wafer Mapping

In one embodiment, a mechanism for mapping the wafers is provided within the interface apparatus. Wafer mapping is used to detect empty slots in the cassette as well as misaligned wafers. By placing sensors (e.g., a photo emitter and photo receiver) to detect such conditions, the interface apparatus is able to initiate an error handling routine, such as a warning to a human attendant, or a software method of realigning the wafers. This type of information is easily stored in a storage unit within the interface apparatus, or in a storage unit attached to the cassette or pod.

In a preferred embodiment of the interface apparatus of FIG. 3, a the pod cover in raised, a sensor passes in front of the opened side of the cassette holding semiconductor wafers. The sensor is a through beam infrared sensor which is tripped as it passes a wafer. A wafer map receiver 75 is located in the front guide 44 for receiving the beam, and a wafer map light source 77 is provided on an opposite side of moveable plate 40 to supply the beam for sensing the wafers. The wafer map receiver 75 and the wafer map light source 77 are electrically coupled to a main controller, so that the receiver 75 is coordinated with the light source 77. When all wafers are correctly positioned within the cassette, the light beam is interrupted at the predetermined positions. If a wafer is missing from a rack, the light beam is received by receiver 75 at that position indicating the miss. Similarly, multiple wafers may be detected within one rack position if receiver 75 does not detect the light beam within sufficient time. A central controller in the interface apparatus is programmed with the location of each wafer in the cassette, the dimensions of each wafer, and the spacing between wafer racks. Each wafer location of the cassette is identified, and may be indicated within a range of positions. The location of each wafer is then catalogued and the location of missing wafers are determined. The location of each wafer may be set in the controller during a TEACH mode. In this way, as the pod cover is separated from the pod base, the sensor passes in front of the wafers and makes a measurement at each expected wafer location.

Figure 19:
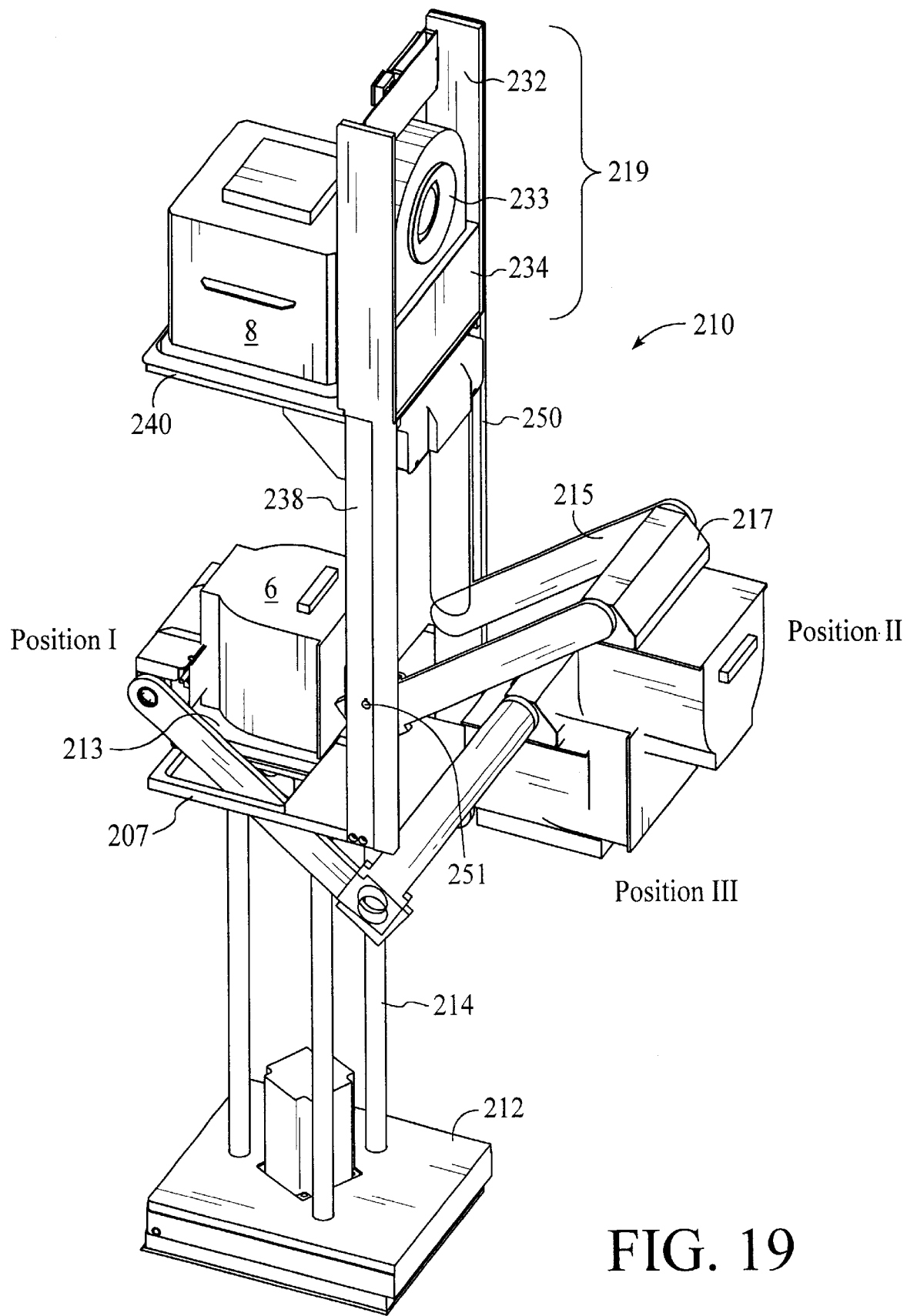
FIG. 19 illustrates three positional views of an interface apparatus according to one embodiment of the present invention.

In a preferred embodiment of the interface apparatus of FIG. 19, the check for missing wafers is performed as the cassette is gripped. In this way, the gripper passes in front of the open side of the wafer cassette checking each predetermined wafer location. The measurement, or sensed event, is then passed digitally to the controller, where missing wafer locations are determined. Sensors may be implemented positionally on a moveable plate 240, illustrated in FIG. 19, or on moveable plate 40, illustrated in FIG. 14A. In one embodiment, illustrated in FIG. 19, at least one sensor source is located within the grip mechanism 217.

Note that additionally, a preferred embodiment senses multiple wafers in a single wafer location, and also checks for wafers which are not correctly positioned within the cassette rack.

Wafer mapping provides an efficient means to save wasted processing steps. Further, wafer mapping provides information used in fabrication forecasting and planning. The electronic controls placed with the guard pieces on the movable plate of the interface apparatus can be used for controlling the interface apparatus and the tool in accessing only those slots of the cassette in which wafers sit.

According to an alternate embodiment of the present invention, the sensors provided within the interface apparatus are used to determine a wafer alignment. This function is typically called a "flat finder," where each wafer has a flat portion which is used to align or orient the wafer for placement in the tool. The flat finder determines where the flat portion of the wafer is and determines the necessary operation to position the flat portion in correct position. The corrective operation may involve further rotation of the base plate, or may involve a tilt of the cassette.

As illustrated in FIGS. 4 and 5B, a wafer flat receiver is positioned to sense a light beam supplied by a wafer flat light source 84. The light source 84 directs the light beam toward receiver 76. When the light beam is received by receiver 76, the flat is correctly positioned. When the light beam is interrupted, the flat is not correctly positioned and the wafer intercepts the light beam. A key consideration in placement of the light sources 77 and 84 and of the receivers 75 and 76 is the position of the cassette. It is desirable for the light beam to avoid the cassette, as the cassette may intercept the light beam, causing incorrect sensing.

Further illustrated in FIG. 5B is the wafer protrusion light source 86 and wafer protrusion receiver 85. In a similar manner, the light source 86 provides a light beam which is received by receiver 85. Any interruptions in the light beam indicates a protruding wafer. Note that alternate methods of sensing these conditions may be implemented, and the light sources and receivers illustrated are provided as exemplars.

Infra Red Sensors

In one embodiment of the present invention, the sensors described hereinabove include infra red sensors. Unlike class I lasers, infra red sensors do not require the protection associated with laser sensors. The infra red sensors provide a safe, effective means of sensing in the manufacturing environment. A photo emitter and a photo receiver preferably are provided in a manner to detect the presence, location and/or position of the wafers or articles. In preferred embodiments, the photo emitter and photo receiver preferably are an infrared (IR) transmitter and sensor which are preferable from a safety standpoint, etc., or alternatively may be a laser and a sensor wherein the emitter and receiver determine a position of the article, whether an article is present in a particular location or whether an article is protruding or mispositioned such as for wafer mapping. In one embodiment fiber optic cables are used to transport the light information to the infra red light beam sources. In an alternate embodiment, the digital information may be transmitted via fiber optic cables. In alternate embodiments, delivery of the light energy from a remote location is accomplished by use of fiber optic cable, where the light is delivered to a sensing location. This allows provision of a variety of light sources, where the light source may be contained within the interface apparatus or may be external to the interface apparatus. Provision of light energy via the fiber optic cable reduces energy loss due to transmission, and reduces the size and weight requirements of providing light energy for use by sensors.

Software

According to one embodiment of the present invention, the interface apparatus includes a software control program which interfaces with the processing tool, and may be used to communicate wafer information, pod information, processing information, as well as any other information helpful in the processing of the wafers. A supervisory type program is included which is factory programmed into the interface apparatus. The supervisory program provides information specific to the interface apparatus, such as communication protocol, and memory size, and such as movement control information, such as angle of rotation, and tilt speed. In one embodiment, a user programmable software program is included which allows a user to customize the interface apparatus to a specific system. For example, a user may want to tilt the wafers to seat them, and then return the pod to its horizontal position prior to rotating the base plate. Still another user may require no rotation. Additionally, the software control program includes a manufacturing system program which controls communication with the tool, the pod, and the manufacturing environment.

Software may also be provided as firmware within the controller, which allows user selection of monitors. The software receives control and status information from within the interface apparatus. Current measurements are converted to digital information and supplied to the controller. The controller then makes a software based decision as to next operation based on this information. For example, where electrical current measurements are provided as digital information relating to the various motors, the controller may decide to reduce the power to other portions of the interface apparatus or may decide to reduce the frequency of an output signal or adjust the motor control. Additionally, the user may determine which monitors are desired and which are not necessary. The user may further select decisions for future use by the controller, instructing the controller how to react to various conditions. Note that a smoke detector may be provided within the interface apparatus, which will signal the controller to take appropriate action. Where a fan is used with the interface apparatus, the controller may be programmed to terminate the fan in response to a smoke alarm signal. Software offers much flexibility using the sensors and controls available within the interface apparatus. Particularly in the embodiment illustrated in FIG. 19, where linear movement is effected by a combination of z-axis motion, possible via the robotic arms 215, and the vertical motion of the structure 250. In this case, multiple sensors may coordinate to produce a multidirectional indication of the position of the structure 250 and the robotic arms 215.

A cleanliness detector is included in one embodiment, where a particle counter is used to detect the number of particles contained in an air sample. This information is then processed by the controller to determine if the mini-environment has been compromised. Additionally, a chemical filter will allow testing for trace chemical content in the air inside the extended mini-environment. These checks may be performed prior to placing the cassette within the tool, and thereby maintaining the clean environment within the tool to the extent possible.

In one embodiment, hazard sensors are provided which include such sensors as an accelerometer for detection of movement, such as seismic disturbance. In such a case it is desirable to understand the type of motion as well as the speed and acceleration. If horizontal movement is detected, a signal may be provided to the controller which initiates seating of wafers in the cassette by a tilt movement or movement of the robotic arms. One type motion sensor incorporates an electronic gyroscope, where it is possible to detect movement of the wafers sufficient to displace them making processing impossible. In such cases, the controller may take a precautionary approach and terminate further operation of the interface apparatus allowing human interface to check the physical situation.

In an automated manufacturing-environment, often robots are used to move pods from one stage to the next. Here a manufacturing controller monitors and controls the operation of all components of the manufacturing system. The communication in an automated system may be wireless, as in a system using radio frequency (RF) tagging, digital, or some other form of communication. The main controller monitors each component in the system comparing each operation against a master plan. As the pods continue through the process, information about their progress is communicated to the main controller. This information may be used as feedback in supervising the manufacturing system. Queuing information can be obtained by monitoring the wait time for each pod at each processing tool. Queuing information is used for future planning and to optimize use of the components of the manufacturing system.

The controller of one interface apparatus may communicate urgent information to the main controller, such as smoke alarm or other hazard information, allowing the main controller to make decisions for the manufacturing environment as a whole. For example, in response to a detection of smoke, the main controller may be programmed to effect a predetermined plan with respect to the manufacturing environment, including other tools. In the case of a chemical detection or an excessive particle count, the main controller may first effect a predetermined plan with respect to the interface apparatus that detected the particles without involving other components in the manufacturing environment. Smoke detection is critical in semiconductor manufacturing environments, as fans mounted onto devices, such as the interface apparatus, may pull smoke into the tool creating a more hazardous condition.

According to one embodiment of the present invention, a software control program is provided for control of the interface apparatus 20. The process flow for the control program is illustrated in the flow diagram of FIGS. 16A, 16B, and 16C. Here processing starts with power on at step

500. Self tests are run to verify operation of the interface apparatus 20 at step 502. Self tests include basic communication verification, as well as other functional checks on the interface. At this point, where the interface apparatus 20 communicates with the tool 22, initial information is transferred to verify connections. Any error at this point may be detected in a variety of ways. For example, in one embodiment the display contained in front guide 44 is enabled, and an error message displayed. In an alternate embodiment, a signal is flashed by way of a light display.

Once self tests are satisfied, the display is enabled at step 504. A timer is started at step 506, where the timer may be programmed to consume an initial start up time. At decision diamond 508, interface apparatus 20 waits for an instruction. The instruction may be entered by the attendant by way of a menu, or screen data entry. Alternately, the instruction may be received from a main controller or some other component within the manufacturing environment. When the instruction is received, processing continues to decision diamond 543, illustrated in FIG. 16C.

If no instruction is received, it is determined if the timer has expired at decision diamond 510. If the timer has not expired, processing returns to decision diamond 508 to await an instruction. Once the timer expires, processing continues to decision diamond 512 to determine if the system is ready. If the system is not ready at this point, processing returns to step 506 where the timer is initiated again. If the system is ready at decision diamond 512, processing continues to step 514, where the auto process is initiated.

If a pod is sensed at decision diamond 516, processing continues to step 518 to unlock the pod. Unlocking the pod prepares the pod to be opened, i.e. the cover to be removed. At step 520 the cover is lifted off of the pod. This involves raising the movable plate 40 to separate pod base 4 from pod cover 8. In this process, the bellows 80 are lifted with the movable plate 40 creating the extended mini-environment. At this point the wafers are exposed, and are ready for presentation to the tool. The movement of the pod base receiver 34 moves the wafers, as the pod base 4, and the cassette 6 move along with the pod base receiver 34. At step 522 the pod is tilted for travel in presentation to the tool. The tilt may be to a predetermined tilt position, or a sensor may determine when optimum tilt is reached. In the later case, information is fed back to the software control program, which then determines whether to continue tilting or to stop.

At step 524 the pod is moved toward the tool for presentation to the tool. At step 526 the pod is tilted into a position for processing. Process flow is further illustrated in FIG. 16B, where at step 528 the pod is rotated from a "home" position, where the home position is the position of the base plate 32 prior to any movement. It is in the home position, the pod 2 is received by and also removed from the interface apparatus 20. The rotation of the pod 2 from the home position allows the pod to accommodate the position of the extraction means within the tool 22. Often the extraction means is a robotic mechanical arm, which is positioned to reach into the cassette and extract the wafers individually for processing, and after processing the arm returns the wafer to the cassette. One arm may service multiple entry ports for one tool 22. In this way, the orientation of the pod may need to be adjusted depending on the position of the arm. Such rotational movement adds to the flexibility of the processing system. Once the pod is rotated, the wafers are then processed at step 530.

Once a wafer is processed, the pod is rotated to the home position. The home position refers to the orientation of the base plate within the rotational plane. In the present embodiment, the rotational plane is a horizontal plane. Alternate embodiments may have a home position which is dependent on a particular configuration, such as where the wafers are positioned on an angle, or where the wafers are vertically placed. The use of the terms vertical and horizontal is for clarity and ease of understanding, and is not meant to limit the present invention to a specific orientation. The combination of the rotational and tilting mechanisms is meant to accommodate multiple freedoms of movement, which may be accomplished by tilting the wafers for travel and rotating the wafers to meet the tool. In a software control program including feedback locational information regarding the tool and the pod, it is possible to optimize such movement by other combinations of tilt and rotate. Still alternate embodiments may combine these movements into a single control. After processing, the pod is rotated back to its home position at step 532.

At step 534, the pod is tilted for travel away from tool 22, and then the pod is moved away from the tool 22 at step 536. The pod is then tilted to its home position to prepare for removal of the pod at step 538. Again, the home position is the tilt position for acceptance and removal of the pod. The pod is then locked at step 540, and the interface apparatus 40 provides a signal that processing is completed for the wafers in that pod and the pod is ready for removal at step 542. The interface apparatus 20 operation then stops to await the next pod. Note that at least one sensor indicates the home position in multiple directions.

Figure 16A:
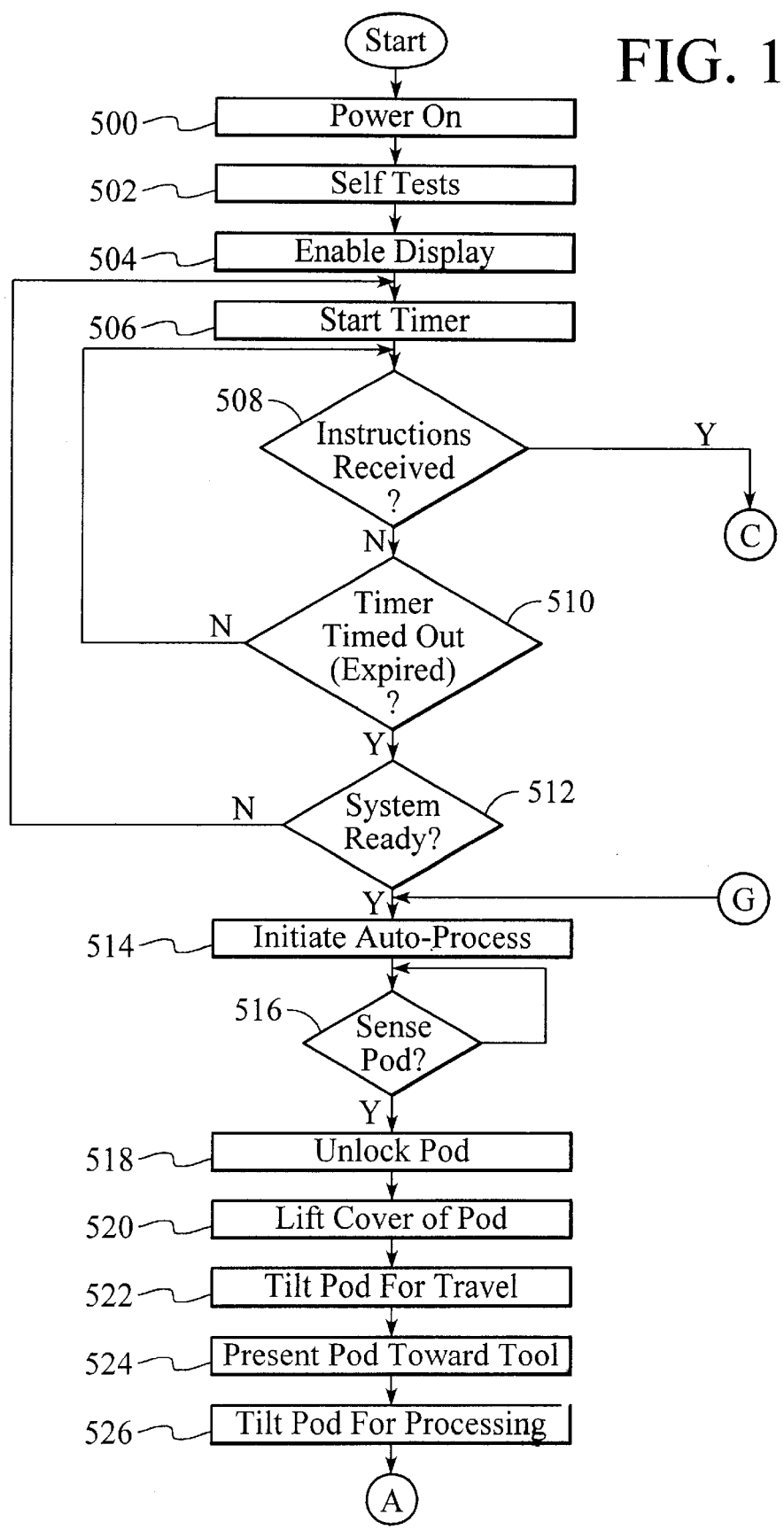
FIGS. 16A, 16B, and 16C illustrate, in flow diagram form, the software control program for controlling operation of an interface apparatus according to one embodiment of the present invention.
Figure 16B:
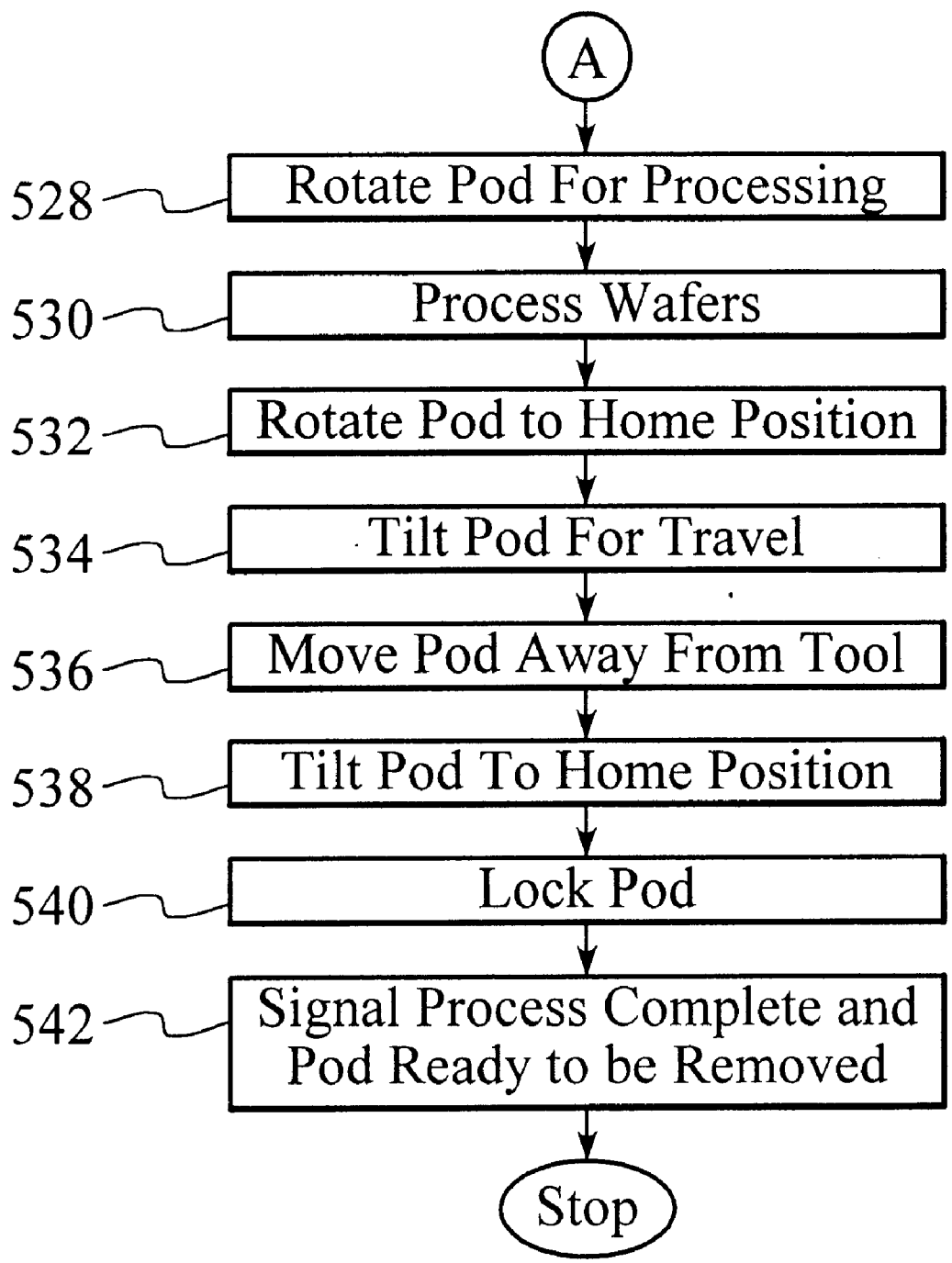
Figure 16C:
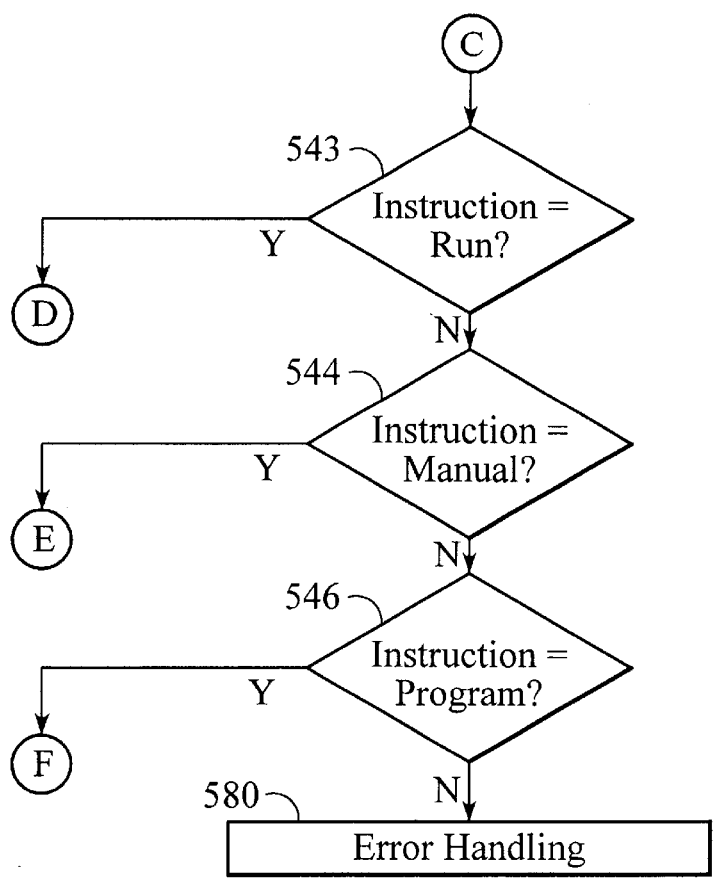
Figure 16C:
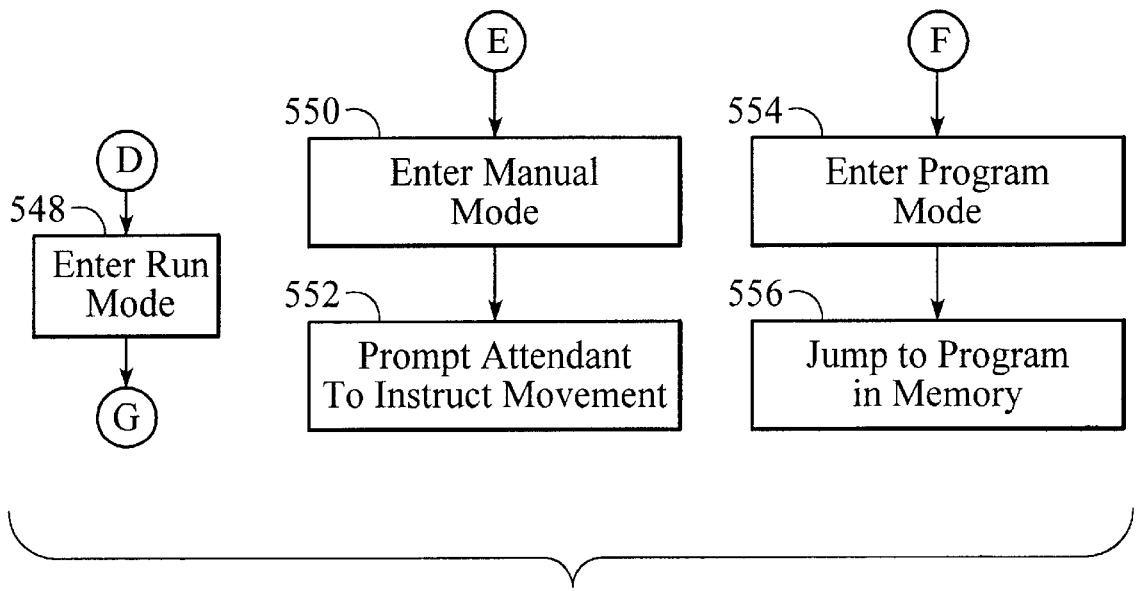

Referring to FIG. 16C, when the instruction is received at decision diamond 508 of FIG. 16A, processing continues to decision diamond 543. If the instruction is to RUN, processing continues to step 548, where RUN mode is entered. RUN mode indicates automated operation of the interface apparatus 20. There is no need for further attendant interaction or input at this point. If the instruction is not RUN, processing continues to decision diamond 544. Here, if the instruction is MANUAL, processing continues to step 550 to enter MANUAL mode. This mode requires the attendant to walk the interface apparatus 20 through each step. An interactive display provided on front guard 44 allows the attendant to enter commands, and also provides an indication of which steps have been taken. For example, the attendant may specify the angle of tilt, the speed of forward movement, the angle of rotation, etc. This is done at step 552, where the attendant is first prompted to instruct movement.

If the MANUAL instruction is not received at decision diamond 544, processing continues to decision diamond 546. If the PROGRAM instruction is received at decision diamond 546, processing continues to step 554 where PROGRAM mode is entered. The PROGRAM mode allows an external program or an internally loaded program to control the interface apparatus 20. At step 556 the control jumps to a subroutine or program stored in memory. If the PROGRAM instruction is not received at decision diamond 546, processing jumps to step 580 for error handling.

In this way, the software control program allows multiple modes of operation, including an automated operation, where all of the movements of the interface apparatus 20 are preprogrammed. The present embodiment is flexible to allow a human attendant to step the interface apparatus 20 through the steps necessary to process wafers, allowing a smart debug and configure operation. Error handling may be automated, or may allow a human attendant to correct the situation with the help of displayed information and help screens.

According to one embodiment of the present invention, after power up, the system initializes and provides an initial display. After a predetermined delay, the display indicates that the interface apparatus is in RUN mode. A mode button is provided on front guide 44, where holding the button down causes the display to cycle through the mode options. After a first predetermined timer period, the display will chance to TEACH mode. During TEACH mode, the operator teaches the interface apparatus the settings desired for interfacing with a particular tool. These include but are not limited to rotation angle, slide speed, as well as other dimensional and functional settings. Once the interface tool has been taught these settings, the interface apparatus can enter RUN mode. According to one embodiment, TEACH mode begins by prompting the user to enter all of the control information for a first motor. This includes selecting the type of motor, the current requirements of the motor, the range of positions for the motor, etc. After all of the information is entered, the controller configures the motors accordingly, and is ready to run. Some of the settings available during TEACH mode include the current position of the motor, or of the control piece which the motor controls, the end position, the home position offset, the speed of movement, the acceleration of movement, etc. Note that the first time the interface apparatus is used with a tool, it is desirable to run the TEACH mode. Alternate embodiments of the present invention, may incorporate an automated TEACH function.

If the mode button is held down for a second predetermined period of time, after displaying TEACH mode, the display will display DIAGNOSTIC mode. This allows the user to debug problems in operation of the interface apparatus.

DIAGNOSTIC mode provides a series of selectable, automated tests. For example, the DIAGNOSTIC may test the switches, the EEPROM, the ports, the analog inputs, the LED, etc. The display indicates the pass/fail status of each test, and also provides guidance on failures. For parametric tests, the display provides a measurement value of range, giving the user an indication of impending maintenance events. According to one embodiment, the DIAGNOSTIC mode provides an indication of the condition of components within the interface apparatus, such as the condition of motors, and the need for upcoming repairs, etc.

Command Set

Each processing tool has an associated command set, which provides instructions for operation of the tool. The interface apparatus is adapted to use the command set of the tool to interface with the tool. According to one embodiment of the present invention, the interface apparatus includes a control means for expanding the command set of the tool. This is accomplished in software, by providing subroutines for interface with the tool. In this way, the interface apparatus provides a smart control for even a tool having a basic command set. This may be done by means of a conversion program, or the interface apparatus may have user selectable modes of operation, each having a distinct command set. The command set associated with each mode is then used to control the interface apparatus.

ESD Control

In general, the purpose of cleanroom production is to filter out contaminants from the manufacturing process. Cleanroom maintenance is not a trivial concern, as it involves constant monitoring of a manufacturing environment, where movement and processing often introduce contaminants. Further, the human attendant must be diligent in preventing their own movement and activity from effecting the product. As the size of the product decreases, the amount of particles that may contaminate the process increases, and therefore maintaining the integrity of the cleanroom becomes increasingly difficult.

Other considerations of cleanroom production involve the article of manufacture. Each cleanroom environment then has its own requirements and specification. Sub-micron filtration, chemical filtration, inert gas purge, temperature control, humidity control, and anti-static ionization are a few of the processes being developed for use in cleanrooms. Each of these processes produce specific effects on the article of manufacture. These effects must be addressed to prevent defects and maximize yield.

With respect to the semiconductor fabrication process, some typical contaminants include particulate matter and trace chemicals. For example, oxygen and other oxidizing chemicals are particularly hazardous to reactive surfaces. It is very difficult to remove all contaminants from the manufacturing environment, where static electricity tends to attract contaminants. Particulate matter and other contaminants can damage semiconductor circuits, particularly circuits having sub-micron geometry. In a worst case, the resultant circuits malfunction or are inoperable. Therefore, control of this static electricity, referred to as electro-static discharge (ESD) control, is a key consideration in the manufacture of such articles as semiconductor wafers.

In one embodiment of the present invention, ESD control is accomplished by providing a sweep of nitrogen gas throughout the extended mini-environment created by the combination of processing tool, interface apparatus, and container. As illustrated in FIG. 2, once the pod 2 has been accepted by the interface apparatus 20, and the pod cover 8 has been removed from the pod base 4, the bellows 80 covers the cassette 6. At this point, an extended mini-environment is formed by the pod 2, the interface apparatus 20, and the tool 22. In preferred embodiments, nitrogen is injected into this extended mini-environment via the interface apparatus 20. The flow of nitrogen provides an inert atmosphere within the extended mini-environment with respect to untreated air. Therefore, the inert atmosphere within the extended mini-environment is more inert that the environment outside the enclosure. In one embodiment, filtered, static-free nitrogen is flowed across each wafer, effectively "dusting" the wafers. The inert mini-environment reduces the amount of contaminants attracted to the wafer, and thus reduces the number of resultant defect. Note that a "point-of-use" filter may be used to filter the nitrogen at the place of injection into the extended mini-environment. A point-of-use filter maximizes the effects of the nitrogen injection, by providing a pure, static-free source of nitrogen.

Robotic Ann Interface Apparatus

One aspect of the present invention provides an automated transfer mechanism for use in a manufacturing environment. The transfer mechanism provides a smooth method of interfacing product containers with processing tools, and allows for improved communication within the manufacturing environment, i.e. between the transfer mechanism, the tool, the container and/or a main controller. In one embodiment, the present invention provides a method of automating the fabrication of semiconductor wafers (or other articles) and increasing the flexibility of the interface between SMIF pods and processing tools.

According to one aspect of the present invention, an interface apparatus for use with a processing tool includes a platform adapted to receive a container placed thereon, a lift mechanism adapted to remove a cover from the container, and a robotic arm adapted to remove a cassette that contains a semiconductor substrate from the container, wherein the robotic arm is coupled to the lift mechanism such that movement of the lift mechanism is used to position the robotic arm proximate to the cassette. In this way, the cassette can be removed from the container and placed within the processing tool. The robotic armn is adaptable to place the container in multiple positions for accommodation to a variety of tools. According to one embodiment, the container sits on a base plate, which is rotatable for alternate configurations, allowing the open side of the cassette to face toward the processing tool or to face away from the processing tool.

According to another aspect of the present invention, an interface apparatus for use with a manufacturing tool, includes a platform adapted to receive a container having a base and a cover, a lift mechanism adapted to remove the cover from the container and a robotic arm adapted to remove an article from the base of the container, wherein the robotic arm is coupled to the lift mechanism such that movement of the lift mechanism is used to position the robotic arm proximate to the article so that the article can be removed from the container and placed within the manufacturing tool.

In one aspect of the present invention, an interface apparatus for use in a manufacturing environment includes a platform adapted to engage a container, a lift mechanism adapted to remove a cover from the container and a robotic arm coupled to the lift mechanism, wherein the robotic arm is positioned by the movement of the lift mechanism in removing the cover. In one embodiment, the interface apparatus further includes an ionization mechanism, coupled to the robotic arm, where the ionization mechanisnmass passes an open side of the container as the robotic arm is positioned to grip the container. An alignment sensor coupled to the robotic arms detects misaligned articles within the container, such as semiconductor wafers in a cassette.

According to one aspect of the present invention, a robotic arm includes a gripping mechanism, an ionization mechanism coupled to the gripping mechanism, and a first elongated member having a first end and a second end, wherein the first end of the first elongated member is pivotally attached to one end of the gripping mechanism.

In another aspect of the present invention, a method for manufacturing integrated circuits (or other articles), includes thee step of providing an interface apparatus coupled to a processing tool and placing a container onto the interface apparatus. The interface apparatus includes a robotic arm and a lifting mechanism, wherein the robotic arm is coupled to the lifting mechanism. The container includes a cover and a cassette for storing at least one semiconductor substrate. The method further includes the steps of removing the cover from the container using the lift mechanism, positioning the robotic arm to grip the cassette, wherein movement of the lift mechanism is used to position the robotic arm, gripping the cassette with the robotic arm, using the robotic arm to place the cassette within the processing tool, and processing the at least one semiconductor substrate. The movement of the lifting mechanism is used to position the robotic arm and place the cassette within the processing tool.

The process uses robotic arms to expose the at least one semiconductor substrate to an inert gas, such as nitrogen or ionized nitrogen. Processing of the at least one semiconductor substrate is further characterized by depositing a layer of material on the semiconductor substrate in a nitrogen environment.

While the present invention is applicable to a variety of manufacturing environments, one embodiment is applicable to the transfer of a wafer cassette container used for transporting semiconductor wafers and is provided herein as an exemplar. Note that various refinements and substitutions of the detailed embodiments are possible based on the principles and teachings herein.

Figure 20:
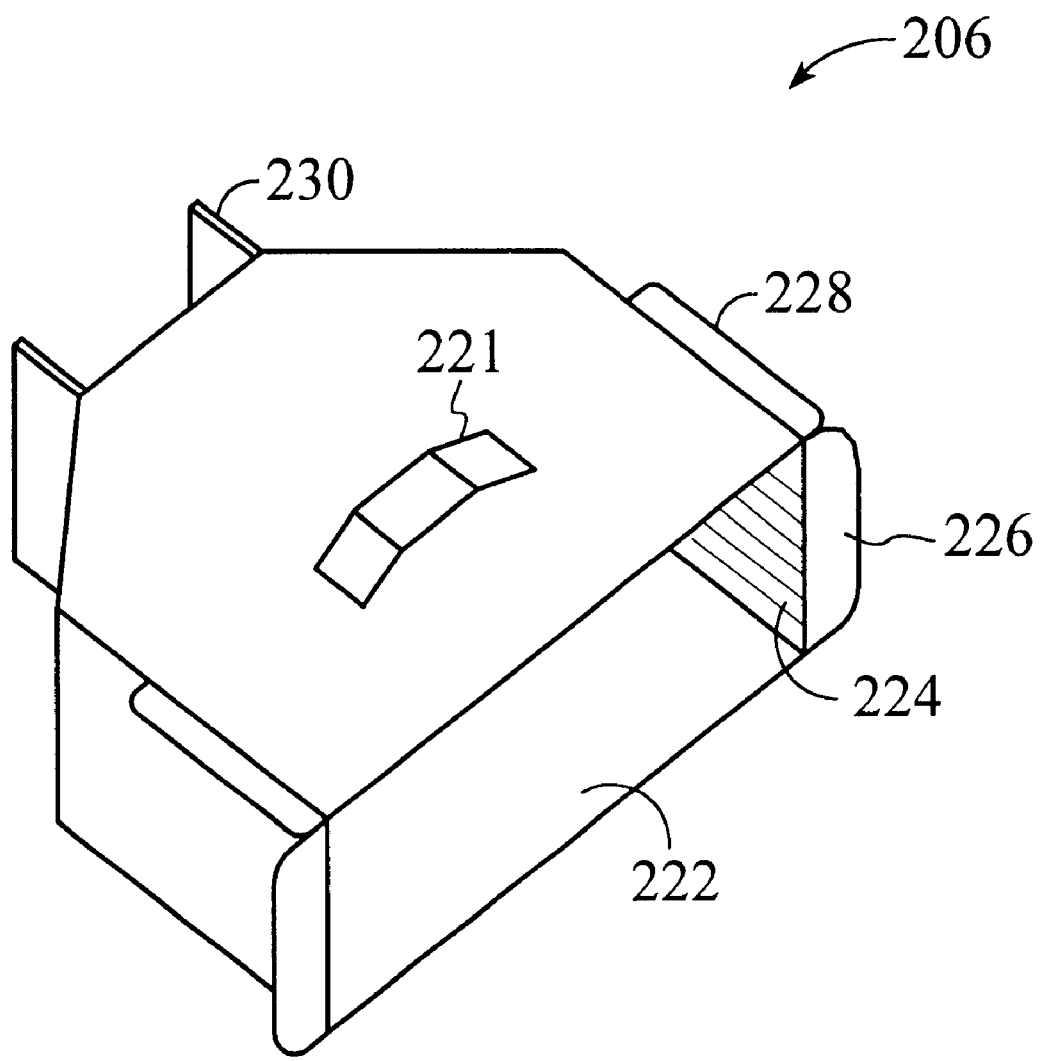
FIG. 20 illustrates a wafer container according to one embodiment of the present invention.

FIG. 20 illustrates the container for transporting wafers as a wafer cassette 6 having an opening 222 from which wafers are inserted and extracted. The wafer cassette 6 is lined with wafer racks 224 for storing wafers. On each side of opening 222 are front protruding rims 226. On each side of wafer cassette 6 are top protruding rims 228. The top and front rims are conventionally used for handling and placing the cassette 6 by a human attendant, but may also be used by an automated system in manipulating the cassette 6. The top of wafer cassette 6 includes a handle 221 which is also used for handling and positioning the wafer cassette 6. Back fins 230 are placed at the enclosed end of wafer cassette 6. The back fins 230 provide support for seating wafer cassette 6 when the opening of wafer cassette 6 faces upward. The wafer cassette 6 has a unique shape, and an interface apparatus is required to accommodate that shape.

In a manufacturing system for fabricating semiconductor wafers known as a Standard Mechanical InterFace (SMIF) system, the wafer cassette is surrounded by a pod cover. As illustrated in FIG. 1B, a conventional SMIF pod generally includes a pod base 4, cassette 6, and pod cover 8. In this configuration, pod base 4 is located on the bottom of pod 2 to allow the pod cover 8 to be raised exposing the wafers. One advantage of pod 2 is that when pod cover 8 is raised vertically to open the pod 2, the pod cover 8 continues to protect the wafers as an umbrella after the pod cover 8 is separated from the pod base 4.

The pod base 4 is illustrated in the opened position in FIG. 1B, and is closed by reuniting the pod cover 8 with the pod base 4. A closed pod is illustrated in FIG. 1A. It should be noted that although FIG. 1B illustrates a typical SMIF pod, other designs and configurations of a container may be utilized in accordance with the present invention and that the present invention is not limited to the design of SMIF pod 2 of FIG. 1B.

As illustrated in FIG. 1B, the pod base 4 includes at least two latching slots 10, which are actuated by a SEMI-standard mechanism to latch and unlatch pod 2 for further interface with the processing tool. The latch mechanism couples the pod cover 8 to the pod base 4. When unlatched, the pod cover 8 and the pod base 4 are separated and the pod 2 is open. The connection to the interface apparatus, as well as the interface apparatus itself will be discussed in further detail hereinbelow. Cassette 6 is adapted for holding semiconductor wafers and sits on pod base 4. Pod base 4 includes alignment pins for positioning cassette 6 within the pod 2. The position of the alignment pins is specified by the SEMI standard.

In one embodiment, pod cover 8 may be made of a transparent material, such as polycarbonate, to allow sensing of wafers within cassette 6. Conversely, in an alternate embodiment, pod cover 8 may be made of an opaque material to prevent light from entering the pod 2. Pod cover 8 further includes bottom edge 16, which contacts with pod base 4 when the pod cover 8 is closed, providing an air tight fit. When the pod cover 8 is open, as illustrated in FIG. 1B, the pod base 4 is separated from the pod cover 8 to allow access to the wafers 14. The use of a SMIF pod places restrictions on the pod-tool interface design, as the SEMI standard includes specifications relating to structural dimensions, coupling configuration and interface, latching mechanism, as well as the placement of the pod for interface with the tool. The interface apparatus of one embodiment satisfies the specifics of the SEMI standard.

The pod 2 illustrated in FIG. 1B is an exemplar of a container for transporting articles of manufacture where the container includes a cover for maintaining a clean environment within the container. Other design containers may be used to transport articles of manufacture applicable to the interface apparatus and method of the present invention. SMIF type pod 2 and cassette 6 are provided for clarity as an exemplar. Note also that alternate designs may include any other type cassette or internal container or article holder. Additionally, articles of manufacture may be placed directly onto a pod base 4 or otherwise placed within pod 2 without the use of a cassette 6 or article holder. In this way, the interface apparatus and method of the present invention is applicable to a variety of articles of manufacture requiring clean mini-environment manufacturing.

FIG. 19 illustrates an interface apparatus 210, used to interface with a processing tool. Interface apparatus 210 is adapted for handling SMIF pods, such as pod 2 of FIG. 1B, in a semiconductor manufacturing environment. The processing tool may include its own wafer handling arm, such as a robotic device, for transferring wafers from a SMIF pod via interface apparatus 210 to a processing device within the tool. Note that according to the present embodiment, interface apparatus 210 in FIG. 19 is placed outside the enclosure or canopy enclosing the processing tool, and the SMIF pod 2 is placed onto the interface apparatus 210. When the pod 2 is open, a plate or enclosure covers the open cassette of wafers, forming an extended mini-environment. Alternate embodiments involving different type manufacturing systems, containers, and tools, may require alternate configurations.

As illustrated in. FIG. 19, an interface apparatus 210 is used to interface between the SMIF pod 2 and a processing tool (not shown). In a manufacturing environment incorporating mini-environments and SMIF pods, the interface apparatus is designed to be operative with respect to the SMIF pod and the processing tool, without violating a clean mini-environment for processing the wafers.

Interface apparatus 210 preferably includes three shafts 214 mounted on a base 212. The base 212 may be attached to the processing tool or may be positioned adjacent to the tool. In an alternate embodiment, shafts 214 are drive screws or roller screws. As a large portion of weight of the interface apparatus impacts the shafts 214, it is desirable that they be strong and secure. For detached placement, one embodiment incorporates four bolting mechanisms which attach the base 212 to the floor of the manufacturing environment. As placement of the interface apparatus 210 is typically done in a clean room environment, the detached placement allows a quick means of installation. This is desirable, both to maintain the clean environment, and to reduce the fatigue of the installer. Similarly, personnel working inside a clean room are typically required to wear special garb, making mechanical adjustments difficult. According to this embodiment, the interface apparatus 210 is installed smoothly and quickly.

Continuing with FIG. 19, the shafts 214 support pod base receiver 213 and lift structure 250. Pod base receiver 213 accepts the pod base 4, which holds the cassette 6. Lift structure 250 travels along the shafts 214 from an initial position for accepting a closed pod 2 to a second position where the pod cover 8 is separated from the pod base 4. Lift structure 250 has an upper portion and a lower portion which travel together as a unit. In one embodiment this movement is in a vertical direction. Alternate embodiments may require angular positioning due to the requirements of the processing tool. As discussed hereinabove, raising the pod 2 over the cassette 6 adds protection from potential particulates and contaminants falling onto the wafers. The pod 2 is placed into interface apparatus 210 in the initial position. As the pod cover 8 is separated from the pod base 4 the pod base 4 remains in the initial position. The pod cover 8 is moved along with the lift structure 250 to the second position.

The lift structure 250 preferably includes a lower square portion or base frame 207, having a center cutout to allow movement along shafts 214. As illustrated in FIG. 19, when lift structure 250 is in the second-position, this base frame 207 of lift structure 250 is just below the pod base receiver 213, which remains stationary at the initial position. FIG. 19 illustrates the position of the lift structure 250 when the pod is opened. At this point, base frame 207 is positioned just below pod base receiver 213, and moveable plate 240 is positioned above cassette 6. An enclosure is provided between the moveable plate 240 and the base frame 207 which protects the wafers when the pod is opened. This enclosure is not shown in FIG. 19, but may be constructed of a metal sheeting or other material which travels with the lift structure 250. Note that when the lift structure 250 is in its initial position (not shown), this base frame 207 of lift structure 250 is near the bottom of shafts 214, and the moveable plate 240 is positioned near to pod base receiver 213.

According to one embodiment of the present invention, the lift structure 250 moves vertically to raise the pod cover 8 off of the pod base 4. A moveable plate 240 is attached to the lift structure 250. The moveable plate 240 engages the pod cover 8 during movement in the vertical direction. Robotic arms 215 are also coupled to lift structure 250. As lift structure 250 raises vertically, the moveable plate 240 moves away from pod base receiver 213, and robotic arms 215 are positioned for transfer of cassette 6. In this way the mechanical motion of lift structure 250 removes cover 8 from cassette 6, raises robotic arms 215, and raises an enclosure around the open pod 2 forming an extended mini-environment with the processing tool.

Also attached to the lift structure 250 is a control panel 219. The control panel 219 includes a display for indicating the operational status of the interface apparatus 210. The control panel 219 includes push button controls which allow a human attendant to communicate with the interface apparatus 210. According to one embodiment of the present invention, interface apparatus 210 is used within an automated manufacturing environment, and control panel 219 includes an adapter for coupling to an external controller. In this way, electronic control of the interface apparatus is possible. According to one embodiment, interface apparatus 210 is an interactive device, which receives control signals and information from external, processes the received signals and information, effects decisions within the interface apparatus, and provides information externally. In an automated system, any number of types of data may be communicated with the interface apparatus. For example, a central controller responsible for coordinating the manufacturing environment may initiate operation of the interface apparatus, monitor operation of the interface apparatus, and record processing information received from the processing tool via the interface apparatus. In this way, the interface apparatus becomes an integral part of the manufacturing process, facilitating communication among the various elements within the manufacturing environment.

Control panel 219 includes a central controller for controlling various motors within the interface apparatus 210. Control of the various mechanisms described herein is accomplished by this central controller. The controller is located within the control panel 219. The controller preferably is a multi-dimensional controller, which is operated by way of a computer software program. The controller provides both independent and dependent control, and is programmed by the user to implement the combination of functions available within the controller.

Control

Figure 17:
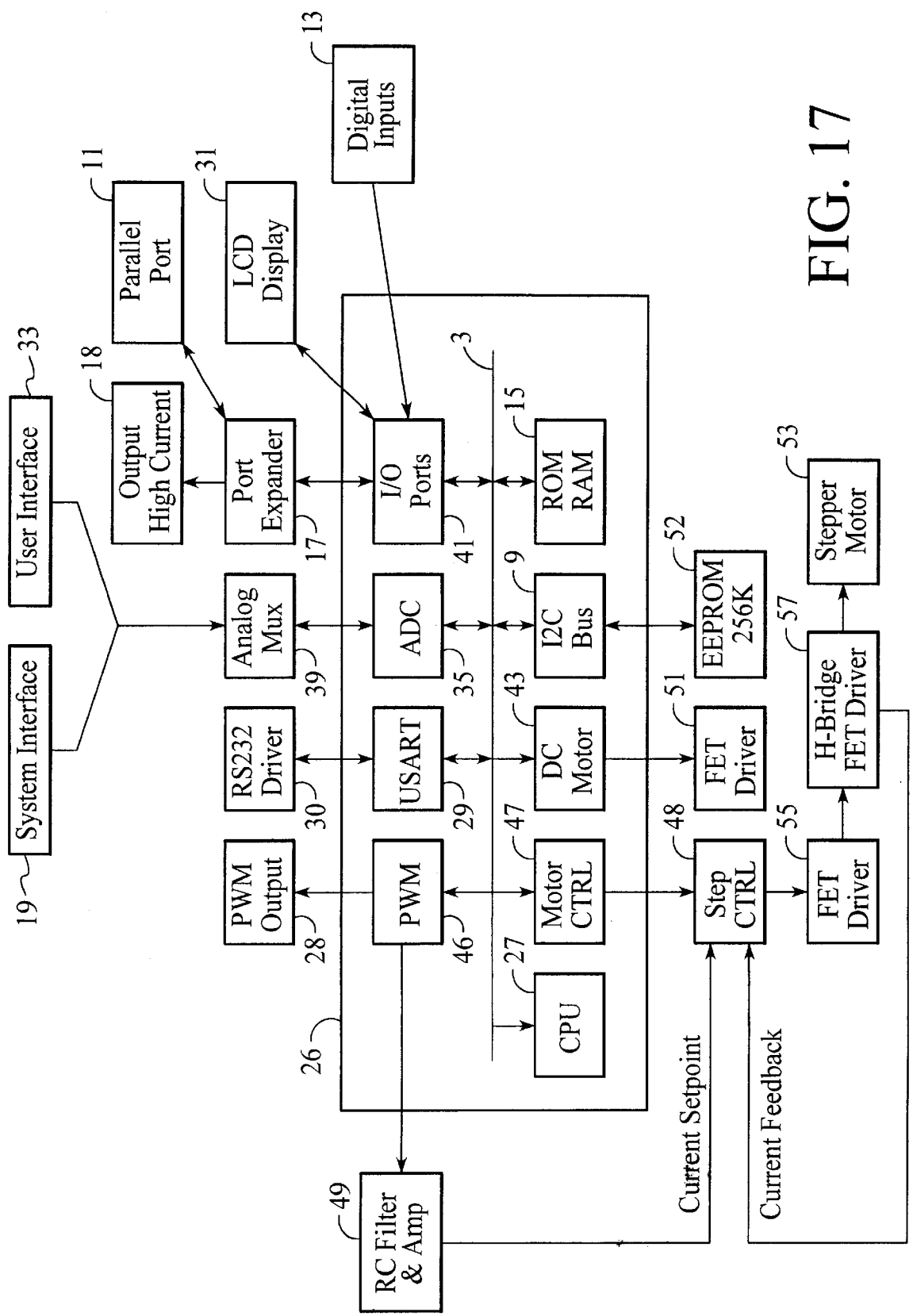
FIG. 17 illustrates a control mechanism according to one embodiment of the present invention.

According to one embodiment illustrated in FIG. 17, the controller controls stepper motors for manipulating the interface apparatus 210 and also interface apparatus 20 for presentation of the wafers to the processing tool. Referring to FIG. 17, controller 26 provides the central control for operation of the interface apparatus 210. The controller 26 may be a microcontroller, or a custom integrated circuit, having a central processing unit (CPU) 27 and various interface modules. The specific modules included for control include analog input and output, digital input and output, serial communication circuitry and/or logic, and user interface units. According to one embodiment illustrated in FIG. 17, controller 26 includes CPU 27 and communication bus 3. Communication bus 3 includes a plurality of conductors for transmission of signals within controller 26 and also signals external to controller 26. Pulse width modulation (PWM) unit 46 is coupled to bus 3; PWM 46 uses a timer to provide output digital signals having a predetermined, programmable, selectable, and/or adjustable duty cycle. The digital output is a PWM periodic signal provided by PWM output unit 28. PWM 46 is coupled to PWM output 28 and is also coupled to an analog conversion unit, RC filter and amplifier 49. Adjustment of the duty cycle in PWM 46 allows provision of an analog output signal.

Controller 26 further includes a serial conversion unit, illustrated as a universal serial asynchronous receiver transmitter (USART) 29, and is capable of translating transistor-transistor logic (TTL) signals for provision to serial RS232 driver 30. USART 29 is coupled to bus 3, and is also coupled to RS232 driver 30 by way of bidirectional conductors. Note that controller 26 can also receive RS232 signals, by way of RS232 driver 30 arid USART 29, which allows communication with a variety of devices.

Controller 26 includes an analog to digital conversion (ADC) unit 35 coupled to the bus 3. ADC unit 35 is adapted to receive analog signals from external to controller 26, such as those provided from analog multiplexer (MUX) 39, and convert those signals into digital signals for further processing. MUX 39 receives analog inputs and selects from among the various analog inputs for transmission to controller 26. MUX control may be provided by controller 26 or may be implemented in response to another signal. For example, a measurement within interface apparatus 210, such as a current measurement, may control which analog input is passed to controller 26. As another example, based on historical information it may be desirable to monitor a particular analog input more frequently. This may be the case where a module within interface apparatus 210 is power sensitive, or where a safety condition is being monitored. MUX 39 is illustrated coupled to receive inputs from system interface 19 and user interface 33. User interface 33 according to one embodiment is a push-button interface, but may be implemented as a touch screen or any other type of interface for inputting information. In an automated environment, controller 26 receives input signals from a central controller, such as from system interface 19, which may receive signals from within the interface apparatus, and may also receive signals from within the manufacturing environment.

Continuing with FIG. 17, controller 26 further includes motor control 47, coupled to bus 3, and further coupled to step control 48.. Motor control 47 provides control information to step control 48. Note that RC filter and amplifier 49 is coupled to both PWM 46 and to step control 48. PWM 46 provides output signals to RC filter and amplifier 49, which are then provided as current control information to step control 48. Note that RC filter and amplifier 49 includes a resistive-capacitive (RC) filter and a signal amplifier. In one embodiment, unit 49 includes a filter and a buffer for receiving the PWM signal from PWM 46 and converting it to an analog signal for step control 48. The current control provided to step control 48 will be detailed further hereinbelow, however, RC filter and amplifier 49 provides the electrical current control information as a reference or set point current to step control 48. This reference is software programmable, and may be adjusted in response to other conditions within the interface apparatus 210.

Controller 26 further provides additional motor control by way of DC motor control 43 and FET driver 51. DC motor control 43 is coupled to bus 3 and provides control signals to FET driver 51, which then provides DC motor control. Typically, DC motor control involves a DC motor driver, a low voltage alternating current (AC) H-bridge driver, and field effect transistor (FET) drivers. DC motor control is accomplished by the use of DC motor control 43 and FET driver 51. FET driver 51 can effectively be used for control of a variety of motors. According to one embodiment of the present invention, FET driver 51 is used to control the motor that will lock and unlock the pod.

In one embodiment, controller 26 provides miscellaneous current outputs (not shown) for driving relays, solenoids, light bulbs, etc. An input/output (I/O) port interface unit, I/O ports 41, is coupled to bus 3 within controller 26. I/O ports 41 is bidirectionally coupled to an LCD display 31, and provides control for proper operation of LCD display 31. LCD display 31 displays information from controller 26 and also from user interface 33. I/O ports 41 is also coupled to a port expander 17. The port expander 17 adds to the flexibility and communication capability of controller 26, and interface apparatus 210 and 20. Port expander 17 is coupled to a high current output unit 18 and a parallel port 11. According to one embodiment, multiple inputs and multiple outputs are optically isolated to shield the controller 26 from electrical noise, spikes, transients, and other harmful electrical events. Digital inputs 13 are also coupled to I/O ports 41, where multiple digital inputs are optically isolated.

Also within controller 26, an $I^2C$ bus 9 is provided for interface with external memories and devices, such as electrically erasable programmable read only memory (EEPROM) 52. The use of an $I^2C$ bus 9 reduces the conductor requirements for accessing memory. Note that alternate configurations may be employed for accessing an external memory. Within controller 26 is a memory 15 including read only memory (ROM) and random access memory (RAM). In an alternate embodiment, an EEPROM is used to add flexibility to controller 26.

As illustrated in FIG. 17, controller 26 has the flexibility to control a variety of motors and systems within the interface apparatus. For example, stepper motor 53 is controlled by controller 26. An H-bridge driver 57 provides control of a two phase stepper motor 53. The central controller within control panel 219 provides control of each motor. The processors may be microcontrollers, having other functions incorporated into the control of the interface apparatus 210.

The control panel 219 illustrated in FIG. 19 and the controller of front guide 44 illustrated in FIG. 3, include an on-the-fly current controller, which controls the current provided to each motor. This allows the user to program and reprogram the controller according to the requirements of the motor used. If, for example, a motor fails and is replaced with a motor having a different current draw, the new current requirements he programmed into the controller, and the controller adjusts the current accordingly. This flexibility facilitates better maintenance of the interface handler, ensuring consistent operation of the apparatus.

As illustrated in FIG. 17, a FET driver 55 and an H-bridge circuit 57 provide control for stepper motor 53. A current from the H-bridge driver circuit 57 is provided as feedback to the step control 48. The feedback current is compared with a reference or set point current supplied by RC filter and amplifier 49. As illustrated in FIG. 17, controller 26 controls operation of both step control 48 and RC filter and amplifier 49. Step control 48 is adjusted based on the comparison of feedback and reference currents. The H-bridge circuit 57 is then coupled to the stepper motor 53. Outputs of the H-bridge circuit 57 are provided to phases within stepper motor 53.

Functionally, the control illustrated in FIG. 17 first receives a step size selection and a direction from controller 26. Step size selection may be full step or half step, and direction may be clockwise or counterclockwise. Step control 48 translates the control signals received from controller 26 and provides steps or pulses, The H-bridge circuit 57 is controlled by FET driver 55, where in response to a digital signal, the H-bridge circuit provides an output over a large voltage range. In one embodiment, the output is in a 15 V to 80 V range.

Figure 18:
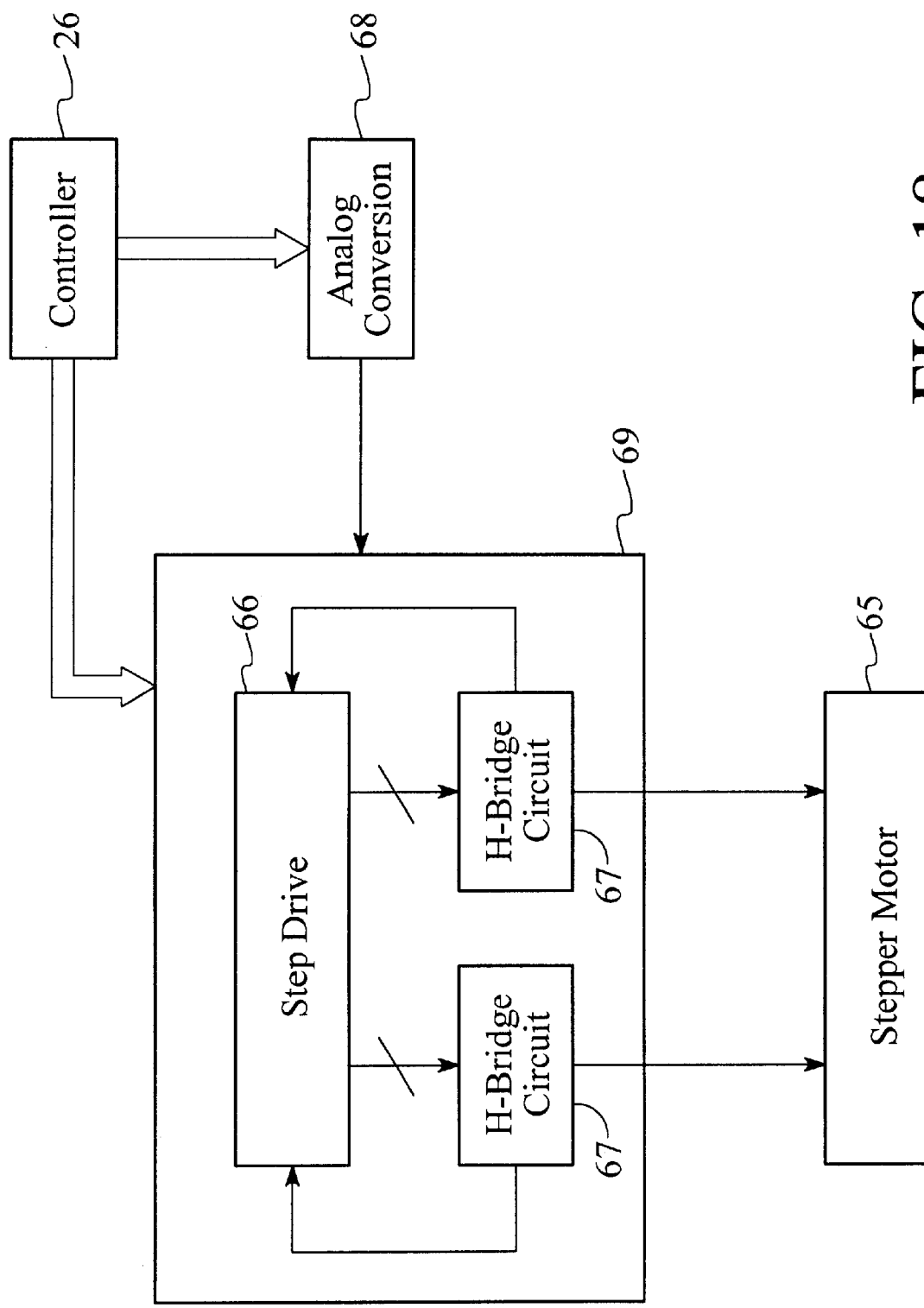
FIG. 18 illustrates a control mechanism according to one-embodiment of the present invention.

According to one embodiment, illustrated in FIG. 18, controller 26 provides control signals to an analog conversion unit 68. Controller 26 also provides control signals to circuit 69, which includes a step drive circuit 66 and two H-bridge circuits 67. Each H-bridge circuit 67 drives one phase of stepper motor 65. Analog conversion unit 68 provides current control information to circuit 69 as feedback in control of the stepper motor 65.

The central controller provides simultaneous control of at least two motors, and independent control of at least one motor. In this way, it is possible to tie control of two dependent motors to one instruction. Additionally, for those motors which function independently of the other motors, the controller provides such specific control.

Firmware in the main controller provides automated control of the motors. It is possible to optimize operation and minimize power consumption of the interface apparatus by the use of such automated control.

Feedback is provided by the way of sensors and measurement devices. Analog-to-digital converters (ADC) are provided with the central controller. This allows for plug-and-play type introduction of specific sensors. For example, temperature and humidity are critical considerations in a semiconductor fabrication process. By placing such sensors into the interface apparatus, the AID converters provide the resultant measurement to the controller in the form of digital data. The firmware is then programmed to control the interface apparatus according to predetermined sets of conditions and responses. Typical measurements include pressure within the pod, pressure within the tool, temperature of the wafer environment, humidity within the mini-environment, etc.

The present invention provides within one central controller of control panel 219 the control of various types of motors, sensor feedback receivers, digital control signals to react to environmental conditions, alternating signal generation for control of AC components, light emitting diode (LED) control to provide status information on the operation of the motors, volatile and nonvolatile memory, as well as a fan output to keep the control mechanism cool. Accordingly, the main controller controls both stepper motors, and DC motors. An analog input is provided for the feedback environmental control loops. Digital input/output (I/O) is provided to send and receive digital control signals. A standard parallel interface is provided for asynchronous control of multiple portions of the interface apparatus. A push button controller allows the user to interface with the main controller directly. An $I^2C$ bus provides uniform, easy programming and communication within the main controller.

Efficient FETs are used to prevent overheating MOSFETs within interface apparatus 210. In this way, the design of the controller itself provides heat resistance.

In one embodiment, also included within control panel 219 is an electrostatic discharge (ESD) control mechanism. This may be a nitrogen sweep mechanism which provides a supply of nitrogen within the extended mini-environment formed by the interface apparatus 210, the opened pod 2 and the processing tool. The nitrogen gas may be contained in a pressurized canister or may be supplied from externally. Additionally, the nitrogen gas may be supplied from the processing tool. Alternate embodiments may use another type of gas which provides ESD control.

The control panel 219 may also include an ionization mechanism for balancing charged ions within the extended mini-environment. An ionization bar may be placed within the control panel, and gas flowed over the ionization bar to flow within the extended mini-environment or within the pod. The gas flow may be supplied from external to the interface apparatus, or may be a canister of gas coupled to the interface apparatus. Additionally, the gas supply may be provided to other portions of interface apparatus by way of tubing.

Additionally, a control is provided for separating the pod base from the pod cover which employs multiple infra red slot type sensors as described herein above. As illustrated in FIG. 19, as structure 250 raises to lift the pod cover 8 to expose wafer cassette 6, two flags located on structure 250 travel through each of the slot type sensors. In one embodiment, a sensor is placed on the pod base receiver 213, and two flags are placed on structure 250. In the initial home, or down, position, one flag blocks the infra red light beam in the slot sensor. As the structure 250 moves upward, the light beam is received by the sensor receiver. When the structure 250 reaches a vertical position sufficient to allow the cassette to be presented to the tool, a second flag positioned lower on structure 250 blocks the light beam in the slot sensor. In response to each interruption to receiving the light beam, the controller terminates the movement of structure 250.

In a similar manner, slot type sensors are placed on supports 50 and flags on moveable plate 40 of apparatus 20 of FIG. 3. As the moveable plate 40 is raised, the flags travel through the sensors and block the light beam at that position. Alternate embodiments may employ any configuration or type of sensors which indicate when the pod cover is in a home position and again when it is in an open position. Note that the controller allows for user programmable parameters regarding the amount of separation necessary for extraction of wafers for a variety of containers.

Gripping Mechanism

Continuing with FIG. 19, a gripper mechanism 217 is positioned between the robotic arms 215. The gripper mechanism 217 pivots with respect to the robotic arms 215 and accommodates multi-dimensional motion. The robotic arms have pivot pins 251 coupled to lift structure 250 to allow effective rotational movement of robotic arms 215. This movement allows the robotic arms 215 to grip the cassette, or the article, and transfer it to the tool.

The gripper mechanism 217 includes an electrostatic discharge (ESD) type protection mechanism. Gripper mechanism 217 is further detailed in FIGS. 21, 22, 24 and 25, where the ESD mechanism according to one embodiment is an ionization bar 242. Referring again to FIG. 19, at the beginning of processing, the pod 2 is first placed into the interface apparatus 210. At this initial point, the lift structure 250 is in a home position, where the base frame 207 of lift structure. 250 is proximate to the base 212. At this time, the moveable plate 240 is proximate to the pod base receiver 213. The pod 2 is placed onto pod base receiver 213 with the support structure in this initial position. Note that a solid cover piece (not shown) covers the lift structure 250 so that when the pod 2 is opened the mini-environment is not compromised but rather is extended to include the processing tool and the interface apparatus 210.

At this initial point, the robotic arms 215 are positioned adjacent to the support structure, along lines running parallel to the shafts 214. Similarly, extension pieces 238 connect the base frame 207 of the lift structure 250 to the moveable plate 240 and control panel. These extension pieces 238 are positioned along lines running parallel to the shafts. The robotic arms 215 are positioned flush with lift structure 250 along the extension pieces 238. In the initial position, the gripper mechanism 217 is situated below moveable plate 240 and control panel 219, between the extension pieces 238. As the pod base 4 is placed in the pod base receiver 213, the moveable plate 240 couples to the cover 8. The interface apparatus 210 then raises the lift structure 250, including the moveable plate 240 and control panel 219, as well as the robotic arms 215. As the pod cover 8 is raised from cassette 6, the robotic arms 215 are free to rotate about pivot pins 251 within lift structure 250. As the robotic arms 215 rotate into position for grabbing cassette 6, gripper mechanism 217 passes in front of the side of cassette 6 from which wafers are to be extracted for processing. Note that some cassettes may have openings on two sides, while others have openings on only one side. Typically wafers are extracted through the larger opening, which may face toward or away from the tool depending on the configuration of the environment and tool.

One embodiment includes a gasket attached to the moveable plate 240 for receiving pod cover 8. The gasket ensures an air tight seal to protect the extended mini-environment while the pod is open. As illustrated in FIG. 19, the gasket follows the squared shape of the moveable plate 240. When the pod is open, the pod cover is coupled to the gasket and the moveable plate 240. The moveable plate 240 is coupled to an enclosure extending at least to the base frame 7.

As illustrated in FIG. 19, when the cassette 6 is in the position indicated as "position I," the opening of cassette 6 is facing away from the processing tool and gripper mechanism 217 passes over the opening as the robotic arms 215 are positioned to grab corners of the cassette 6. As the gripper mechanism 217 passes by the wafers, ESD protection is provided by the ionization means 242, which balances the oppositely charged ions within the extended mini-environment. Alternate embodiments may employ other types of ionization means, where the means is effective by passing over the wafers or by activation within the extended mini-environment.

At this point, gripper mechanism 217 performs wafer alignment using an alignment sensor for finding wafers protruding from the cassette. This information is transmitted back to the control panel 219, where a warning is provided through the display, or may be transmitted digitally for automated correction. Information within the manufacturing environment may be communicated electronically via circuitry coupled to the interface apparatus, or may be provided by infrared or other wireless communication.

During removal of pod cover 8, cassette 6 remains stationary while the lift structure 250 raises the control panel 219, the robotic arms 215 and the gripper mechanism 217. The thafts 214 are sized for accommodation to the, processing tool. In certain manufacturing environments, the dimensions of the processing tool make it difficult for a human attendant to present the cassette for processing. Interface apparatus 210 overcomes this difficulty by adjusting the size of shafts 214 to accommodate the tool.

Apparatus 210 includes an air filtration system within control panel 219. As illustrated in FIG. 19, an air intake 232 is located at the top of apparatus 210. Air first enters the apparatus at the air intake 232 and is their circulated through a filter 234 by fall 233. Both fan 233 and filter 234 are located within control panel 219. The filtered air is then provided from just above the gripper mechanism 217. In this way, a curtain of clean filtered air is provided between the interface apparatus and the processing tool. The filter 234 is considered a point of use filter, and may be adjusted to accommodate a variety of manufacturing environments. In one embodiment, filter 234 provides particulate filtration by way of a particulate filter media, such as polytetrafluoroethylene (PTFE) and also provides chemical filtration. Positioning the fan 233 and filter 234 above the gripper mechanism 217 allows the gripper mechanism 217 to direct and/or deflect the filtered air stream. The gripper mechanism 217 may direct the air stream across the wafers within the interface apparatus 219 or may direct the air stream toward the processing tool.

Figure 21:
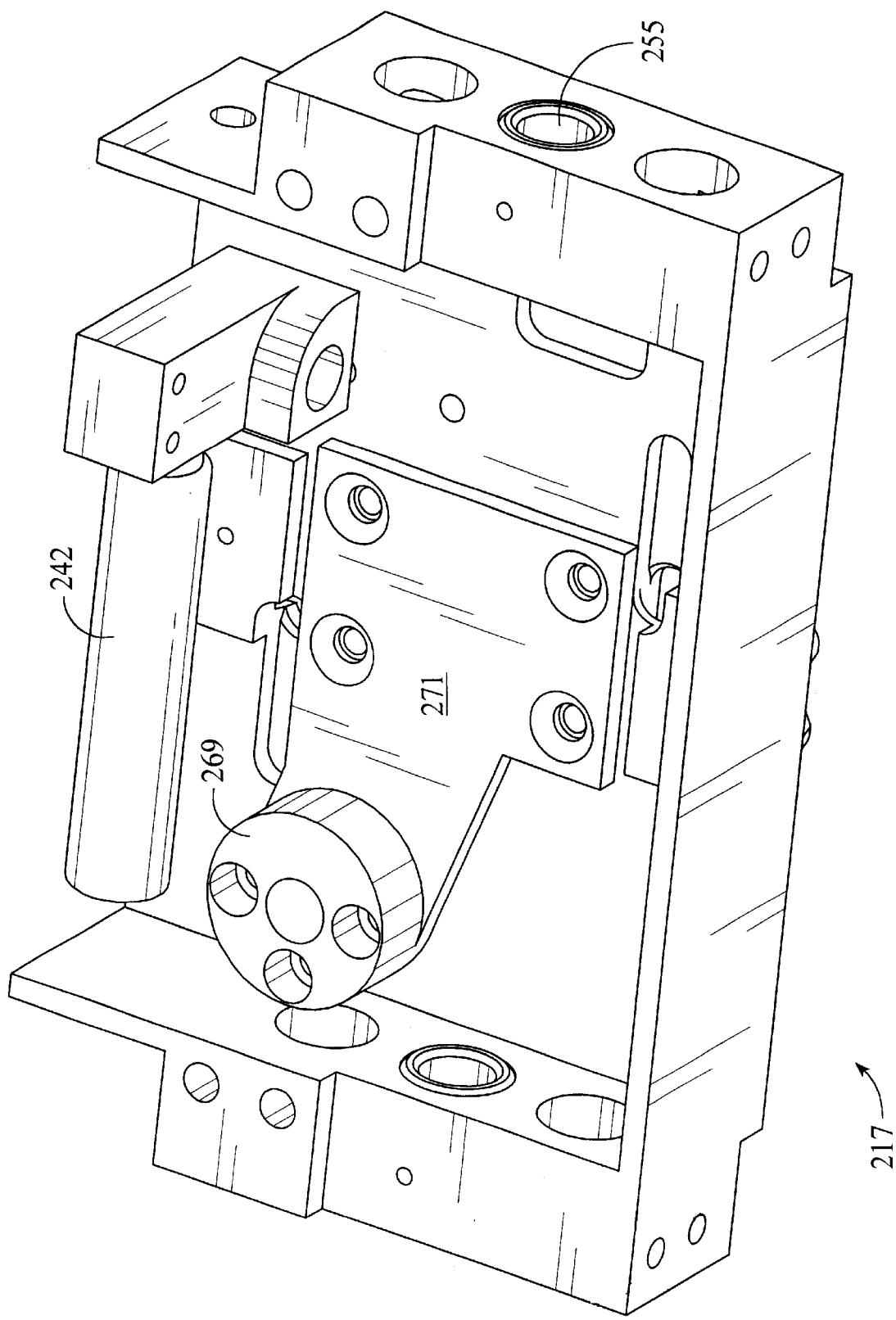
FIG. 21 illustrates a portion of the robotic arm of an interface apparatus in accordance with one embodiment of the present invention.
Figure 24:
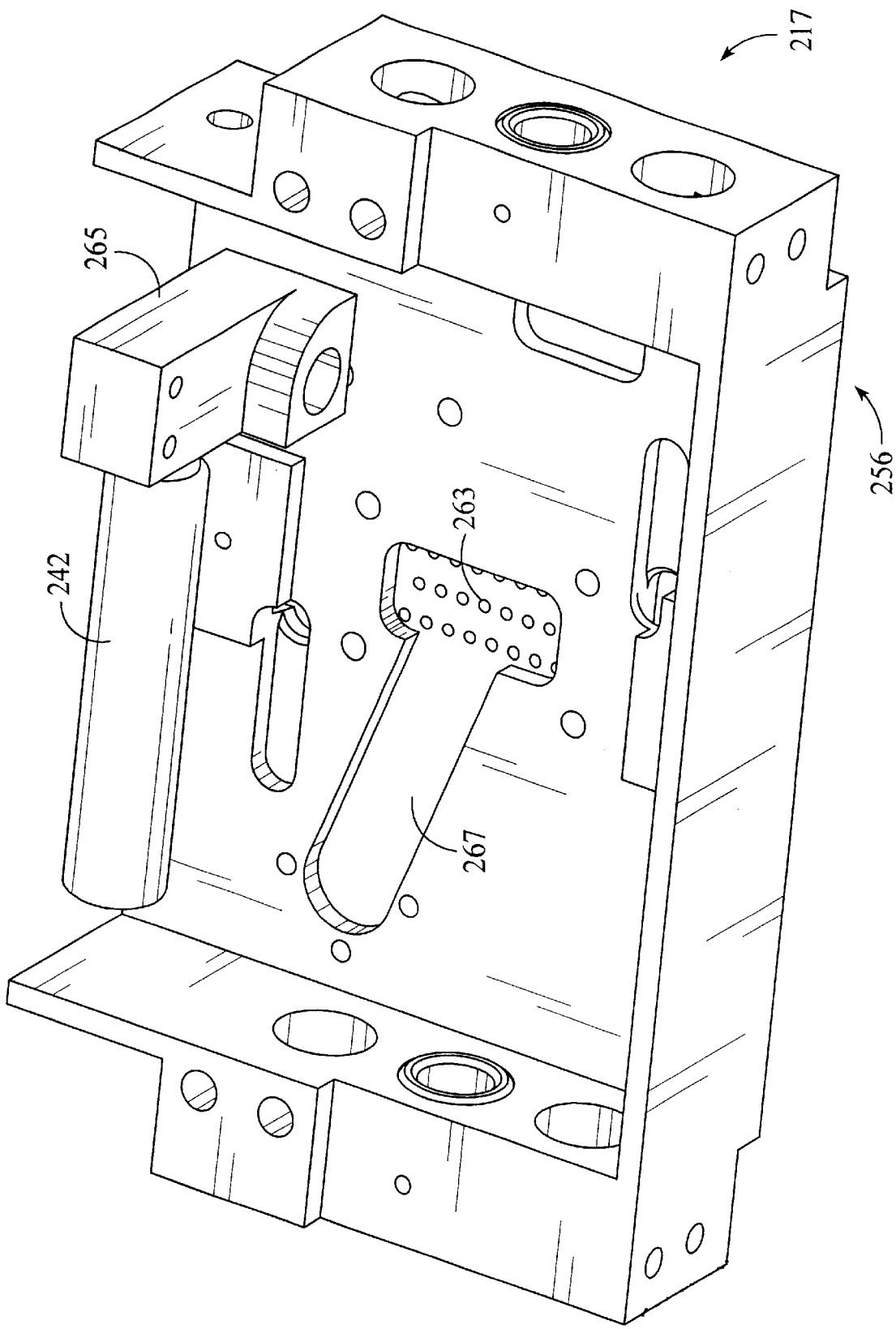
FIGS. 24 and 25 illustrate an ionization portion of the robotic arm of an interface apparatus in accordance with one embodiment of the present invention.

FIG. 21 illustrates a portion of gripper mechanism 217 having a hose connector 269 coupled to a distribution manifold 271. The hose connector 269 receives a hose for providing air flow via the gripper mechanism, 217. A hose is coupled to the ionization bar 242, where air is flowed through the ionization bar and into the hose connector 269. The hose connector 269 feeds the ionized air into the distribution manifold 271. As illustrated in FIG. 24, the ionized air is then injected into the mini-environment from distribution manifold 271 through inert go Output 263. The placement, size, and combination of pieces within the gripper mechanism 217 realizes efficient, compact design.

Figure 22:
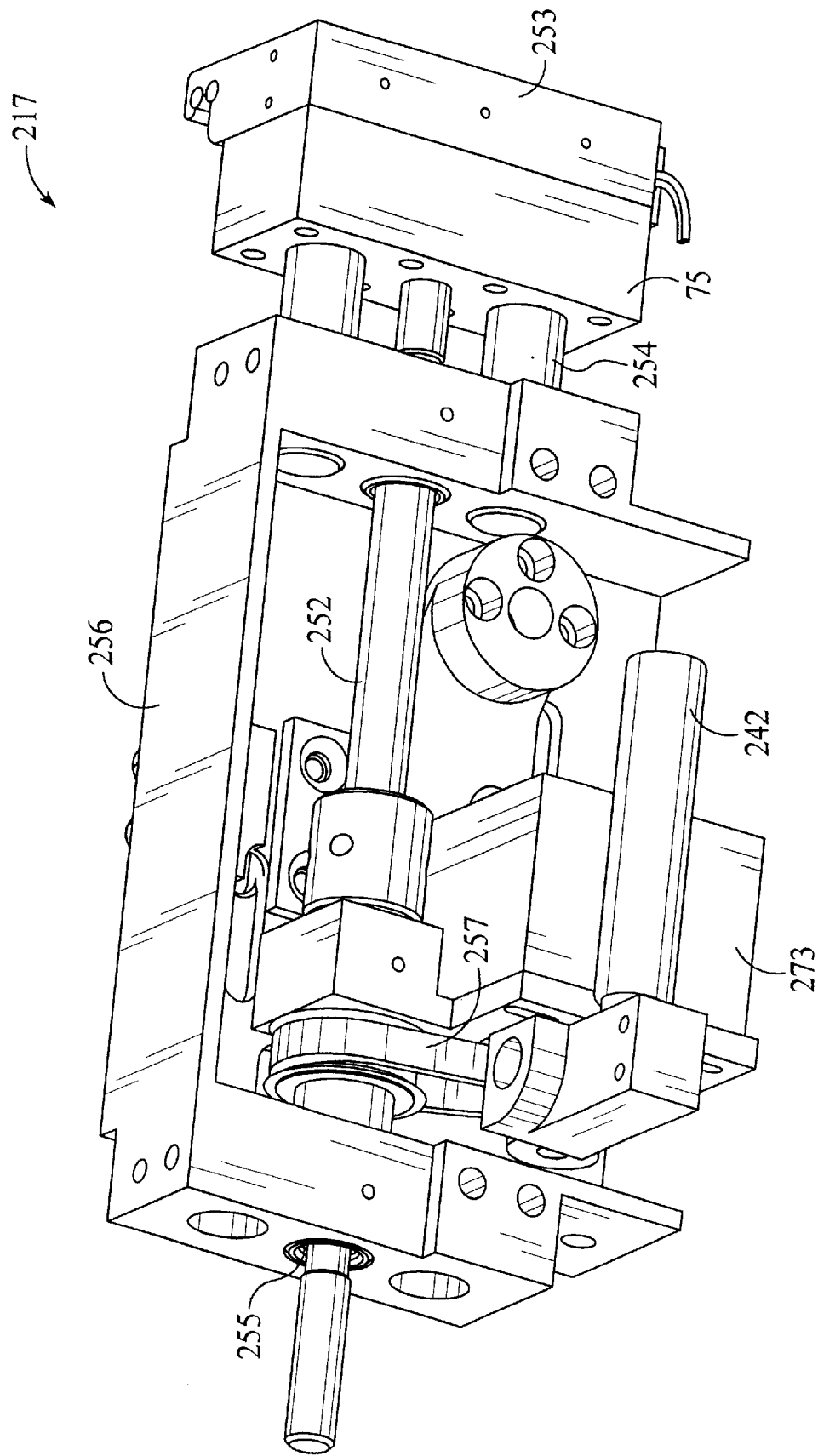
FIG. 22 illustrates the gripper portion of a robotic arm of an interface apparatus in accordance with one embodiment of the present invention.

Gripper mechanism 217 is further illustrated in FIG. 22, where the gripper mechanism includes a grip shaft 252. The grip shaft 252 is engaged by a pulley assembly 257 driven by a motor 273. Motor 273 is placed below ionization bar 242 and adjacent to the pulley 257. The pulley 257 engages grip shaft 252 in a center portion, rotating grip shaft 252 in a first direction to effect a gripping motion and in a second direction to effect a releasing motion. A shaft sleeve is provided for the pulley 257 to engage the grip shaft 252. The pulley 257 includes a drive belt. In one embodiment, the pulley 257 is adjustable to accommodate alternate size belts. One end of grip shaft 252 is left-hand threaded and the opposite end is right-hand threaded. Each end is coupled to a grip 253, which include respectively threaded holes to accept each end of grip shaft 252. Each grip 253 also include fixedly attached stabilizer bars 254. As grip shaft 252 is rotated in one direction or the other, the stabilizer bars 254 slide through holes within body piece 256. Stabilizer bars 254 maintain a proper orientation of the grips 253, throughout operation of the gripping mechanism.

Specifically, the gripping action is accomplished by turning grip shaft 252 in a first rotational direction which forces grips 253 inward and thus grips or clamps the article. The article is released by turning grip shaft 252 in a second rotational direction opposite to the first, which forces grips 253 outward away from body 256. The grip shaft 252 is rotated by the pulley 257, where the pulley 257 is driven by a motor 273 within the gripper mechanism 217. Motor 273 is electrically coupled to the control mechanism within control panel 219.

Electrical conductors pass through the interface apparatus 210 via robotic arms 215, allowing communication between these various sensors and the controller. Note that alternate embodiments may locate the motor within the control panel and provide control signals via conductors to the gripper mechanism 217. Still other embodiments may configure the motor within another portion of interface apparatus 210. As another example, an external controller may provide control signals and power to drive the pulley and effect the rotational motion. Placement of the motor 273 within the gripper mechanism 217 reduces the size of control panel 219 and adds to the reliability of the gripping mechanism by placing the drive source for the pulley 257 nearby. Additionally, the gripper mechanism 217 is easily accessible for repair or replacement of the motor 273. Further, gripper mechanism 217 does not include the complexity of control included in control panel 219, allowing for a simpler maintenance of this feature.

Continuing with FIG. 22, the grip shaft 252 passes through holes provided within body 256, which are fitted with bearings 255. According to one embodiment, the bearings are made of a material including glass filled teflon. This material resists friction and provides a long lasting wear element. Typically, any material which encourages easy movement and prevents wear is ideal for bearings 255.

Figure 23:
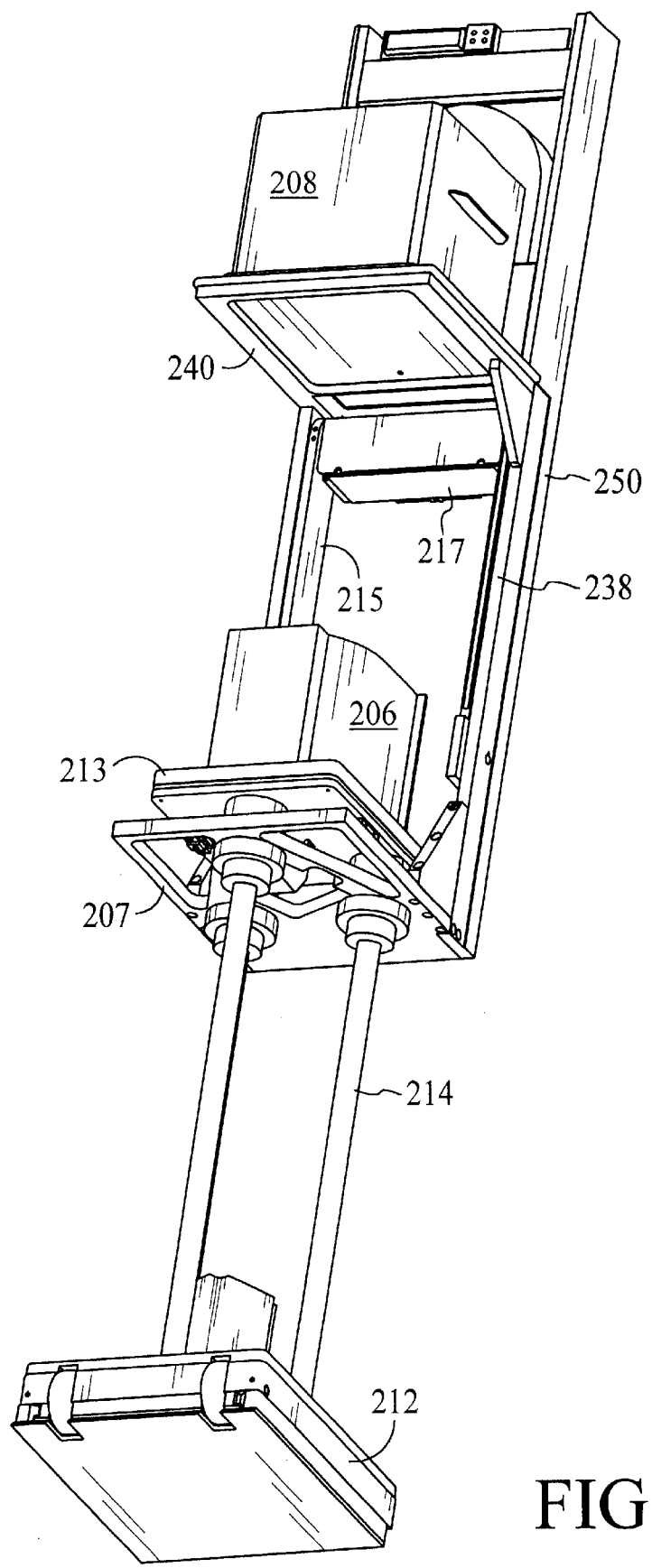
FIG. 23 illustrates an under view of an interface apparatus in accordance with one embodiment of the present invention.

A view from below the pod base receiver 213 is illustrated in FIG. 23. Lift structure 250 moves along shafts 214. The base frame 207 provides support for the pod base receiver 213 and also includes extension pieces 238 which couple base frame 207 to moveable plate 240. As illustrated in FIG. 23, robotic aims 215 and gripper mechanism 217 are positioned between extension pieces 238. Once the moveable plate 240 is raised above the cassette 6, robotic arms 215 are free to rotate forward and backward to place cassette 6. As lift structure 250 is placed into the second position, the pod cover 8 is separated from pod base 4 and the robotic arms 215 have sufficient freedom of motion to grip the cassette 6.

Figure 25:
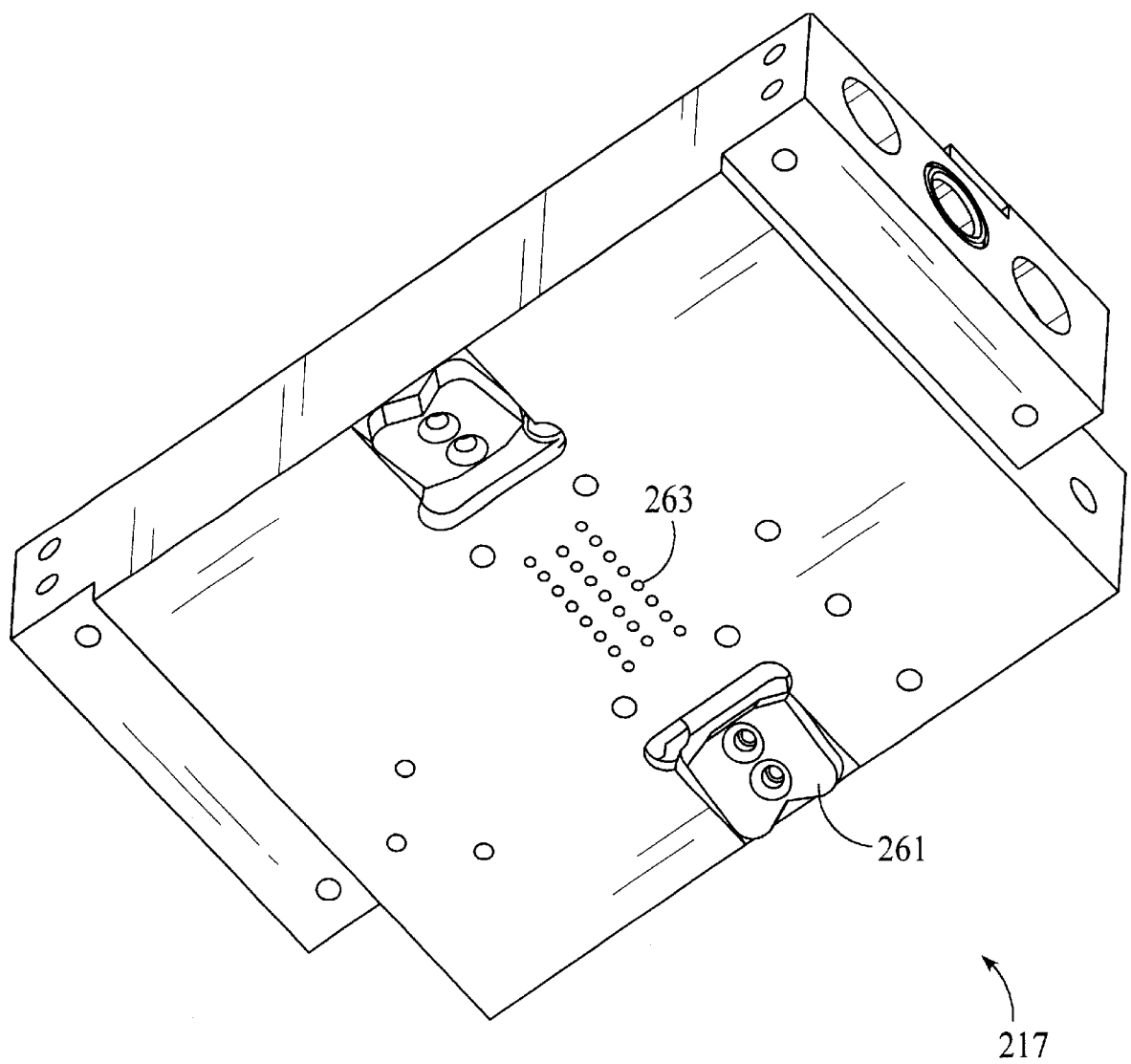

FIG. 24 provides another view of body 256 of gripper mechanism 217 without the grip shaft 252 and without the pulley assembly 257. Cutouts preferably are provided within the body 256 to accommodate these various mechanisms. The inlaid shapes reduce the overall size and weight of the gripper mechanism 217 and thus allow for an increase in functionality. According to one embodiment, the gripper mechanism 211 includes mechanisms for gripping cassette 6, ionizing the mini-environment, wafer edge detection, wafer alignment checking, wafer flat finder detection, and other feedback type sensors, including temperature sensing. As illustrated in FIG. 25, gripper mechanism 217 preferably includes vent holes as an inert gas outlet 263 to provide an air flow output from air flowed over an ionization means 242, such as an ionization bar, and includes sensors 261 positioned for optimum access to mini-environment and wafer conditions. Sensors 261 may include any number of sensors, including edge detectors, wafer alignment sensors, etc. These sensors may employ infra red through beam sensing.

With respect to control of the gripping mechanism of gripper mechanism 217, the control panel 219 allows the user to input dimensions associated with the gripping mechanism, and the sensors. Additionally, it is possible to download new software routines for handling of user-specific conditions. For example, the control panel 219 includes the capability to process both digital and analog data provided as feedback from sensors 261 located in gripper mechanism 217. The feedback processing may then be translated into control actions, which are communicated by way of analog and digital outputs of control panel 219, including pulse width modulation (PWM), analog-to-digital conversion (ADC), digital-to-analog conversion (DAC), etc. In this way, a wafer alignment sensor may detect a misaligned wafer and send this information back to control software programs running in control panel 219. The program may then make a control decision, such as move the robotic arms to position the wafer in the cassette. This is possible, as the robotic arms may effect multi-dimensional movement, using gravity to ensure correct positioning of wafers in the cassette. In another case, the sensors 261 may read identification information from the article of manufacture. In this case, the identification information is provided to a main controller for verification. When the identification cannot be verified, processing is halted, as the interface apparatus refuses to transfer the article into the processing tool and instead alerts either a human attendant or a central controller in the manufacturing environment. Corrective action is then taken, and a processing error avoided.

With respect to the placement position of the wafer cassette 6 within the interface apparatus, there are a variety of possible scenarios reflected in a variety of manufacturing environments and a variety of tools. FIG. 26 illustrates two possible positions, A and B, where A is accomplished without event, but B presents several problems. Referring to position A, the wafer cassette 6 is placed into the interface apparatus 210 with the opening exposing wafers facing the tool. In this position, once the cover 8 is removed from cassette 6, robotic arms 215 rotate to grip the cassette 6. Note that as illustrated in FIG. 20, cassette 6 includes top rims 228 and front rims 226. Robotic arms 215 may grip the wafer cassette 6 at either set of rims. Once the cassette 6 is gripped, the robotic arms 215 rotate the cassette 6 about 90° to position the cassette 6 as illustrated in A of FIG. 26. During the rotation, the opening of cassette 6 is maintained in an upward position to prevent wafers from falling from the cassette 6. On presentation to the tool, the handle is positioned away from the processing tool. The presentation movement of A is illustrated in FIG. 19 as "position II."

For the position B of FIG. 26, the wafer cassette 6 is again placed into the interface apparatus 210 with the opening facing the processing tool. A problem exists in that here the handle is to face the tool upon presentation to the tool.

Performing the 90° rotation as in A will position the handle away from the tool. Performing a rotation in the opposite direction will spill the wafers. In this situation, the interface apparatus 210 allows rotation of the pod base receiver 213 to accept the wafer cassette 6 with the opening facing away from the tool. This then allows the robotic arms 215 to move to "position I" of FIG. 19, and rotate the cassette into position with the handle facing the tool, as illustrated in B of FIG. 26. Note that the placement of the handle is determined by the processing tool and is typically done once on setup.

Note also that the gripping mechanism contained in gripper mechanism 217 may grip a wafer cassette in a variety of positions, such as front rims 25, top rims 228, and/or handle 221 without the need to change the grip mechanism. The gripping mechanism can handle any of these grip locations, which are programmable by the user. At set up, the user provides information to the interface apparatus to indicate where on the cassette the gripper is to grip. This will often depend on the required position of presentation to the tool.

Method

Figure 27A:
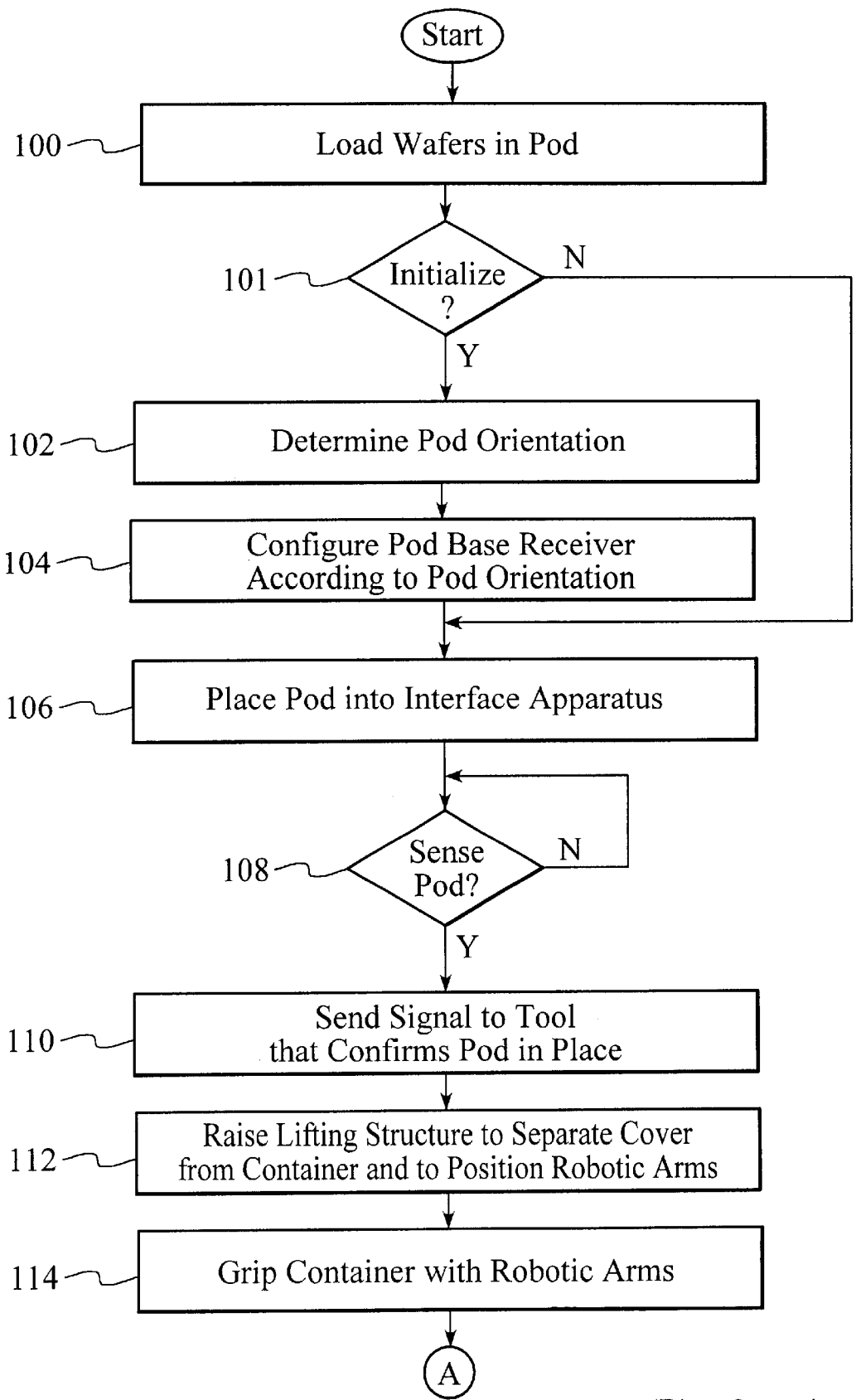
FIGS. 27A and 27B illustrate a processing flow according to one embodiment of the present invention.
Figure 27B:
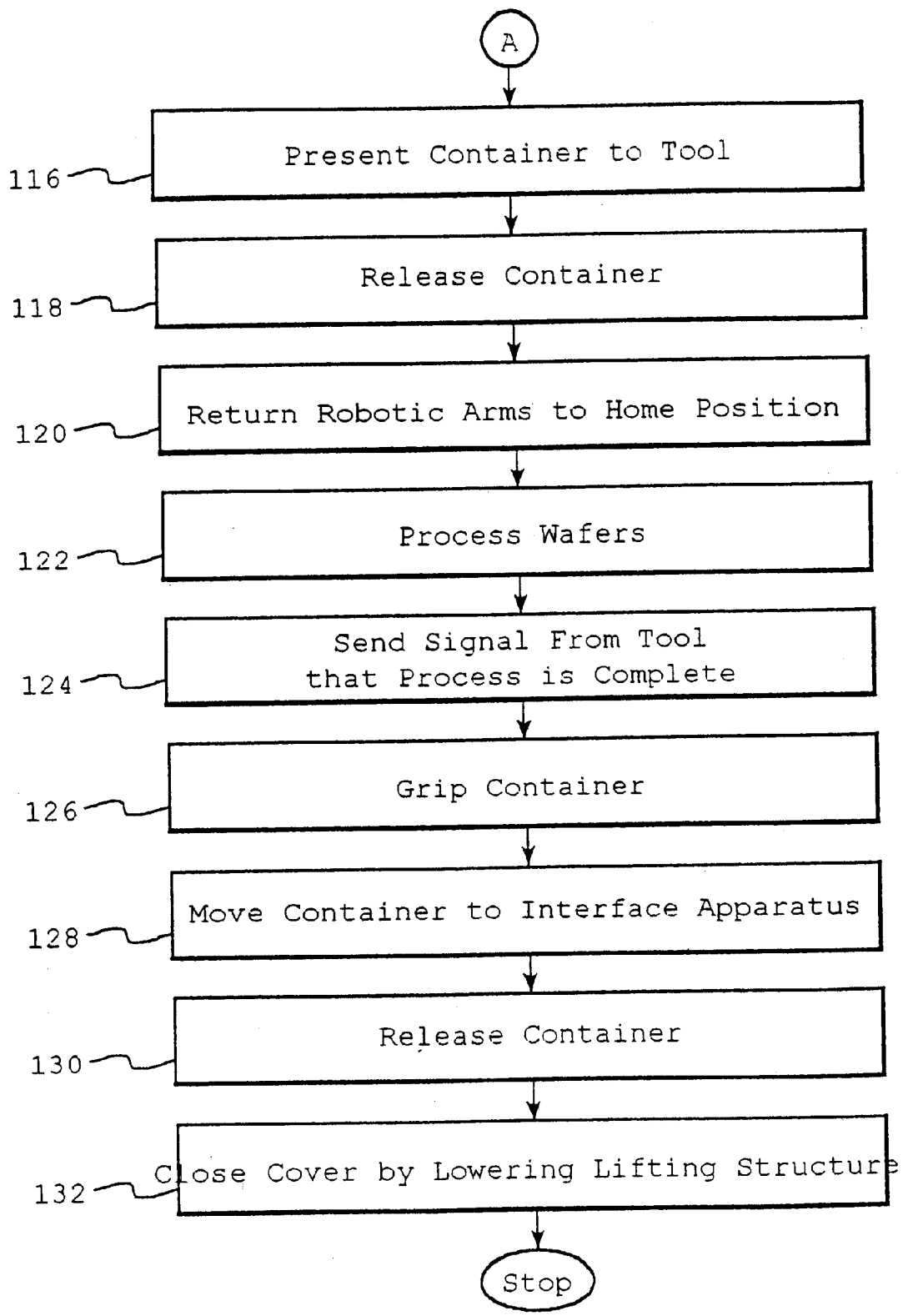

FIGS. 27A and 27B provide a flow chart of a method for manufacturing semiconductor wafers (or similar articles) according to one embodiment of the present invention. Processing begins at step 100 where wafers are loaded into a pod. It is determined at decision diamond 101 whether this is the initialization of the interface apparatus. For initialization, processing continues to step 102 to determine the required orientation of the pod. At step 104 the pod base receiver is configured according to the pod orientation. Processing continues to step 106 for placement of the pod into the interface apparatus. Returning to decision diamond 101, if no initialization is necessary, processing jumps to step 106.

From step 106, processing continues to decision diamond 108. If a pod is sensed, a signal is sent to the tool confirming placement of the pod at step 110. If no pod is sensed, the process waits and returns to decision diamond 108. From step 110, processing continues to step 112 where the support structure is moved to separate the pod cover from the pod base. This action positions the robotic arms into a position from which the cassette is gripped and transferred to the tool. At step 114, the robotic arms 215 grip the cassette. At step 116, the robotic arms present the container to the processing tool, and the cassette is released at step 118. During this step, movement of the robotic arm seats the wafers within the cassette. This eliminates the need to check alignment after presentation to the tool. The robotic arms return to the interface apparatus to stay out of the way in the tool at step 120. Processing continues to step 122, to process the wafers. Typically, a robot within the processing tool will extract the wafers individually. This motion is specific to processing tools, and thus the variety of presentation positions. Subsequent to processing the wafers, at step 124, a signal is sent from the tool to the interface apparatus that processing is complete. At step 126 the robotic arm returns into the tool to grip the cassette and transfer it back to the interface apparatus. At step 128 the container is moved back into interface apparatus 210. The arms release the container at step 130. The pod cover is lowered back to join the pod base at step 132 and interface apparatus movement stops.

In an alternate embodiment, the interface apparatus communicates with the manufacturing system, providing information as to correct placement of articles within a carrier, completion of seating procedure, as well as other information. The manufacturing system uses this information to continue further processing of the articles, and also to initiate corrective measures when a problem is detected.

In one type of manufacturing system, containers are transported by way of a track arrangement placed above the processing tools. This type of system carries the containers from one tool to the next and places the pods onto the interface apparatus. In such a system, communication between each tool and a central controller is necessary to maintain smooth operation.

In one embodiment of the present invention, pod base receiver 213 includes an adjustment unit for accommodating smaller size wafers. The adjustment unit is placed within the base plate and allows placement of the smaller wafers on the base plate. In a SMIF type system, the center of the cassette must line up with the latching slots of the pod. Smaller wafers are then processed using the same manufacturing system.

According to one embodiment of the present invention, a mechanism for indexing the wafers is provided within the interface apparatus. Indexing by the interface apparatus allows the robot, or other wafer extraction mechanism, provided within the processing tool to be held at a constant position with respect to the interface apparatus. The interface apparatus moves the wafers to position them for extraction. In such a system, as the tool's extraction means moves to accept the wafer, the cassette is moved to position the wafer on the extraction means.

Indexing may be done by use of a stepper motor to incrementally raise or lower the cassette. In this case, the robotic arms 215 remain within the tool during processing. A sensor detects wafers within the cassette, and signals the interface apparatus and process tool accordingly. The interface apparatus controls the robotic arms to position the cassette for extraction of each wafer, allowing the tool to reduce its motion. By configuring the sensing and indexing within the interface apparatus, the motion of the tool is greatly reduced.

In an alternate embodiment, a mechanism for mapping the wafers is provided within the interface apparatus. Wafer mapping is used to detect empty slots in the cassette as well as misaligned wafers. By placing sensors to detect such conditions, the interface apparatus is able to initiate an error handling routine, such as a warning to a human attendant, or a software method of realigning the wafers. This type of information is easily stored in a storage unit within the interface apparatus, or in a storage unit attached to the cassette or pod. Note that this type sensing is possible by way of sensors 261 within gripper mechanism 217. As the robotic arms 215 position to grip the cassette, gripper mechanism 217 and sensors 261 pass over the cassette. At this time, if sensors 261 detect a missing wafer, this information is provided to a main controller in control panel 219. The main controller may then effect corrective measures. Sensors 261 employ an infra red sensor, similar to those described hereinabove, which use a through beam to detect missing wafers, misaligned wafers, multiple wafers in one wafer rack, as well as tilted or misseated wafers. In alternate embodiments, sensors 261 will identify articles which are not positioned correctly within a container.

Wafer mapping provides an efficient means to save wasted processing steps. Further, wafer mapping provides information used in fabrication forecasting and planning. The main controller may correct the problem causing accesses only those slots of the cassette in which wafers sit. Or the main controller may provide this information to the processing tool, allowing the processing, tool to adjust its operation accordingly.

For a "flat finder" function, sensors 261 provided within the gripper mechanism 217 of interface apparatus 210 are used to determine wafer orientation within cassette 6. This function is called a "flat finder" function, as each wafer has a flat portion which is used to align or orient the wafer for placement in the tool. The flat finder determines where the flat portion of the wafer is and determines the necessary operation to position the flat portion in correct position. The corrective operation may involve further rotation of the base plate, or may involve a tilt of the cassette. Again the main controller may provide this information to the tool, allowing the tool to correct the situation by rotating the wafer until the flat side is in the correct position for processing.

In one embodiment of the present invention, the sensors 261 described hereinabove include infra red sensors. Unlike class I lasers, infra red sensors do not require the protection associated with laser sensors. The infra red sensors provide a safe, effective means of sensing in the manufacturing environment.

According to one embodiment of the present invention, the interface apparatus includes a software control program which interfaces with the processing tool, and may be used to Communicate wafer information, pod information, processing information, as well as any other information helpful in the processing of the wafers. A supervisory type program is included which is factory programmed into the interface apparatus. The supervisory program provides information specific to the interface apparatus, such as communication protocol, and memory size, as well as transfer control information, such as angle of rotation, rotation speed, gripping dimensions, gripping location, and cassette orientation. In one embodiment, a user programmable software program is included which allows a user to customize the interface apparatus to a specific system. For example, a user may want to rotate the wafers to a given position to seat them, and then return the cassette to its position prior to rotation. Still another user may desire no such seating. Additionally, the software control program may include a manufacturing system program which controls communication with the tool, the pod, and the manufacturing environment.

In one embodiment, each pod includes a controller for storing information, and communicating with other components in the manufacturing environment. In this way, the pod is able to store information regarding the processing of wafers in the pod. A semiconductor device, such as a microcontroller, may be incorporated into the pod. The device stores information, such as wafer identification, processing parameters, and number of wafers in the pod. The device also communicates this information to the interface apparatus and the processing tool. As a pod is placed on an interface apparatus, the interface apparatus queries the pod to verify expected information and also to provide additional processing information to the processing tool. The interface apparatus also passes information from the processing tool to the device. The device then stores the information and is able to track the processing of the wafers in the pod. At any point in the manufacturing process, such information can be obtained to verify the status of the wafers. This aids in tracking the processing operation, and avoids errors. By storing information in the pod, wafer throughput can be accurately evaluated; this feedback is important in forecasting and planning for the manufacturing operation. Additionally, parameters of processing can be monitored to determine optimum processing times and conditions. The interface apparatus can also store information in the device, allowing efficient operation of the next interface apparatus at the next tool.

In an automated manufacturing environment, often robots are used to move pods from one stage to the next. Here a manufacturing controller monitors and controls the operation of all components of the manufacturing system. The communication in an automated system may be wireless, as in a system using radio frequency (RF) tagging, or may be digital. The main controller monitors each component in the system comparing each operation against a master plan. In this system, each device on each pod is also monitored. As the pods continue through the process, information about their progress is communicated to the main controller. This information may be used as feedback in supervising the manufacturing system. Queuing information can be obtained by monitoring the wait time for each pod at each processing tool. Queuing information is used for future planning and to optimize use of the components of the manufacturing system.

According to one embodiment of the present invention, each processing tool has an associated command set, which provides instructions for operation of the tool. The interface apparatus is adapted to use the command set of the tool to interface with the tool. According to one embodiment of the present invention, the interface apparatus includes a control means for expanding the command set of the tool. This is accomplished in software, by providing subroutines for interface with the tool. In this way, the interface apparatus provides a smart control for even a tool having a basic command set.

In general, the purpose of cleanroom production is to filter out contaminants from the manufacturing process. Cleanroom maintenance is not a trivial concern, as it involves constant monitoring of a manufacturing environment, where movement and processing often introduce contaminants. Further, the human attendant must be diligent in preventing their own movement and activity from effecting the product. As the size of the product decreases, the amount of particles that may contaminate the process increases, and therefore maintaining the integrity of the cleanroom becomes increasingly difficult.

Other considerations of cleanroom production involve the article of manufacture. Each cleanroom environment then has its own requirements and specification. Sub-micron filtration, chemical filtration, inert gas purge, temperature control, humidity control, and anti-static ionization are a few of the processes being developed for use in cleanrooms. Each of these processes produce specific effects on the article of manufacture. These effects must be addressed to prevent defects and maximize yield.

With respect to the semiconductor fabrication process, some typical contaminants include particulate matter and trace chemicals. For example, oxygen and other oxidizing chemicals are particularly hazardous to reactive surfaces. It is very difficult to remove all contaminants from the manufacturing environment, where static electricity tends to attract contaminants. Particulate matter and other contaminants can damage semiconductor circuits, particularly circuits having sub-micron geometry. In a worst case, the resultant circuits malfunction or are inoperable. Therefore, control of this static electricity, referred to as electrostatic discharge (ESD) control, is a key consideration in the manufacture of such articles as semiconductor wafers.

In one embodiment of the present invention, ESD control is accomplished by providing a sweep of an inert gas (e.g., preferably nitrogen) throughout the extended mini-environment created by the combination of processing tool, interface apparatus, and container. Once the pod 2 has been accepted by the interface apparatus 210, and the pod cover 8 has been removed from the pod base 4, an extended mini-environment is formed by the pod 2, the interface apparatus 210, and the tool. Nitrogen is injected into this extended mini-environment via the interface apparatus 210. The flow of nitrogen provides an inert atmosphere within the extended mini-environment with respect to untreated air. Therefore, the inert atmosphere within the extended mini-environment is more inert that the environment outside the enclosure. In one embodiment, filtered, static-free nitrogen is flowed across each wafer, effectively "dusting" the wafers. The inert mini-environment reduces the amount of contaminants attracted to the wafer, and thus reduces the number of resultant defects. Note that a "point-of-use" filter may be used to filter the nitrogen at the place of injection into the extended mini-environment. A point-of-use filter maximizes the effects of the nitrogen injection, by providing a pure, static-free source of nitrogen.

Multiple Interface Apparatus

Figure 28:
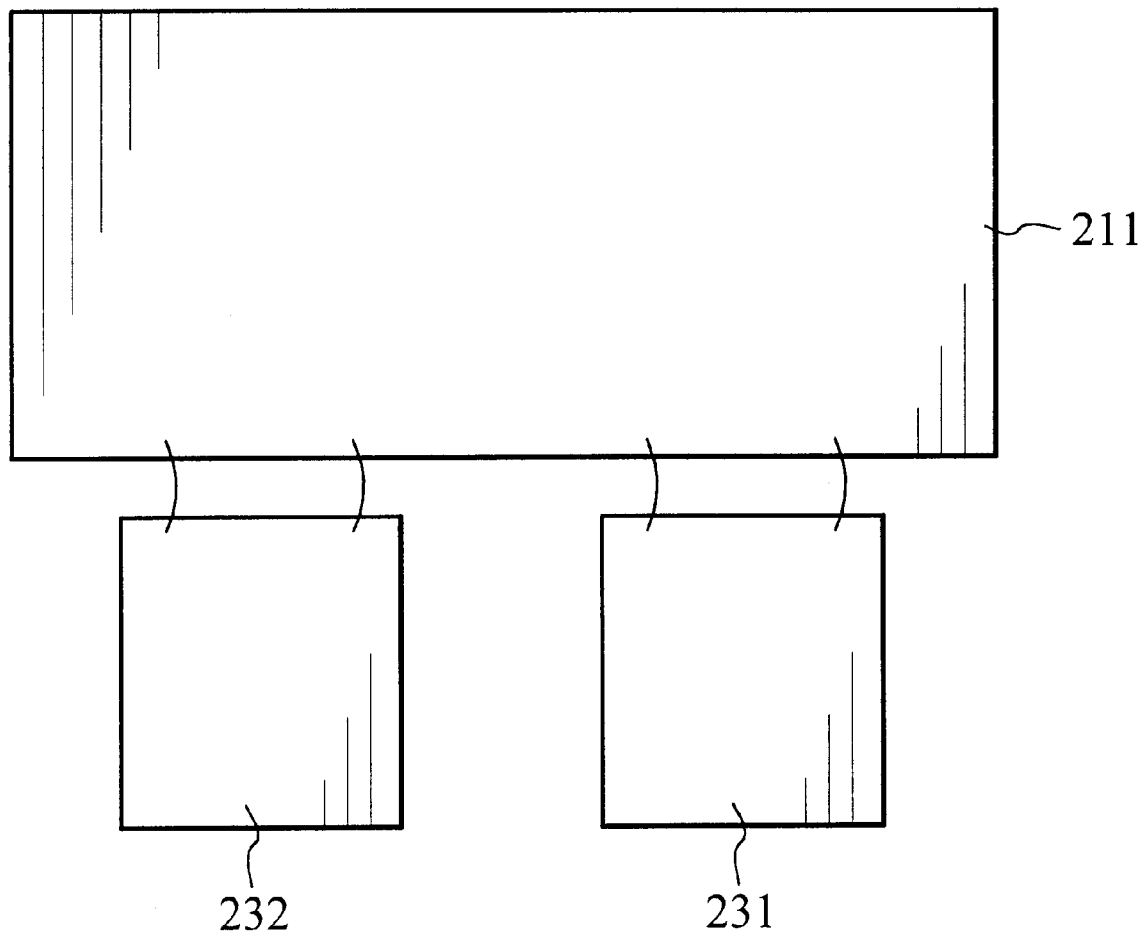
FIG. 28 illustrates multiple interface apparatus in a manufacturing environment according to one embodiment of the present invention.

Referring to FIG. 28, a top view of a manufacturing environment is illustrated having a processing tool 211 and two interface apparatus 231 and 232. The interface apparatus 231 and 232 are interchangeable and may be alternately configured. The article container may be centered within each interface apparatus 231 and 232. There is no indication of a right hand apparatus or a left hand apparatus, but rather either may be placed on the right and either may be placed on the left. In this manufacturing environment the interface apparatus 231 and 212 may be positioned side-by-side adding to the flexibility of manufacturing environment configuration and maintenance. The proximity and placement of the interface apparatus 231 and 231 allow for ease of maintenance with respect to the tool, and also provide the user easy access to placement of article containers within either apparatus 231 and 232. In a preferred embodiment, each of the interface apparatus 231 and 232 are as illustrated in FIG. 19, having a robotic arm for presentation of the articles of manufacture to the tool. An alternate embodiment may employ a variety of apparatus, where the interface apparatus 231 and/or 232 allow such flexibility.

Conclusion

While the present invention has been described with respect to a clean environment for manufacturing semiconductor wafers using SMIF pods and mini-environments, the present invention is not limited to such systems. The present invention is applicable to any interface in an automated manufacturing system. By providing an interface with multiple automated adjustment means mounted on a platform for presenting articles to a processing tool, the present invention overcomes many of the problems associated with prior art systems. The present invention is also applicable to the manufacture of hard disks and to flat screen displays for use in computer systems.

The present invention provides an interface apparatus, capable of automatically adjusting the position of a base plate, where the base plate presents the articles of manufacture to the processing tool. The present invention further provides a method of interfacing article containers and the processing tools of manufacture.

The present invention is particularly applicable to the manufacture of articles in a clean environment, and specifically to semiconductor devices fabricated by multiple processing tools.

While the present invention has been described with respect to a clean environment for manufacturing semiconductor wafers using SMIF pods and mini-environments, the present invention is not limited to such systems. The present invention is applicable to any interface in an automated manufacturing system. By providing an interface with multiple automated adjustment means mounted on a platform for presenting articles to a processing tool, the present invention overcomes many of the problems associated with prior art systems. The present invention is also applicable to the manufacture of hard disks and to flat screen displays for use in computer systems.

The present invention provides an interface apparatus, having robotic arms. The robotic arms are positioned by movement of a support structure used to open a container, wherein the container holds articles of manufacture. The robotic arms include an ionizer and sensor, wherein ionization is performed as the robotic arms are positioned to grip the container or the article. Similarly, the sensor may be used for a variety of purposes, where the sensing is done as the robotic arm positions to grip the container or the article. The present invention further provides a method of interfacing articles and/or containers and the processing tools of manufacture.

The present invention is particularly applicable to the manufacture of articles in a clean environment, and specifically to semiconductor devices fabricated by multiple processing tools. As discussed herein above, the present invention is applicable to a variety of articles of manufacture and a variety of manufacturing environments, and provides a means of interface between the article and/or article containers and the processing tool.

Thus, although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method, comprising the steps of:
   positioning a pod having a removable cover on an interface apparatus, wherein the pod contains one or more articles for processing by a processing tool;
   opening the pod by movement of the removable cover, wherein a controlled environment is established by the processing tool, interface apparatus and the pod;
   presenting ions to the one or more articles;
   accessing the one or more articles with a robot arm; and
   processing the one or more articles with the processing tool, wherein a manufacturing process is performed on the one or more articles.

2. The method of claim 1, wherein, during access of the one or more articles by the robot arm, ions are presented to the one or more articles.

3. The method of claim 1, wherein the ions are generated by an ion bar.

4. The method of claim 3, wherein a gas flows over the ion bar, wherein the gas flow sweeps ions across the one or more articles.

5. The method of claim 3, wherein the ion bar is positioned on a robot arm.

6. The method of claim 5, wherein the ion bar is positioned on a gripper on the robot arm.

7. The method of claim 6, wherein the gripper engages a cassette holding the one or more articles.

8. The method of claim 7, wherein the ions are presented to the one or more articles prior to the gripper engaging the cassette.

9. The method of claim 1, wherein the ions presented to the one or more articles balance oppositely charged ions within an extended mini environment comprising the processing tool, the interface apparatus and the pod.

10. The method of claim 1, further comprising the step of providing a flow of inert gas over the one or more articles.

11. The method of claim 10, wherein the inert gas comprises nitrogen.

12. The method of claim 10, wherein the inert gas is filtered prior to flowing over the one or more articles.

13. The method of claim 10, wherein the inert gas is filtered by a point of use filter.

14. The method of claim 10, wherein the inert gas is provided by the interface apparatus.

15. The method of claim 10, wherein the inert gas is provided by the processing tool or external to the processing tool.

16. The method of claim 1, wherein the one or more articles comprise one or more items selected from the group consisting of silicon wafers, integrated circuits, hard disks, liquid crystal displays, flat panel displays, imaging devices, infra red sensors, aerospace components, and optical implements.

17. The method of claim 1, wherein, upon opening the pod, an enclosure is established between the pod cover and a pod base.

18. The method of claim 17, wherein the enclosure comprises a bellows.

19. The method of claim 18, wherein the bellows comprises a flexible material.

20. The method of claim 18, wherein the bellows comprises polytetrafluoroethylene.

21. The method of claim 1, wherein the step of opening the pod comprises vertically lifting the removable cover from a pod base.

22. The method of claim 21, wherein the removable cover is vertically lifted with a vertically movable plate, wherein an enclosure is established by an element extending vertically downward from the vertically movable plate.

23. The method of claim 22, wherein the element comprises a bellows.

24. The method of claim 23, wherein the bellows comprises a flexible material.

25. The method of claim 23, wherein the bellows comprises polytetrafluoroethylene.

26. The method of claim 1, wherein the step of processing the one or more articles comprises the steps of:

positioning the one or more articles inside the processing tool with a robot arm on the interface apparatus; and processing the one or more articles with the processing tool.

27. The method of claim 1, further comprising the steps of:

closing the pod;

moving the pod to a second processing tool; and performing a second processing on the one or more articles with the second processing tool.

28. The method of claim 1, wherein the pod comprises a SMIF pod.

29. The method of claim 1, further comprising the step of providing filtered air between the interface apparatus and the processing tool.

30. The method of claim 29, wherein the air is filtered with a point of use filter.

31. The method of claim 29, wherein the air is filtered with a filter comprising polytetrafluoroethylene.

32. A method of manufacturing at least one article, comprising the steps of:

positioning the article in a carrier;

closing the carrier by moving a cover element to a carrier base;

engaging the carrier with an interface apparatus;

opening the carrier by movement of the cover element, wherein a controlled environment is established by the processing tool, interface apparatus and the carrier;

presenting ions to the one or more articles;

accessing the one or more articles with a robot arm; and performing a manufacturing process on the article with the processing tool.

33. The method of claim 32, wherein, during access of the one or more articles by the robot arm, ions are presented to the article.

34. The method of claim 32, wherein the ions are generated by an ion bar.

35. The method of claim 34, wherein a gas flows over the ion bar, wherein the gas flow sweeps ions across the article.

36. The method of claim 34, wherein the ion bar is positioned on a robot arm.

37. The method of claim 36, wherein the ion bar is positioned on a gripper on the robot arm.

38. The method of claim 37, wherein the gripper engages a cassette holding the article.

39. The method of claim 38, wherein the ions are presented to the article prior to the gripper engaging the cassette.

40. The method of claim 32, wherein the ions presented to the article balance oppositely charged ions within an extended mini environment comprising the processing tool, the interface apparatus and the carrier.

41. The method of claim 32, further comprising the step of providing a flow of inert gas over the article.

42. The method of claim 41, wherein the inert gas comprises nitrogen.

43. The method of claim 41, wherein the inert gas is filtered prior to flowing over the article.

44. The method of claim 41, wherein the inert gas is filtered by a point of use filter.

45. The method of claim 41, wherein the inert gas is provided by the interface apparatus.

46. The method of claim 46, wherein the inert gas is provided by the processing tool or external to the processing tool.

47. The method of claim 32, wherein the article comprises an item elected from the group consisting of silicon wafers, integrated circuits, hard disks, liquid crystal displays, flat panel displays, imaging devices, infra red sensors, aerospace components and optical implements.

48. The method of claim 32, wherein, upon opening the carrier, an enclosure is established between the cover element and the carrier base.

49. The method of claim 48, wherein the enclosure comprises a bellows.

50. The method of claim 49, wherein the bellows comprises a flexible material.

51. The method of claim 49, wherein the bellows comprises polytetrafluoroethylene.

52. The method of claim 32, wherein the step of opening the carrier comprises vertically lifting the cover element from a carrier base.

53. The method of claim 52, wherein the removable cover is vertically lifted with a vertically movable plate, wherein an enclosure is established by an element extending vertically downward from the vertically movable plate.

54. The method of claim 53, wherein the element comprises a bellows.

55. The method of claim 54, wherein the bellows comprises a flexible material.

56. The method of claim 54, wherein the bellows comprises polytetrafluoroethylene.

57. The method of claim 32, wherein the step of performing a manufacturing process on the article comprises the steps of:

positioning the article inside the processing tool with a robot arm on the interface apparatus; and processing the article with the processing tool.

58. The method of claim 32, further comprising the steps of:

closing the carrier;

moving the carrier to a second processing tool; and performing a second processing on the article with the second processing tool.

59. The method of claim 32, wherein the carrier comprises a SMIF pod.

60. The method of claim 32, further comprising the step of providing filtered air between the interface apparatus and the processing tool.

61. The method of claim 60, wherein the air is filtered with a point of use filter.

62. The method of claim 60, wherein the air is filtered with a filter comprising polytetrafluoroethylene.

63. A method, comprising the steps of:

positioning a pod having a removable cover on an interface apparatus, wherein the pod contains one or more articles for processing by a processing tool;

opening the pod by movement of the removable cover, wherein a controlled environment is established by the processing tool, interface apparatus and the pod;

presenting ions to the one or more articles; and accessing the one or more articles with a robot arm.

64. The method of claim 63, wherein, after the one or more articles are accessed by the robot arm, the one or more articles are available for processing with the processing tool, wherein a manufacturing process is performed on the one or more articles.

65. The method of claim 63, wherein, during access of the one or more articles by the robot arm, ions are presented to the one or more articles.

66. The method of claim 63, wherein the ions are generated by an ion bar.

67. The method of claim 66, wherein a gas flows over the ion bar, wherein the gas flow sweeps ions across the one or more articles.

68. The method of claim 66, wherein the ion bar is positioned on a robot arm.

69. The method of claim 68, wherein the ion bar is positioned on a gripper on the robot arm.

70. The method of claim 69, wherein the gripper engages a cassette holding the one or more articles.

71. The method of claim 70, wherein the ions are presented to the one or more articles prior to the gripper engaging the cassette.

72. The method of claim 63, wherein the ions presented to the one or more articles balance oppositely charged ions within an extended mini environment comprising the processing tool, the interface apparatus and the pod.

73. The method of claim 63, further comprising the step of providing a flow of inert gas over the one or more articles.

74. The method of claim 73, wherein the inert gas comprises nitrogen.

75. The method of claim 73, wherein the inert gas is filtered prior to flowing over the one or more articles.

76. The method of claim 73, wherein the inert gas is filtered by a point of use filter.

77. The method of claim 73, wherein the inert gas is provided by the interface apparatus.

78. The method of claim 73, wherein the inert gas is provided by the processing tool or external to the processing tool.

79. The method of claim 63, wherein the one or more articles comprise one or more items selected from the group consisting of silicon wafers, integrated circuits, hard disks, liquid crystal displays, flat panel displays, imaging devices, infra red sensors, aerospace components, and optical implements.

80. The method of claim 63, wherein, upon opening the pod, an enclosure is established between the pod cover and a pod base.

81. The method of claim 80, wherein the enclosure comprises a bellows.

82. The method of claim 81, wherein the bellows comprises a flexible material.

83. The method of claim 81, wherein the bellows comprises polytetrafluoroethylene.

84. The method of claim 63, wherein the step of opening the pod comprises vertically lifting the removable cover from a pod base.

85. The method of claim 84, wherein the removable cover is vertically lifted with a vertically movable plate, wherein an enclosure is established by an element extending vertically downward from the vertically movable plate.

86. The method of claim 85, wherein the element comprises a bellows.

87. The method of claim 86, wherein the bellows comprises a flexible material.

88. The method of claim 86, wherein the bellows comprises polytetrafluoroethylene.

89. The method of claim 63, further comprising the steps of:

positioning the one or more articles inside the processing tool with a robot arm on the interface apparatus; and processing the one or more articles with the processing tool.

90. The method of claim 63, further comprising the steps of:

closing the pod;

moving the pod to a second processing tool; and performing a second processing on the one or more articles with the second processing tool.

91. The method of claim 63, wherein the pod comprises a SMIF pod.

92. The method of claim 63, further comprising the step of providing filtered air between the interface apparatus and the processing tool.

93. The method of claim 92, wherein the air is filtered with a point of use filter.

94. The method of claim 92, wherein the air is filtered with a filter comprising polytetrafluoroethylene.

* * * * *